(12) United States Patent
Arakane et al.

(10) Patent No.: US 8,367,222 B2
(45) Date of Patent: Feb. 5, 2013

(54) ORGANIC ELECTROLUMINESCENT DEVICE

(75) Inventors: Takashi Arakane, Chiba (JP); Yukitoshi Jinde, Chiba (JP); Hiroyuki Saito, Chiba (JP); Kazuki Nishimura, Chiba (JP); Kenichi Fukuoka, Chiba (JP); Toshio Sakai, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 709 days.

(21) Appl. No.: 12/491,579

(22) Filed: Jun. 25, 2009

(65) Prior Publication Data

US 2010/0219400 A1 Sep. 2, 2010

(30) Foreign Application Priority Data

Feb. 27, 2009 (JP) ................................. 2009-047155

(51) Int. Cl.
*H01L 51/54* (2006.01)
(52) U.S. Cl. ......... 428/690; 428/917; 313/504; 313/506
(58) Field of Classification Search .......................... None
See application file for complete search history.

(56) References Cited

U.S. PATENT DOCUMENTS

| 7,965,032 | B2 * | 6/2011 | Bae et al. ..................... 313/504 |
| 7,998,596 | B2 * | 8/2011 | Yabunouchi et al. ......... 428/690 |
| 2002/0038867 | A1 * | 4/2002 | Kobori et al. .................. 257/40 |
| 2005/0225235 | A1 * | 10/2005 | Kim et al. ..................... 313/504 |
| 2008/0014464 | A1 * | 1/2008 | Kawamura et al. ........... 428/690 |
| 2009/0066235 | A1 * | 3/2009 | Yabunouchi et al. ......... 313/504 |

FOREIGN PATENT DOCUMENTS

| JP | 2003-201472 | * | 7/2003 |
| WO | WO 2009/020095 | * | 2/2009 |

OTHER PUBLICATIONS

U.S. Appl. No. 12/816,030, filed Jun. 15, 2010, Nishimura, et al.

* cited by examiner

*Primary Examiner* — Dawn L. Garrett
(74) *Attorney, Agent, or Firm* — Oblon, Spivak, McClelland, Maier & Neustadt, L.L.P.

(57) ABSTRACT

Provided is an organic electroluminescence device, including: an anode; a cathode; and organic thin film layers provided between the anode and the cathode, in which: the organic thin film layers have a light emitting layer, and have a hole injecting layer and a hole transporting layer, or a hole injecting/transporting layer on a side which is closer to the anode than the light emitting layer is; the hole injecting layer or the hole injecting/transporting layer contains an aromatic amine derivative having a specific substituent, and the hole transporting layer or the hole injecting/transporting layer contains an aromatic amine derivative having a specific substituent.

19 Claims, No Drawings

ORGANIC ELECTROLUMINESCENT DEVICE

TECHNICAL FIELD

The present invention relates to an organic electroluminescence device (which may hereinafter be referred to as "organic EL device") using a specific aromatic amine derivative in each of a hole injecting layer and a hole transporting layer or in a hole injecting/transporting layer.

BACKGROUND ART

Organic EL devices each using an organic substance are promising devices capable of finding applications in inexpensive, large-area full-color display devices of a solid emission type, and a large number of such devices have been developed. In general, an organic EL device is formed of a light emitting layer and a pair of counter electrodes between which the layer is interposed. The light emission of the organic EL device is the following phenomenon. Once an electric field is applied between both the electrodes, an electron is injected from a cathode side, and a hole is injected from an anode side. Further, the electron recombines with the hole in the light emitting layer to produce an excited state, and energy generated upon return of the electron from the excited state to its ground state is discharged as light.

Organic EL devices of various forms have already been known, and for example, the following organic EL devices have been proposed (see, for example, Patent Documents 1 and 2): each of the devices uses an aromatic amine derivative having a specific substituent having a thiophene structure or an aromatic amine derivative having a carbazole skeleton to which a diarylamino group is bonded as a hole injecting material or hole transporting material.

[Patent Document 1] WO 2008-023759
[Patent Document 2] WO 2008-062636

DISCLOSURE OF THE INVENTION

Problems to be Solved by the Invention

However, an increase in voltage, at which any such organic EL device as described above is driven, may occur because charge transfer between molecules having different molecular structures in such material as described above does not progress smoothly in some cases.

In view of the foregoing, an object of the present invention is to provide an organic EL device excellent in practicality because of the following reasons: the device can be driven at a reduced voltage, and has high luminous efficiency.

Means for Solving the Problems

The inventors of the present invention have made extensive studies with a view to achieving the object. As a result, the inventors have found that an organic EL device which has high luminous efficiency and which can be driven at a low voltage can be produced by using an aromatic amine derivative having a thiophene group as a hole injecting material and an aromatic amine derivative having a carbazole skeleton to which a diarylamino group is bonded through a linking group as a hole transporting material. Thus, the inventors have completed the present invention.

That is, the present invention relates to an organic electroluminescence device, including: an anode; a cathode; and organic thin film layers provided between the anode and the cathode, in which: the organic thin film layers have a light emitting layer, and have a hole injecting layer and a hole transporting layer, or a hole injecting/transporting layer on a side which is closer to the anode than the light emitting layer is;

the hole injecting layer or the hole injecting/transporting layer contains an aromatic amine derivative having a substituent represented by the following formula (1):

[Chem 1]

Formula (1)

where: $L_{12}$ represents a substituted or unsubstituted arylene group having 6 to 60 atoms forming a ring, a substituted or unsubstituted fluorenylene group, or a substituted or unsubstituted heteroarylene group having 5 to 60 atoms forming a ring; and $R_5$ represents a hydrogen atom, a substituted or unsubstituted aryl group having 5 to 14 atoms forming a ring, a substituted or unsubstituted aryloxy group having 5 to 14 atoms forming a ring, a substituted or unsubstituted arylthio group having 5 to 14 atoms forming a ring, a branched or linear, substituted or unsubstituted alkyl group having 1 to 6 carbon atoms, or a branched or linear, substituted or unsubstituted alkoxycarbonyl group having 1 to 6 carbon atoms, a represents an integer of 1 to 3, and, when a represents 2 or 3, multiple $R_5$'s may be identical to or different from each other; and the hole transporting layer or the hole injecting/transporting layer contains an aromatic amine derivative having a substituent represented by the following formula (2):

[Chem 2]

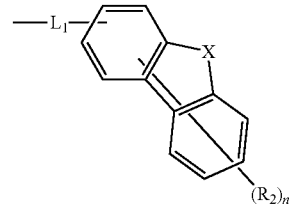

Formula (2)

where: X represents $NR_1$, $L_1$ represents a substituted or unsubstituted arylene group having 6 to 60 atoms forming a ring, a substituted or unsubstituted fluorenylene group, or a substituted or unsubstituted heteroarylene group having 5 to 60 atoms forming a ring, and $R_1$ represents a substituted or unsubstituted aryl group having 5 to 14 atoms forming a ring, or a branched or linear, substituted or unsubstituted alkyl group having 1 to 6 carbon atoms; and $R_2$ represents a hydrogen atom, a substituted or unsubstituted aryl group having 5 to 14 atoms forming a ring, a substituted or unsubstituted aryloxy group having 5 to 14 atoms forming a ring, a substituted or unsubstituted arylthio group having 5 to 14 atoms forming a ring, a branched or linear, substituted or unsubstituted alkyl group having 1 to 6 carbon atoms, or a branched or linear, substituted or unsubstituted alkoxycarbonyl group having 1 to 6 carbon atoms, and n represents an integer of 1 to 7.

The compounds used as a hole injecting material and a hole transporting material in the present invention each have suppressed steric hindrance of a region with a high electron density of a thiophenyl or carbazolyl group with a high electron density projecting into a terminal region. Once the steric hindrance is suppressed, regions with high electron densities easily overlap each other between molecules, so the charge transporting characteristic of the organic electroluminescence device is improved. In particular, the suppressed steric hindrance has an improving effect on a charge transporting characteristic at an interface where the hole injecting material and the hole transporting material are joined to each other. Further, the fact that the compound used as the hole transporting material has a highly planar substituent for a carbazolyl group serves as a factor for an improvement in the charge transporting characteristic. As a result, the device may have improved luminous efficiency, and the voltage at which the device is driven may reduce.

Further, the organic EL device of the present invention is applicable even to an organic EL device of which any one of the red, green, and blue pixels needed for a full-color display is formed because the device can suitably transport charge. In addition, it can be expected that the commonality of materials except the host material and light emitting material in the light emitting layer can be achieved. As a result, a reduction in production cost for the device can be expected.

Effect of the Invention

According to the present invention, there can be provided an organic EL device excellent in practicality because of the following reasons: the device can be driven at a reduced voltage, and has high luminous efficiency.

BEST MODE FOR CARRYING OUT THE INVENTION

An organic EL device of the present invention includes: an anode; a cathode; and organic thin film layers provided between the anode and the cathode. The organic thin film layers have a light emitting layer, and have a hole injecting layer and a hole transporting layer, or a hole injecting/transporting layer on a side which is closer to the anode than the light emitting layer is. In addition, the hole injecting layer contains an aromatic amine derivative X having a specific substituent, and the hole transporting layer contains an aromatic amine derivative Y having a specific substituent. Alternatively, the hole injecting/transporting layer contains those aromatic amine derivatives X and Y each having a specific substituent. Hereinafter, those aromatic amine derivatives X and Y each having a specific substituent are described.

(Aromatic Amine Derivative X having Specific Substituent)

The specific substituent of the aromatic amine derivative X is represented by the following formula (1).

[Chem 3]

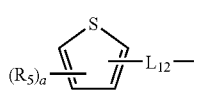

Formula (1)

In the above formula (1):

$L_{12}$ represents a substituted or unsubstituted arylene group having 6 to 60 atoms forming a ring, a substituted or unsubstituted fluorenylene group, or a substituted or unsubstituted heteroarylene group having 5 to 60 atoms forming a ring; and $R_5$ represents a hydrogen atom, a substituted or unsubstituted aryl group having 6 to 14 atoms forming a ring, a substituted or unsubstituted aryloxy group having 5 to 14 atoms forming a ring, a substituted or unsubstituted arylthio group having 5 to 14 atoms forming a ring, a branched or linear, substituted or unsubstituted alkyl group having 1 to 6 carbon atoms, or a branched or linear, substituted or unsubstituted alkoxycarbonyl group having 1 to 6 carbon atoms, or preferably represents a substituted or unsubstituted aryl group having 6 to 14 atoms forming a ring, or a branched or linear, substituted or unsubstituted alkyl group having 1 to 6 carbon atoms, a represents an integer of 1 to 3, and, when a represents 2 or 3, multiple $R_5$'s may be identical to or different from each other.

In particular, the aryl group is preferably an aryl group having 6 to 12 atoms forming a ring, more preferably an aryl group having 6 to 10 atoms forming a ring, or still more preferably a phenyl group. Further, the branched or linear alkyl group is preferably a group having 1 to 3 carbon atoms, or more preferably a methyl group.

When $R_5$ represents a substituted or unsubstituted aryl, aryloxy, or arylthio group, the group has a molecular weight of preferably 65 to 250, more preferably 65 to 200, still more preferably 65 to 170, or particularly preferably 78 to 100. Alternatively, when $R_5$ represents a branched or linear, substituted or unsubstituted alkyl group, the group has a molecular weight of preferably 15 to 100, or more preferably 15 to 60.

In the case of saturated rings, unsaturated rings, or aromatic rings, the term "atoms forming a ring" as used herein refers to carbon atoms of which any such ring is formed; in the case of heterocyclic rings (including saturated rings, unsaturated rings, and aromatic rings), the term refers to a carbon atom and a heteroatom of which any such ring is formed.

In addition, examples of the substituent in the phrase "substituted or unsubstituted . . . " include such alkyl, aryl, cycloalkyl, alkoxy, heterocyclic, aralkyl, aryloxy, arylthio, alkoxycarbonyl, dibenzofuranyl, and fluorenyl groups as described later.

It should be noted that, when a group represented by any one of $R_1$ and $R_2$ in the formula (1) and a formula (2) has a substituent, the substituent is preferably a relatively small substituent such as a silyl group (for example, a trialkylsilyl group, a triarylsilyl group, a diarylalkylsilyl group, or an aryldialkylsilyl group), or an alkyl group having 3 or less carbon atoms (for example, a methyl group).

The substituent represented by the above formula (1) is preferably a substituent represented by the following formula (1a). The substituent suppresses the steric hindrance of a region with a high electron density. As a result, regions with high electron densities easily overlap each other between molecules, so the charge transporting characteristic of the organic EL device can be improved.

[Chem 4]

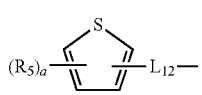

Formula (1a)

In the above formula (1a), $R_5$ has the same meaning as that of $R_5$ in the formula (1), and $L_{12}$ has the same meaning as that of $L_{12}$ in the formula (1).

The aromatic amine derivative (X) is preferably represented by any one of the following formulae (3) and (15) to (18):

[Chem 5]

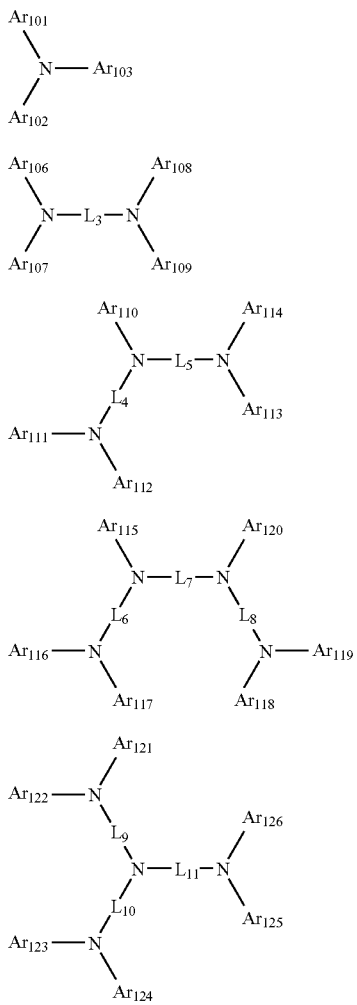

where at least one of $Ar_{101}$ to $Ar_{103}$ represents the substituent represented by the formula (1), at least one of $Ar_{106}$ to $Ar_{109}$ represents the substituent represented by the formula (1), at least one of $Ar_{110}$ to $Ar_{114}$ represents the substituent represented by the formula (1), at least one of $Ar_{115}$ to $Ar_{120}$ represents the substituent represented by the formula (1), at least one of $Ar_{121}$ to $Ar_{126}$ represents the substituent represented by the formula (1) groups represented by $Ar_{101}$ to $Ar_{124}$ except the substituent represented by the formula (1) each independently represent a substituted or unsubstituted aryl group having 6 to 50 atoms forming a ring, or a substituted or unsubstituted heteroaryl group having 5 to 60 atoms forming a ring, and, when a group represented by any one of $Ar_{101}$ to $Ar_{124}$ has a substituent, the substituent includes an aryl group having 6 to 50 atoms forming a ring, or a branched or linear alkyl group having 1 to 50 carbon atoms.

Of all kinds of the above aromatic amine derivative (X), an aromatic amine derivative represented by the above formula (15) is preferable. The aromatic amine derivative suppresses the steric hindrance of a region with a high electron density.

As a result, regions with high electron densities easily overlap each other between molecules, so the charge transporting characteristic of the organic EL device can be improved.

Ina preferred embodiment, the aromatic amine derivative (X) represented by any one of the above respective formulae is as described below.

In the formula (15), $Ar_{106}$ preferably represents the substituent represented by the formula (1).

In the formula (15), $Ar_{106}$ and $Ar_{107}$ each preferably represent the substituent represented by the formula (1).

In the formula (15), $Ar_{106}$ and $Ar_{108}$ each preferably represent the substituent represented by the formula (1).

It is preferred that, in the formula (15), three or more of $Ar_{106}$ to $Ar_{109}$ be different from one another, and the aromatic amine derivative be asymmetric.

It is preferred that, in the formula (15), three of $Ar_{106}$ to $Ar_{109}$ be identical to one another, and the aromatic amine derivative be asymmetric.

It is preferred that, in the formula (15), groups represented by $Ar_{106}$ to $Ar_{109}$ except the substituent represented by the formula (1) be each independently a phenyl group, a biphenylyl group, a terphenylyl group, or a fluorenyl group.

In the formula (15), $L_3$ preferably represents a biphenylylene group, a terphenylylene group, or a fluorenylene group.

In the formula (1), $L_{12}$ preferably represents a phenylene group, a biphenylylene group, or a fluorenylene group.

In the formula (1), $R_5$ preferably represents a phenyl group, a naphthyl group, or a phenanthrene group.

It is preferred that, in the formula (15), groups represented by $Ar_{106}$ to $Ar_{109}$ except the substituent represented by the formula (1) be each independently a phenyl group, a biphenylyl group, a terphenylyl group, or a fluorenyl group, and $L_3$ represent a biphenylylene group, a terphenylylene group, or a fluorenylene group, and, in the formula (1), $L_{12}$ represent a phenylene group, a biphenylylene group, or a fluorenylene group.

In addition, in the respective formulae (16) to (18), $L_4$ to $L_{11}$ each represent a substituted or unsubstituted arylene group having 6 to 50 atoms forming a ring, at least one of $Ar_{110}$ to $Ar_{114}$ represents the substituent represented by the formula (1), at least one of $Ar_{115}$ to $Ar_{119}$ represents the substituent represented by the formula (1), and at least one of $Ar_{120}$ to $Ar_{126}$ represents the substituent represented by the formula (1).

In the respective formulae (16) to (18), groups represented by $Ar_{110}$ to $Ar_{126}$ except the substituent represented by the formula (1) are each independently a substituted or unsubstituted aryl group having 6 to 50 atoms forming a ring. It should be noted that, when a group represented by any one of $Ar_{110}$ to $Ar_{126}$ has a substituent, the substituent is an aryl group having 6 to 50 atoms forming a ring, or a branched or linear alkyl group having 1 to 50 carbon atoms.

In the formula (16), at least one of $Ar_{110}$ to $Ar_{114}$ preferably represents the substituent represented by the formula (1).

In the formula (16), $Ar_{110}$ preferably represents the substituent represented by the formula (1).

In the formula (16), $Ar_{111}$ and $Ar_{113}$ each preferably represent the substituent represented by the formula (1).

In the formula (17), at least one of $Ar_{115}$ to $Ar_{120}$ preferably represents the substituent represented by the formula (1).

In the formula (17), $Ar_{115}$ and $Ar_{120}$ each preferably represent the substituent represented by the formula (1).

In the formula (17), $Ar_{116}$ and $Ar_{118}$ each preferably represent the substituent represented by the formula (1).

In the formula (18) at least one of $Ar_{121}$ to $Ar_{126}$ preferably represents the substituent represented by the formula (1).

In the formula (18), $Ar_{121}$, $Ar_{123}$, and $Ar_{125}$ each preferably represent the substituent represented by the formula (1).

It is preferred that, in the formulae (16) to (18), groups represented by $Ar_{120}$ to $Ar_{126}$ except the substituent represented by the formula (1) be each a phenyl group, a biphenylyl group, a terphenylyl group, or a fluorenyl group.

It is preferred that, in the formulae (16) to (18), $L_4$ to $L_{11}$ each independently represent a phenylene group, a biphenylylene group, a terphenylylene group, or a fluorenylene group.

In the formula (1), $L_{12}$ preferably represents a phenylene group, a biphenylylene group, or a fluorenylene group.

In the formula (1), $R_5$ preferably represents a phenyl group, a naphthyl group, or a phenanthrene group.

It is preferred that, in the formulae (16) to (18), groups represented by $Ar_{110}$ to $Ar_{126}$ except the substituent represented by the formula (1) be each a phenyl group, a biphenylyl group, a terphenylyl group, or a fluorenyl group, and $L_4$ to $L_{11}$ each represent a phenylene group, a biphenylylene group, a terphenylylene group, or a fluorenylene group, and, in the formula (1), $L_{12}$ represent a phenylene group, a biphenylylene group, or a fluorenylene group.

Examples of the substituted or unsubstituted aryl group represented by $Ar_{101}$ to $Ar_{103}$ and $Ar_{106}$ to $Ar_{126}$ in the formulae (3) and (15) to (18) and $R_5$ in the formulae (1) and (1a) include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a fluoranthenyl group, and a fluorenyl group.

Note that in the case of formulae (1) and (1a), as described above, groups are chosen from those having 5 to 14 atoms forming a ring.

Of those, a phenyl group, a naphthyl group, a biphenylyl group, a terphenylyl group, and a fluorenyl group are preferable.

A thiophene compound has high reactivity at 2- and 5-positions thereof; thus, it is preferable to protect those substitution positions. As a reference document, "Macromol. Rapid Commun., 2001. 22, 266-270" is given, and reports that the polymerization proceeds under electrically unstable conditions. An alkyl group or an aryl group is preferable as a substituent, and from a viewpoint of the stability of the compound, an aryl group is preferable and an unsubstituted aryl group is more preferable.

In addition, examples of the substituted or unsubstituted heteroaryl group include heteroaryl groups listed in the following description of a linker portion.

Examples of the substituted or unsubstituted arylene group having 5 to 50 atoms forming a ring represented by any one of $L_3$ to $L_{11}$ in the formulae (15) to (18) and $L_{12}$ in the formulae (1) and (1a) include groups obtained by making the examples of the aryl group divalent.

Examples of the substituted or unsubstituted alkyl group represented by $R_5$ in the formulae (1) and (1a) include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a trifluoromethyl group, a cyclopropyl group, a cyclobutyl group, a cyclopentyl group, a cyclohexyl group, and a 4-methylcyclohexyl group. The group is preferably a saturated, chain, branched, or cyclic alkyl group formed of a hydrocarbon, and specific examples of such a group include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a cyclopropyl group, a cyclobutyl group, a cyclopentyl group, a cyclohexyl group, and a 4-methylcyclohexyl group.

Examples of the aryl group having 6 to 50 atoms forming a ring, and the branched or linear alkyl group having 1 to 50 carbon atoms each serving as a substituent for any one of $Ar_{101}$ to $Ar_{103}$ and $Ar_{106}$ to $Ar_{126}$ include the same examples as those described above.

In the formula (1), a represents an integer of 1 to 3, and, when a represents 2 or 3, multiple $R_5$'s may be identical to or different from each other, and the multiple $R_5$'s may be bonded to each other to form a saturated or unsaturated, five- or six-membered cyclic structure which may be substituted; provided that the cyclic structure is not an aromatic ring.

Examples of the five- or six-membered cyclic structure which may be formed include: cycloalkanes each having 4 to 12 carbon atoms, such as cyclopentane, cyclohexane, adamantane, and norbornane; cycloalkenes each having 4 to 12 carbon atoms, such as cyclopentene and cyclohexene; and cycloalkadienes each having 5 to 12 carbon atoms, such as cyclopentadiene and cyclohexadiene.

Specific examples of the aromatic amine derivative (X) are shown below. However, the derivative is not limited to these exemplified compounds.

[Chem 6]

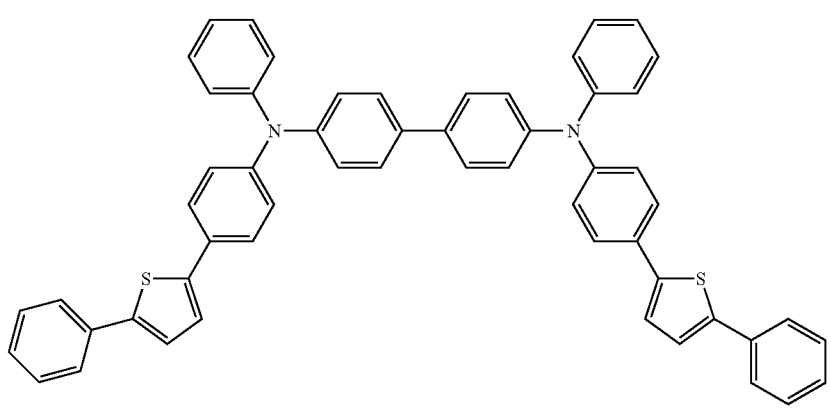

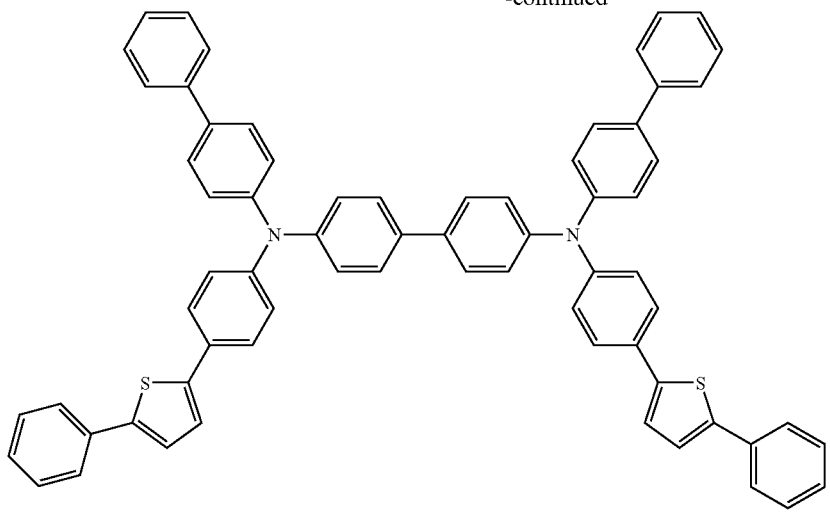
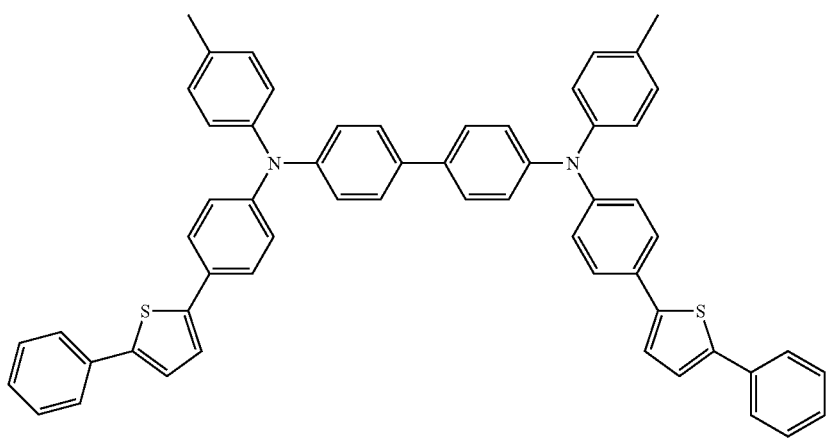
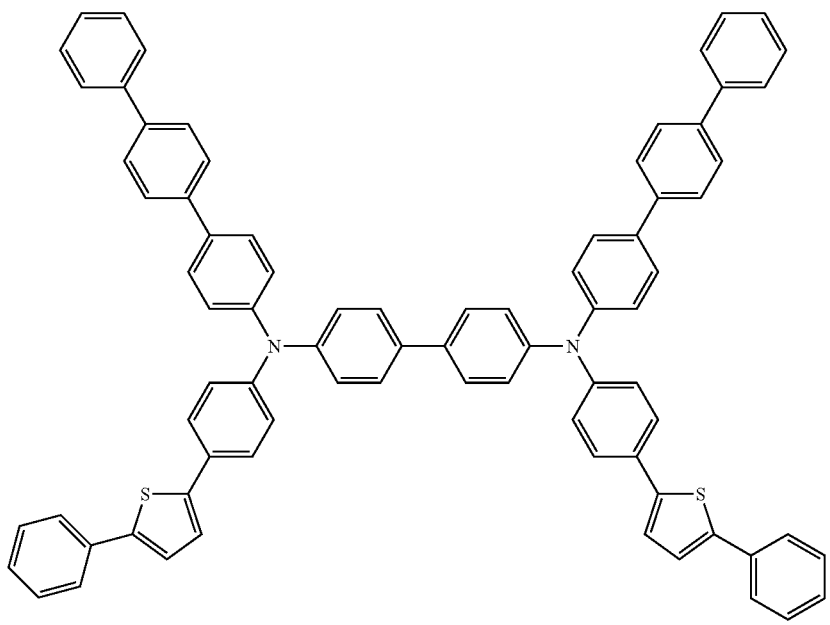

-continued
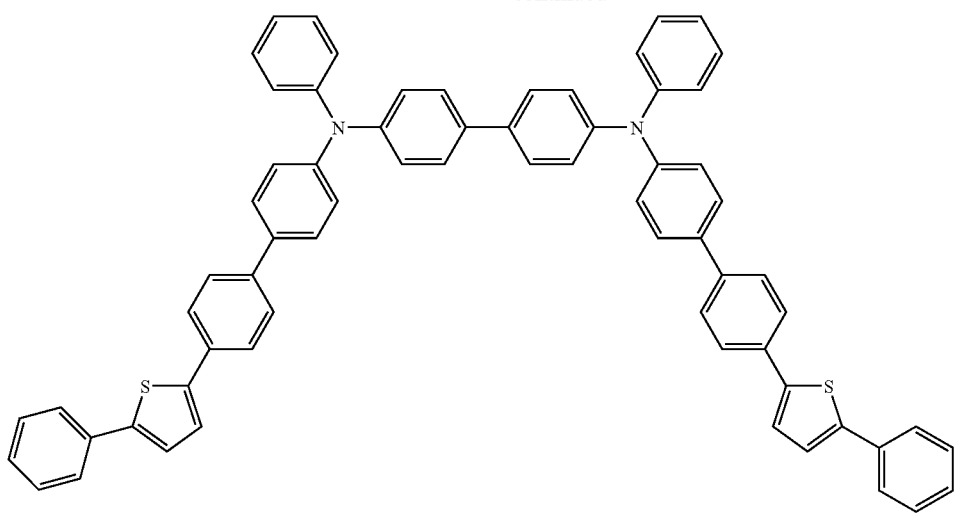
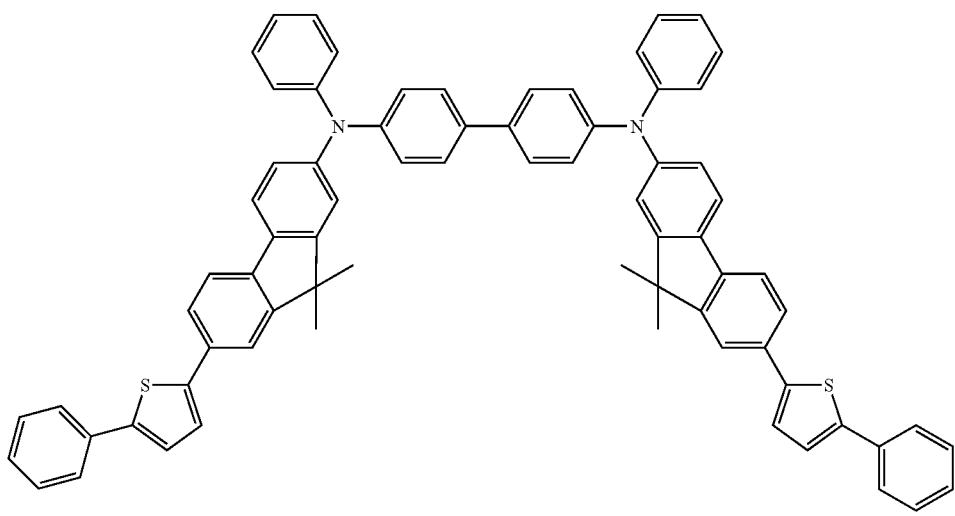
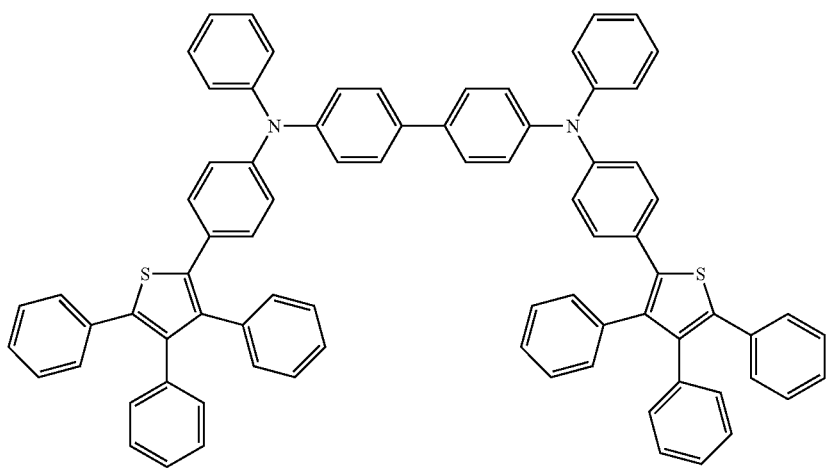

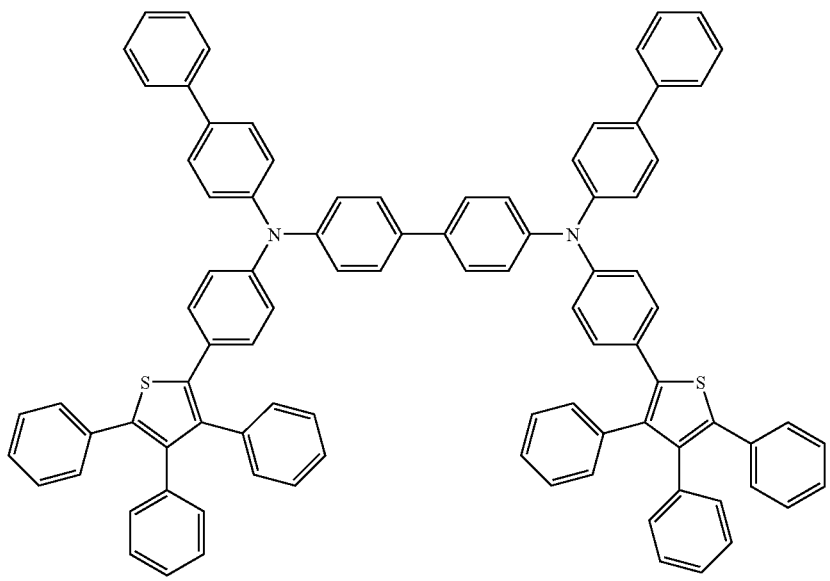
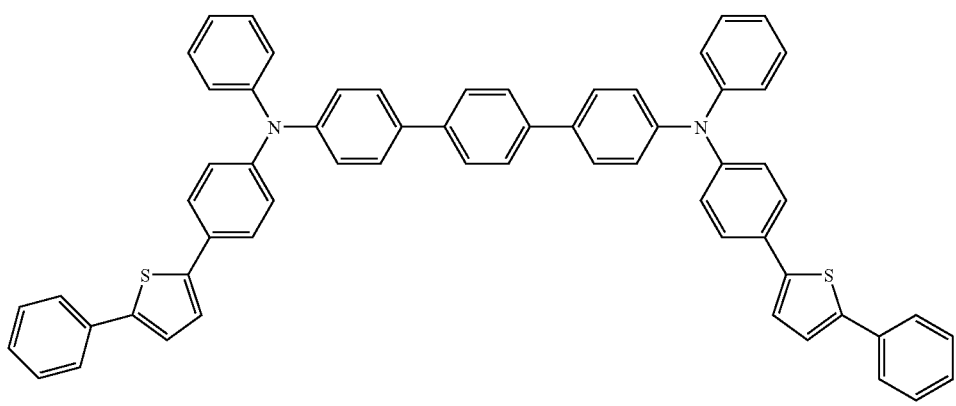
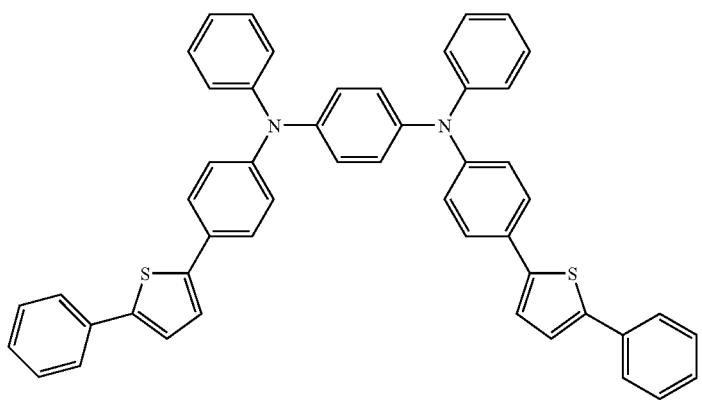

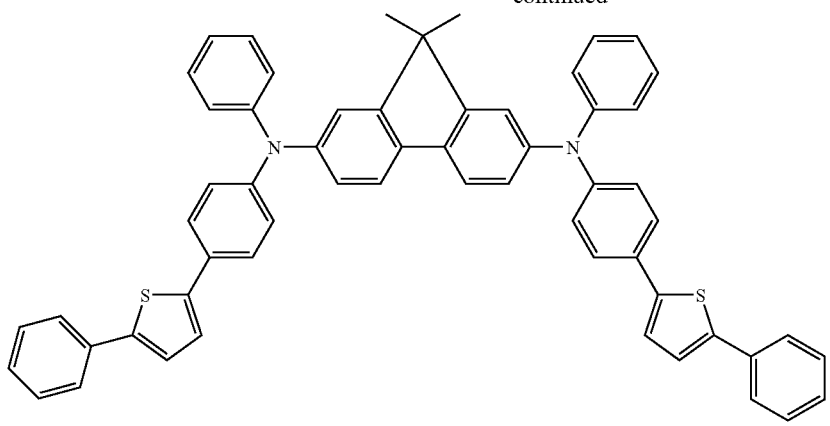
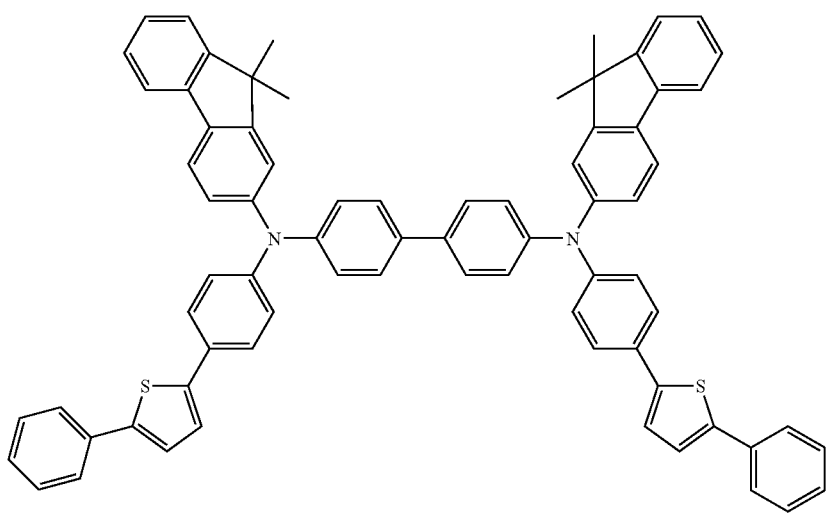
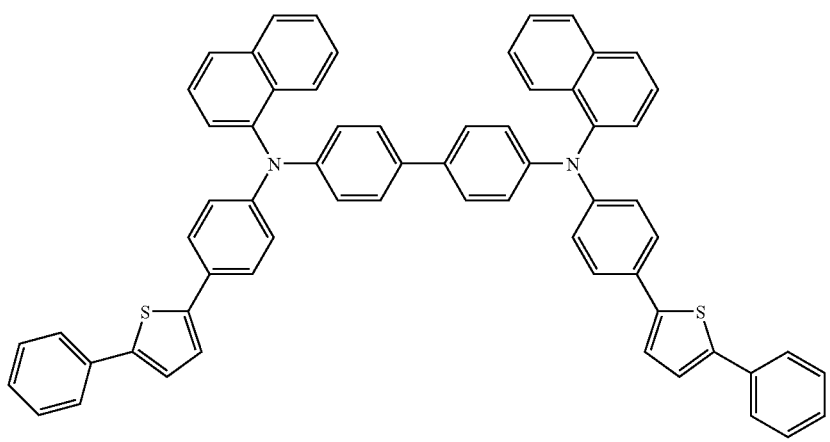

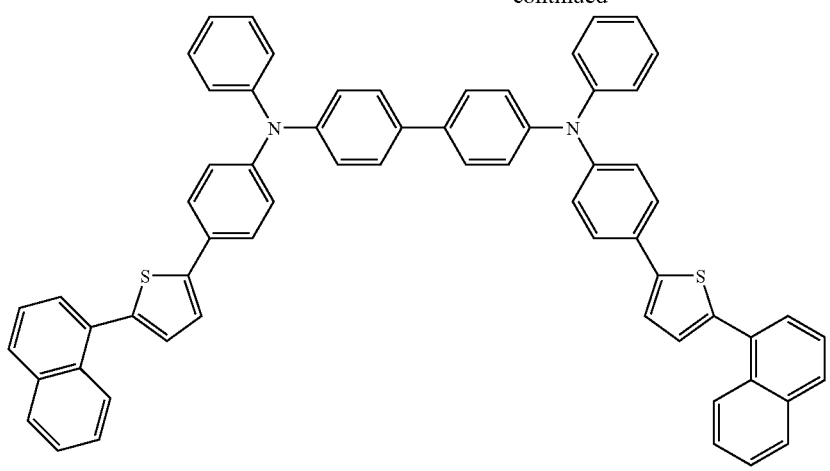
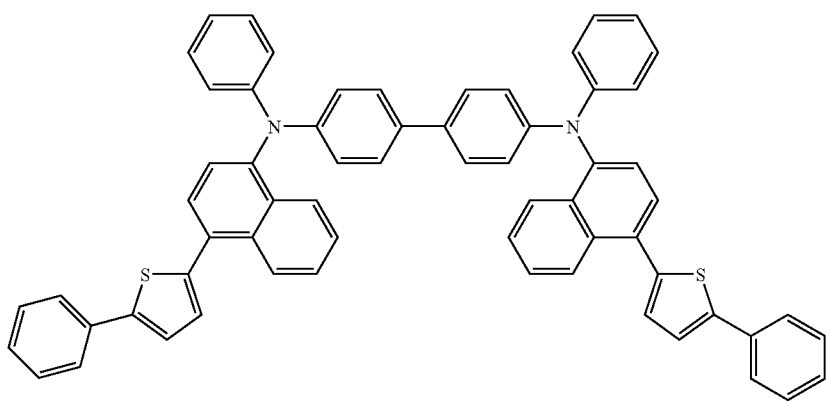 [SMILES: c1ccc(-c2ccc(-c3ccc(N(c4ccccc4)c4ccc(-c5ccc(N(c6ccccc6)c6ccc(-c7ccc(-c8ccccc8)s7)c7ccccc67)cc5)cc4)c4ccccc34)s2)cc1]
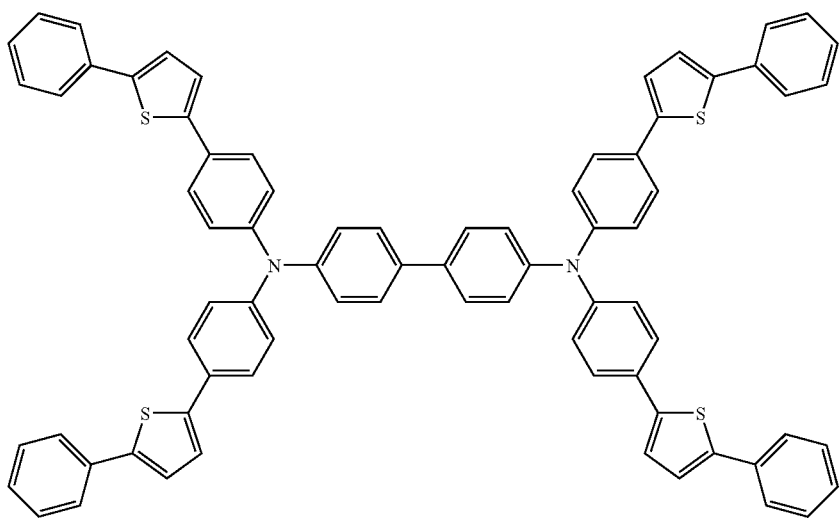

-continued
[Chem 7]
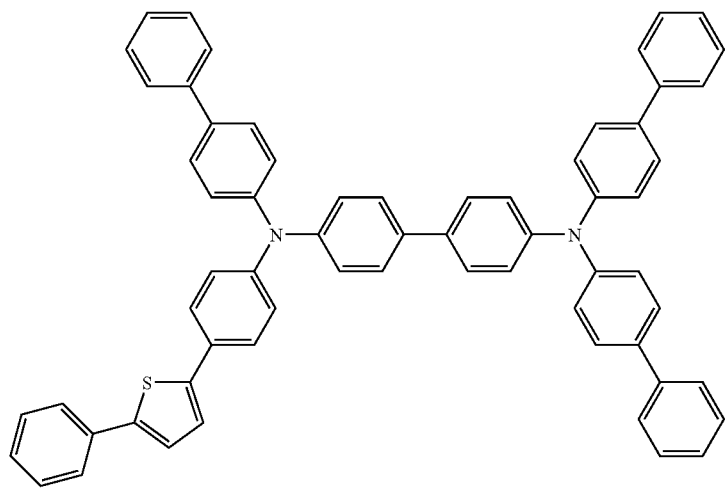
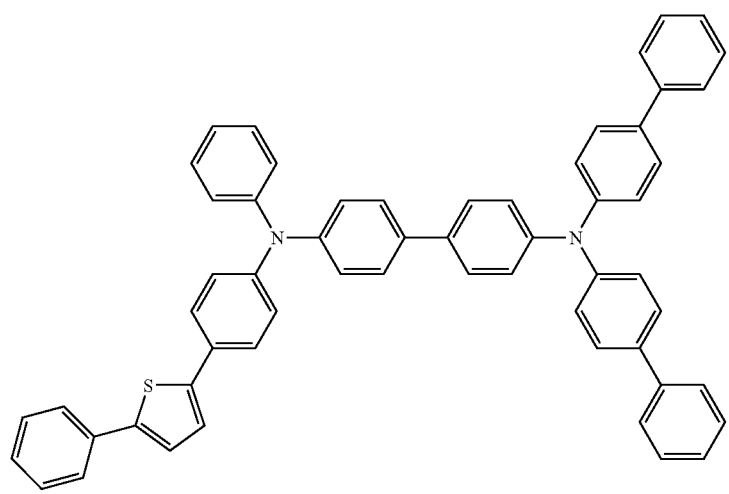
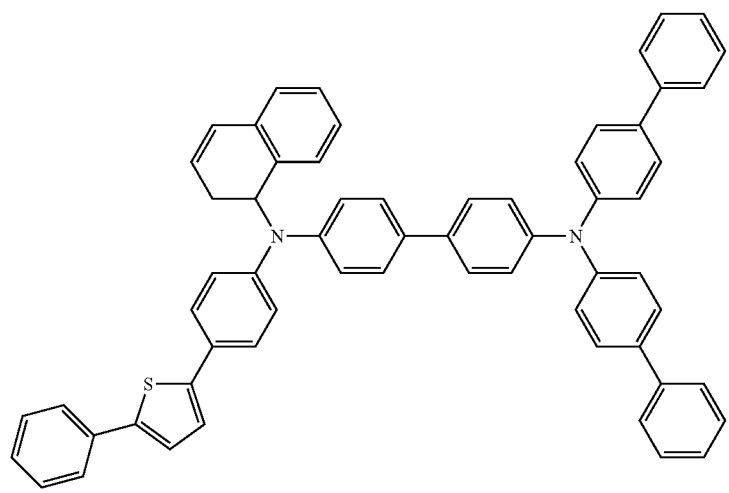

-continued
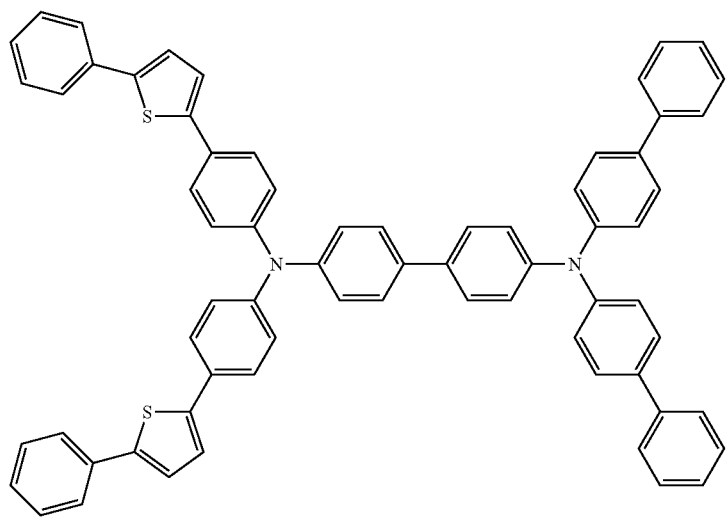
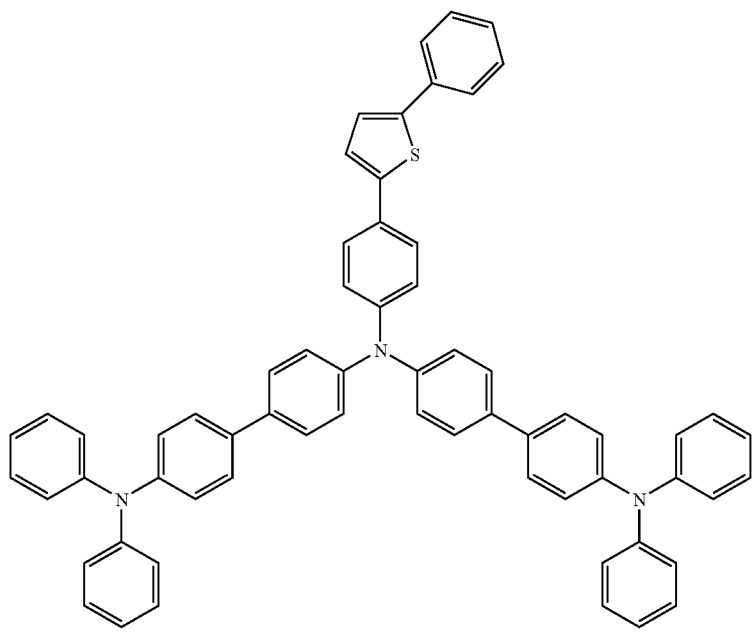
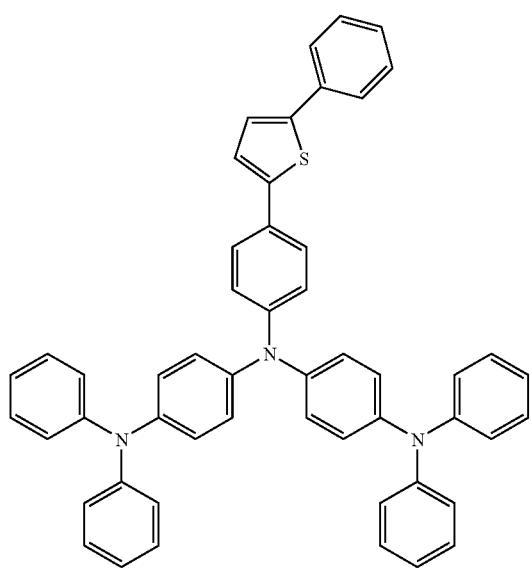

-continued
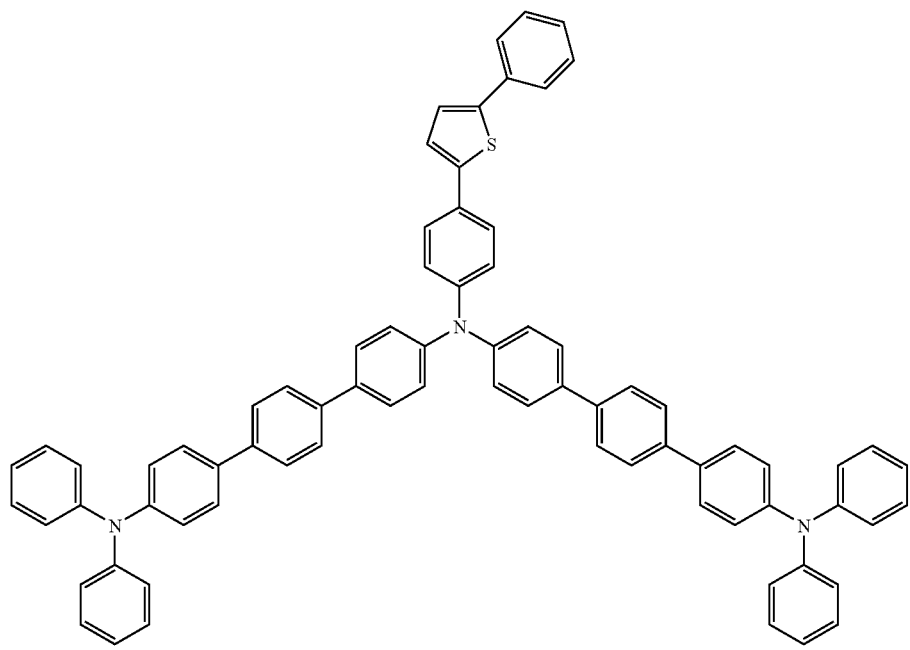
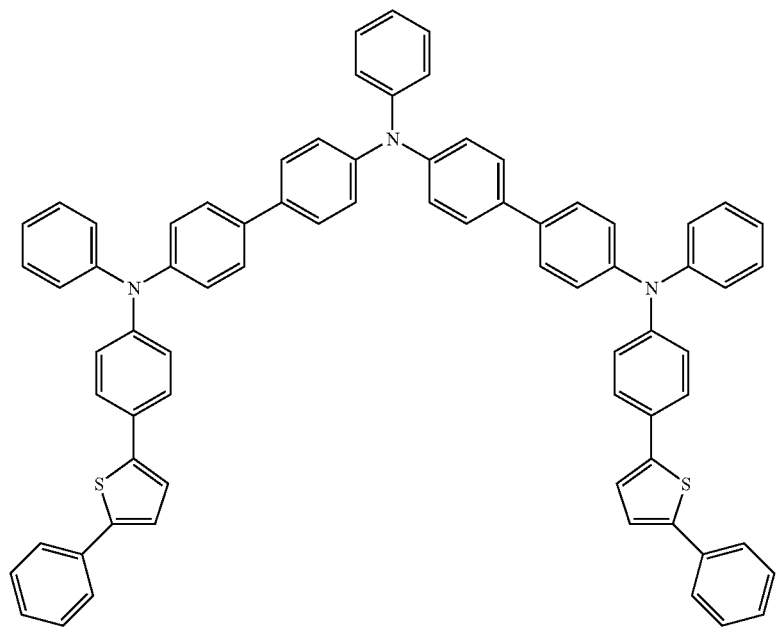

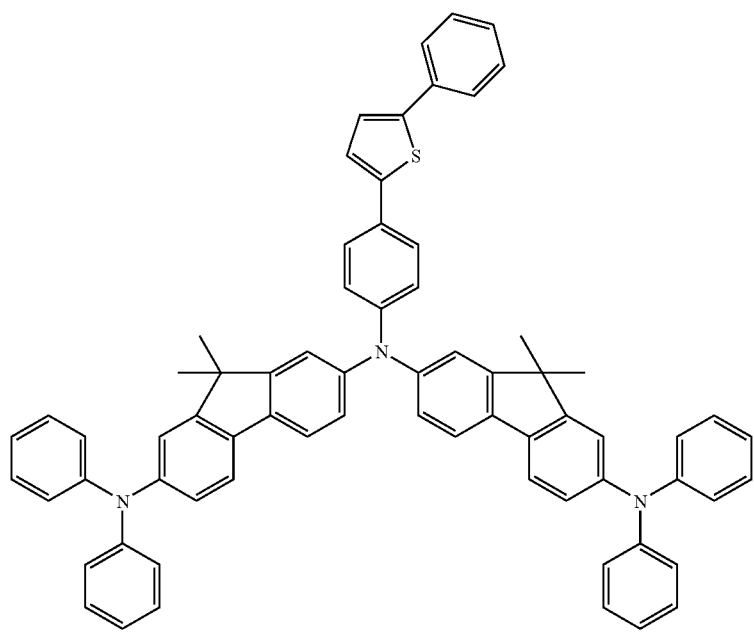
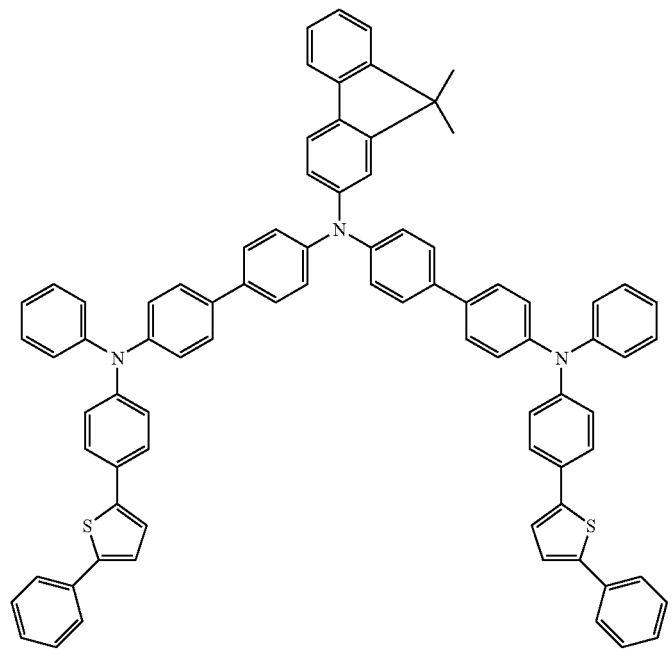

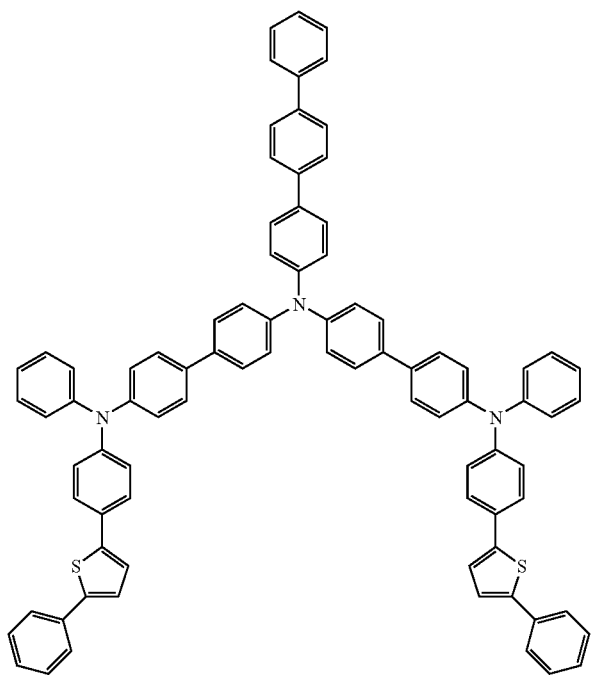
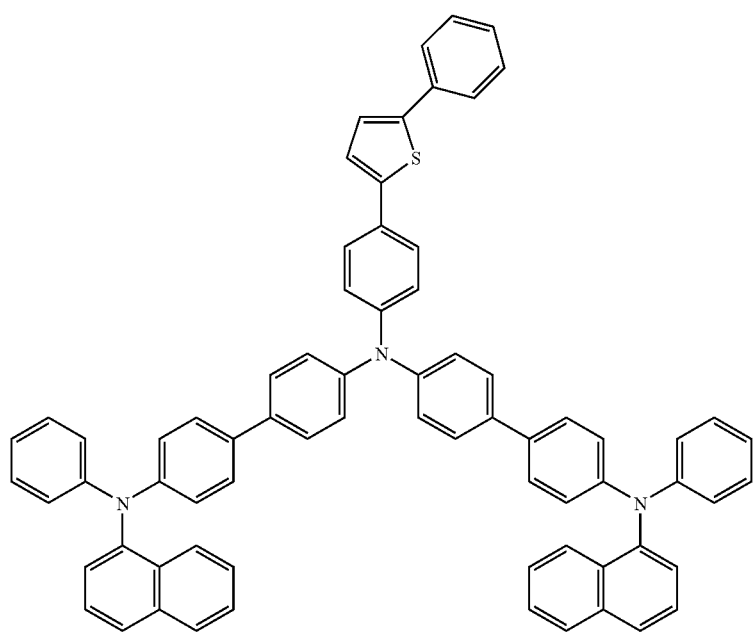

-continued
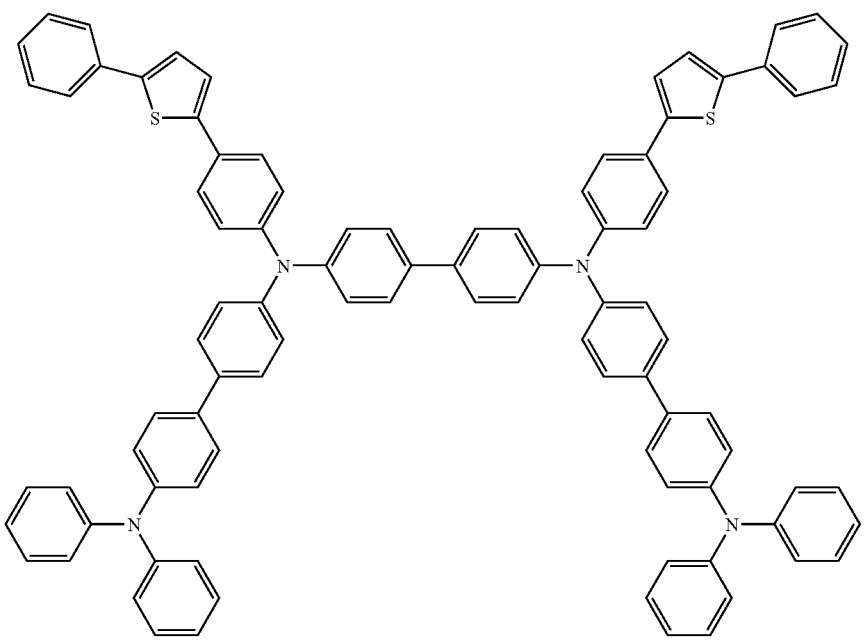
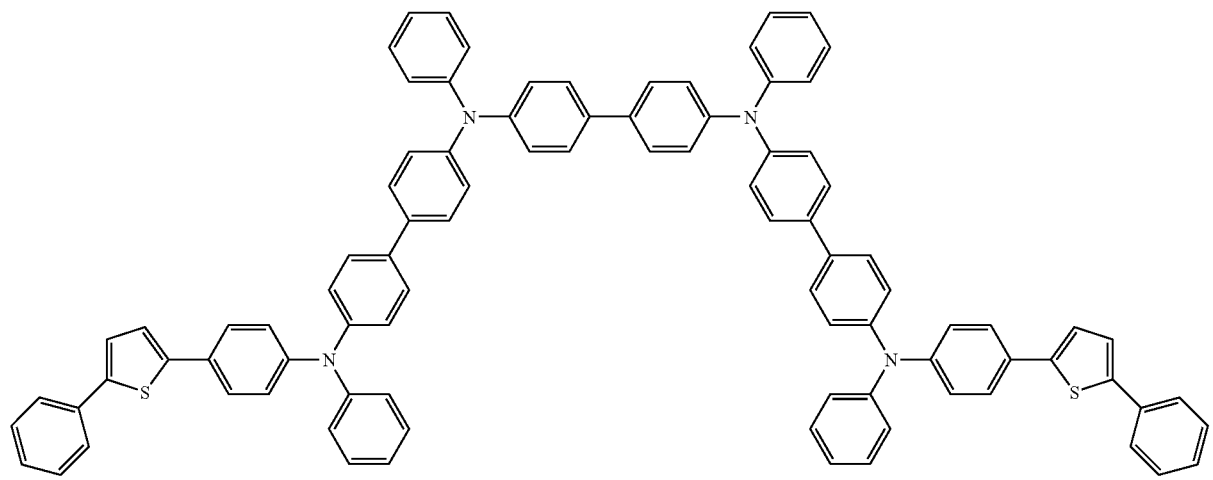
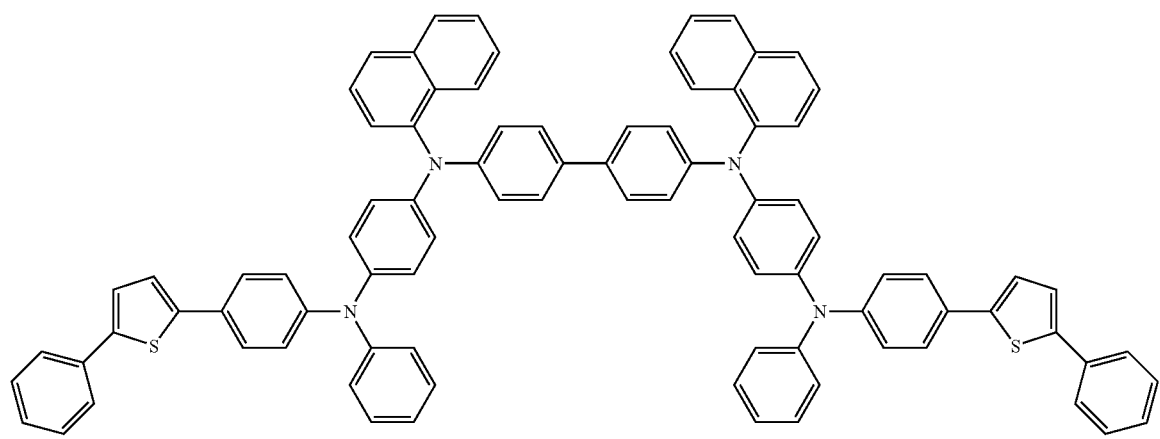

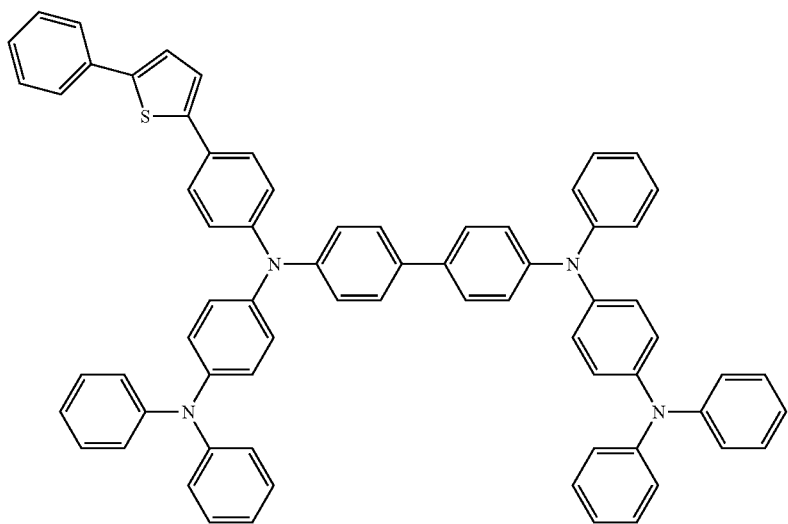
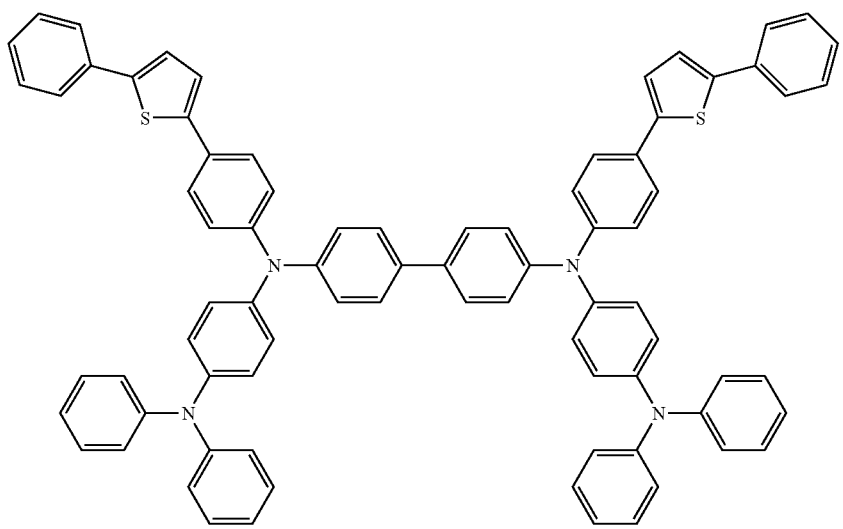
[Chem 8]
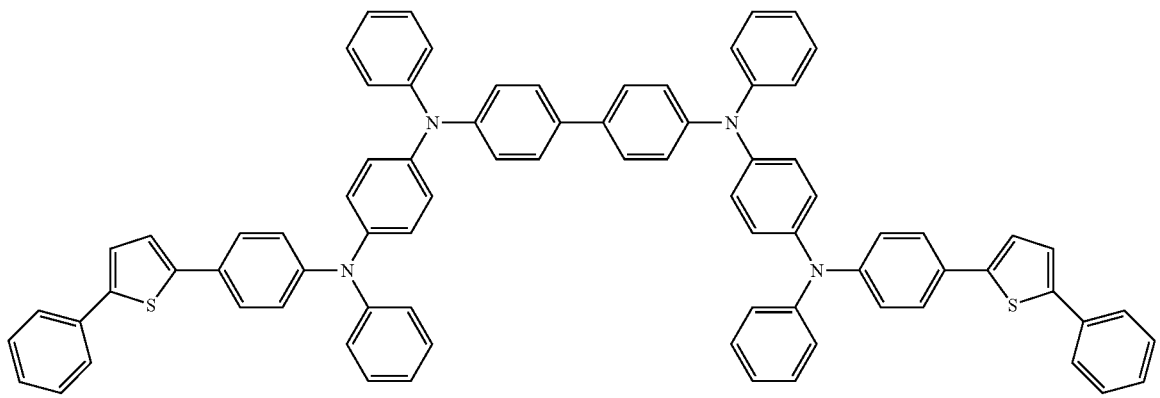

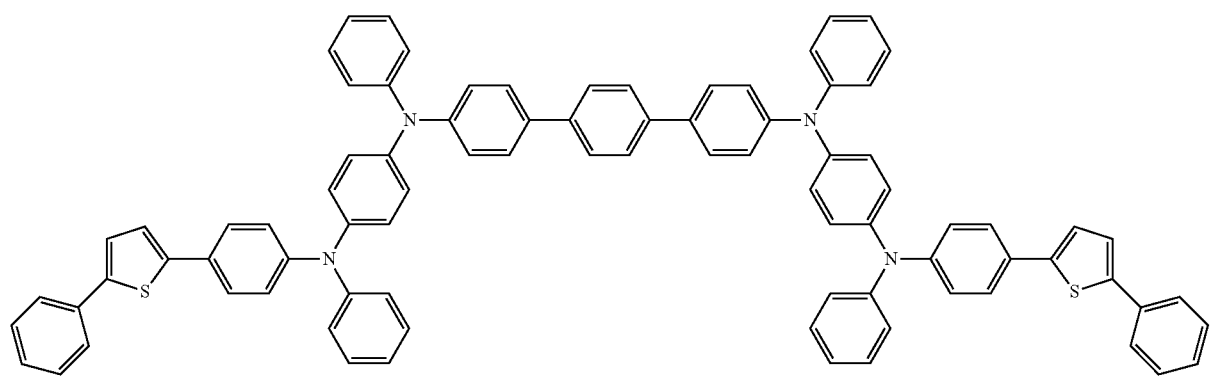
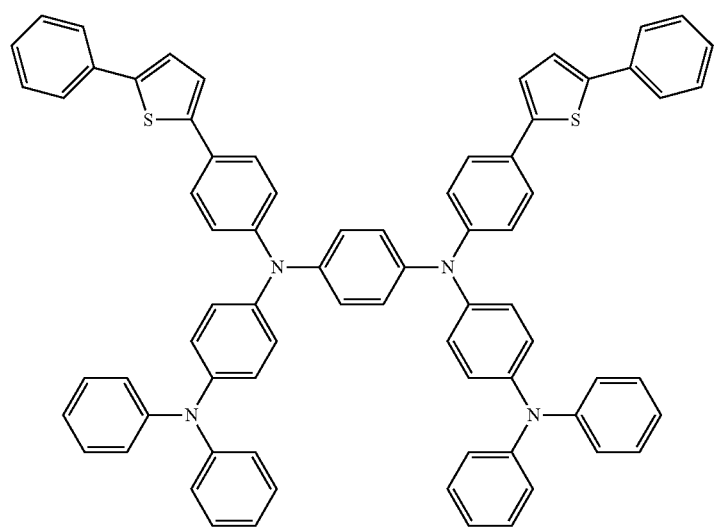
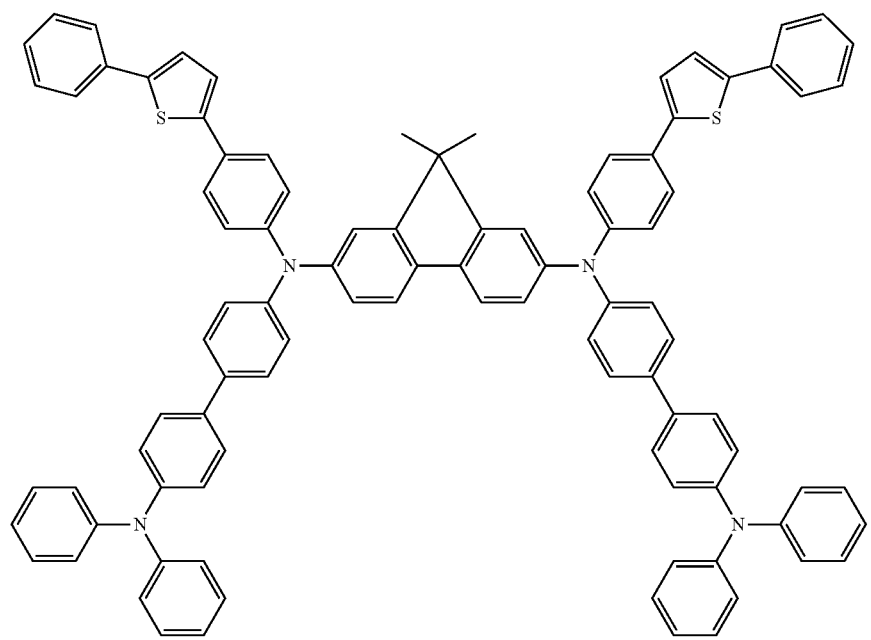

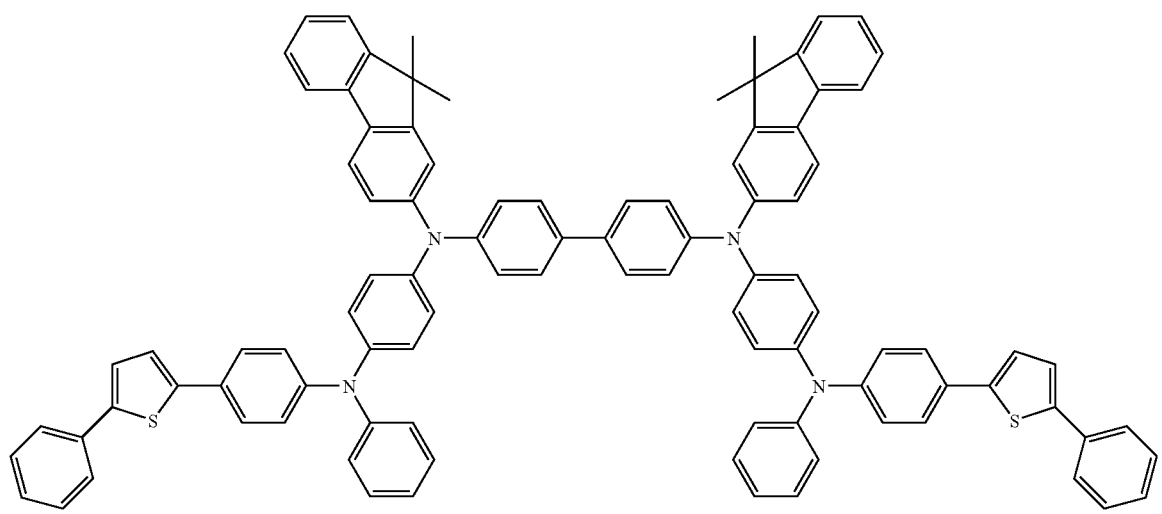
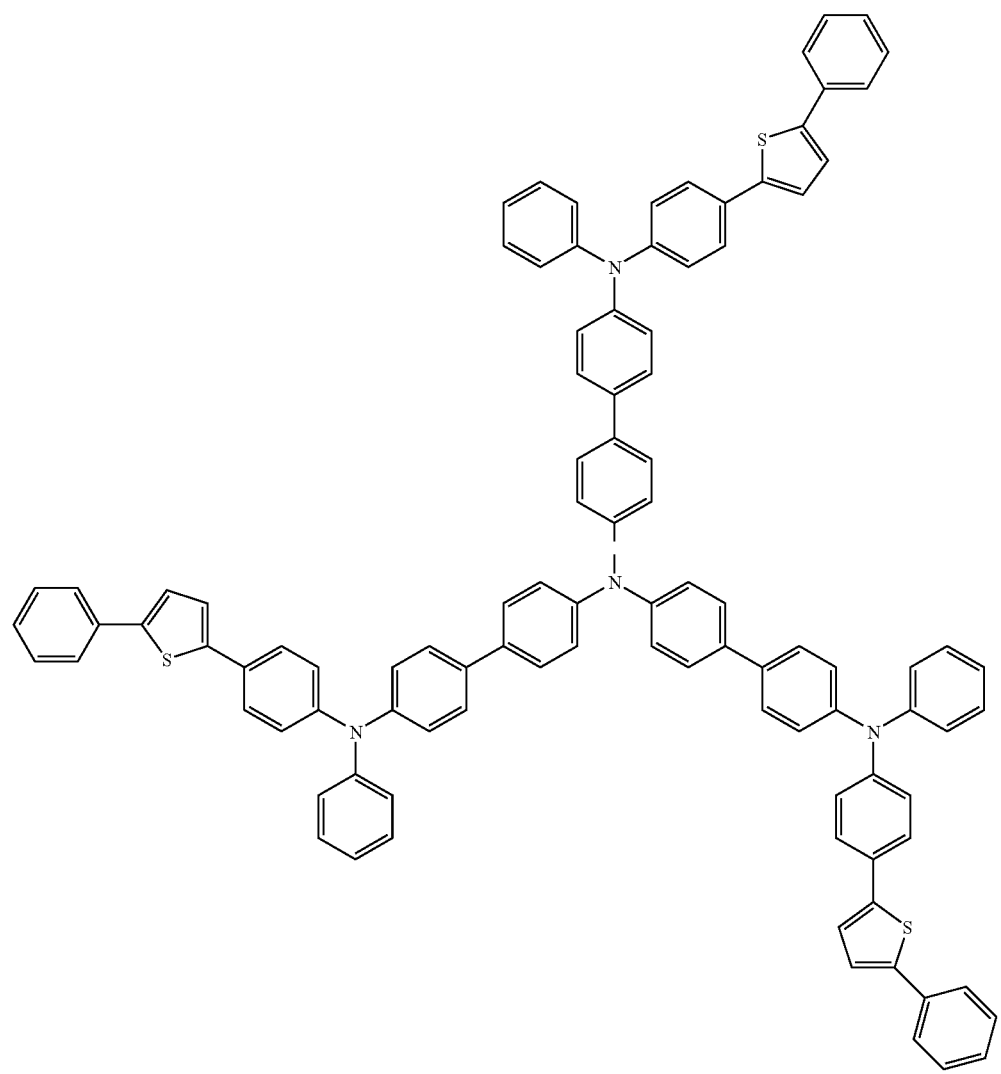

-continued
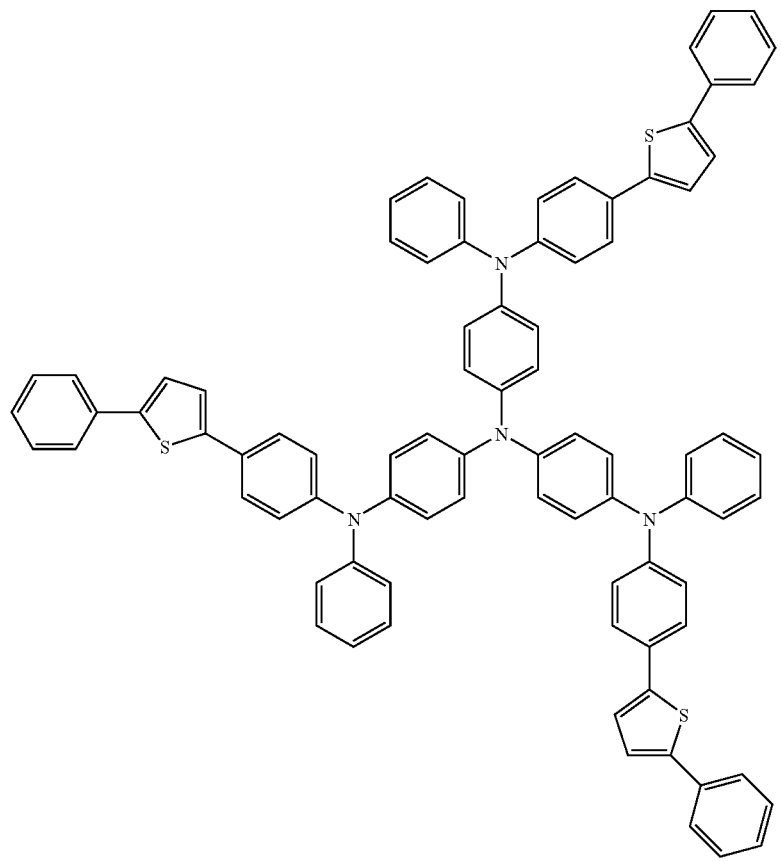
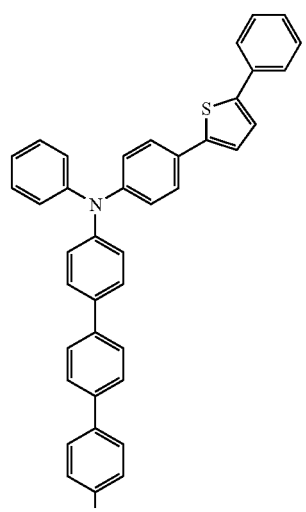

-continued
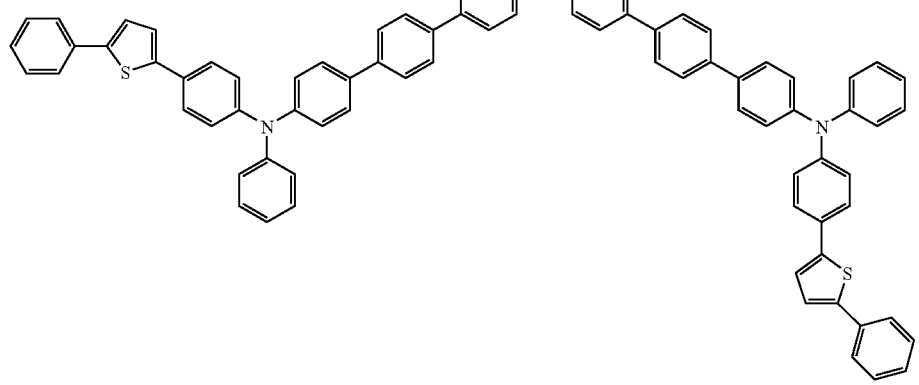
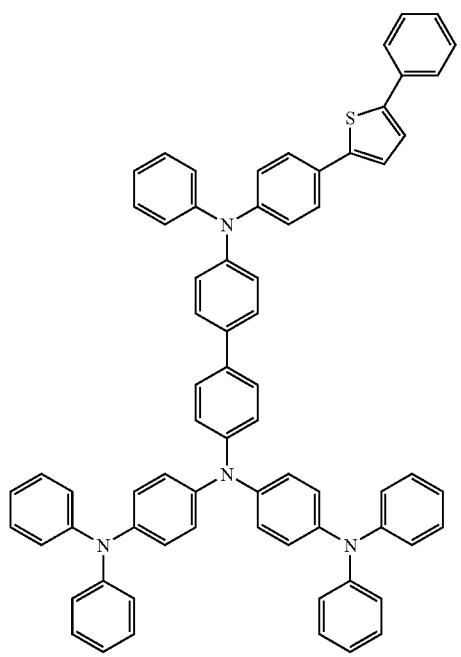

-continued
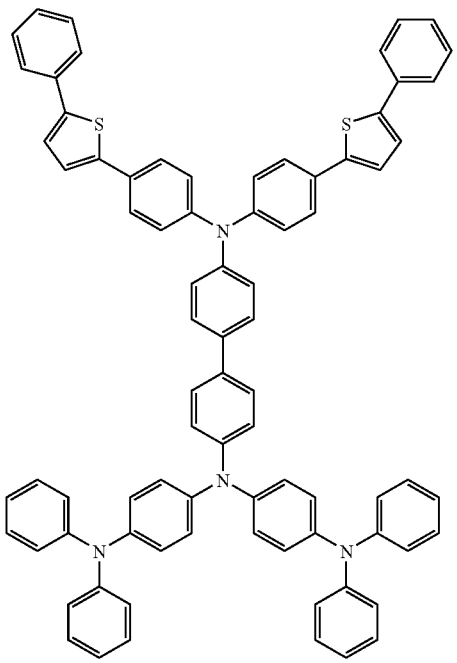
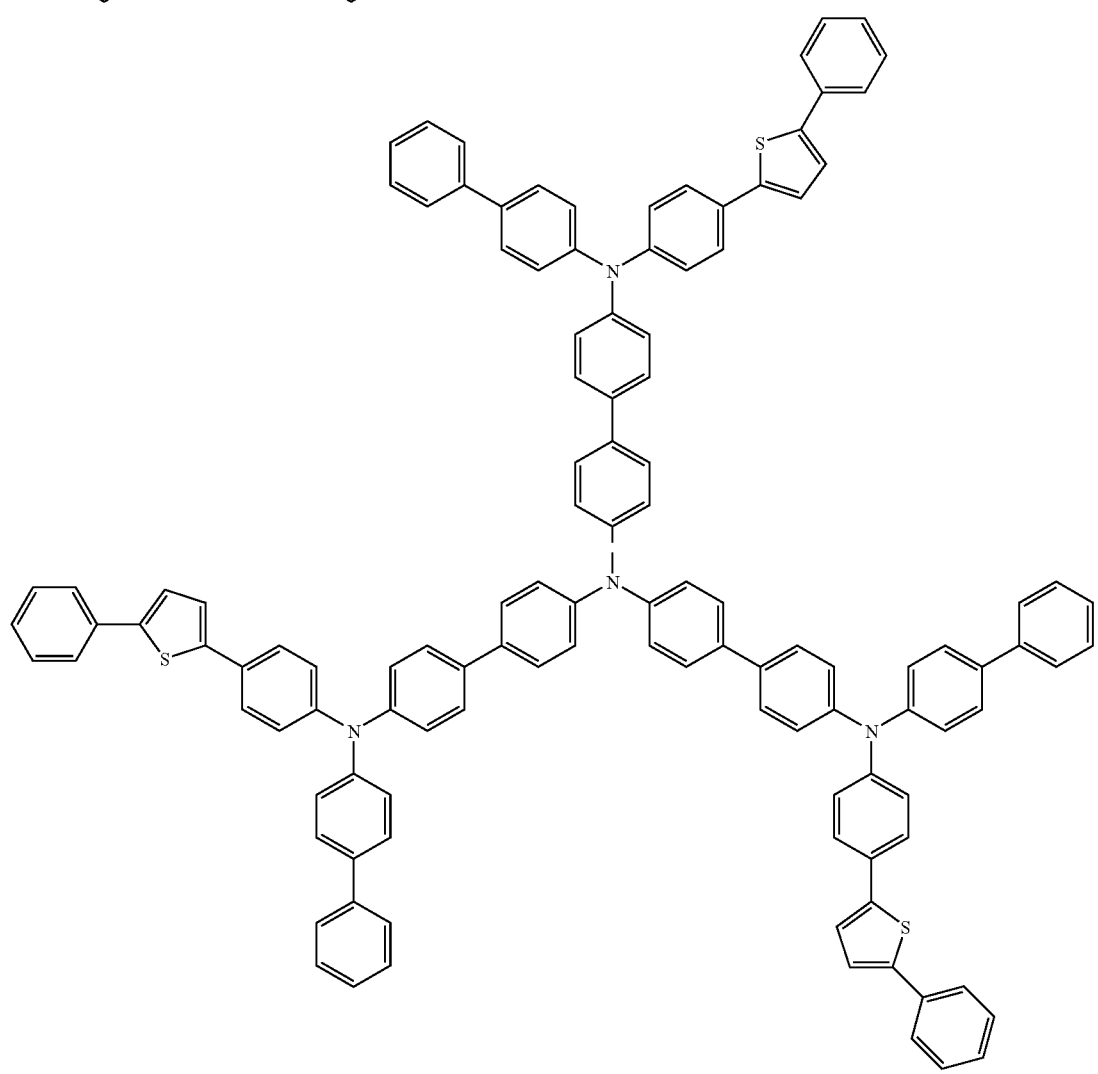

-continued
[Chem 9]
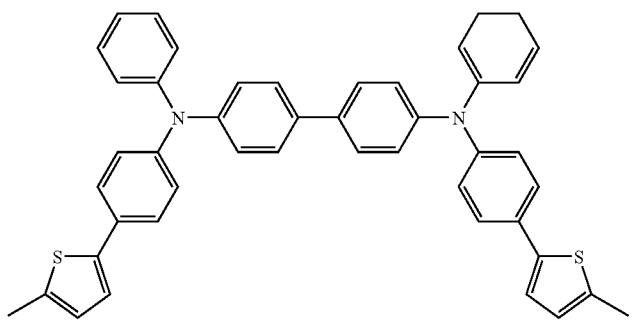
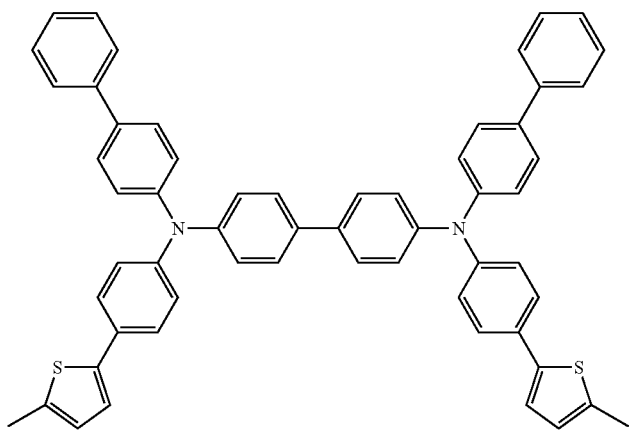
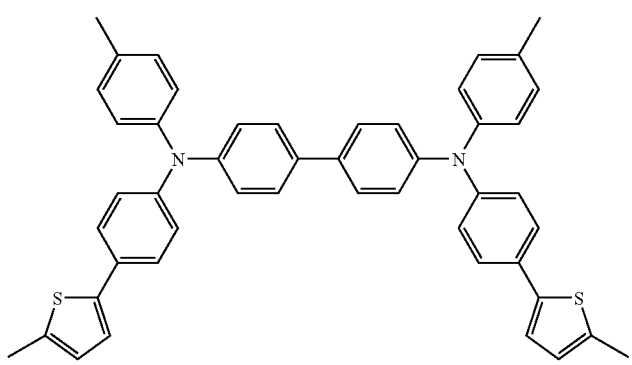
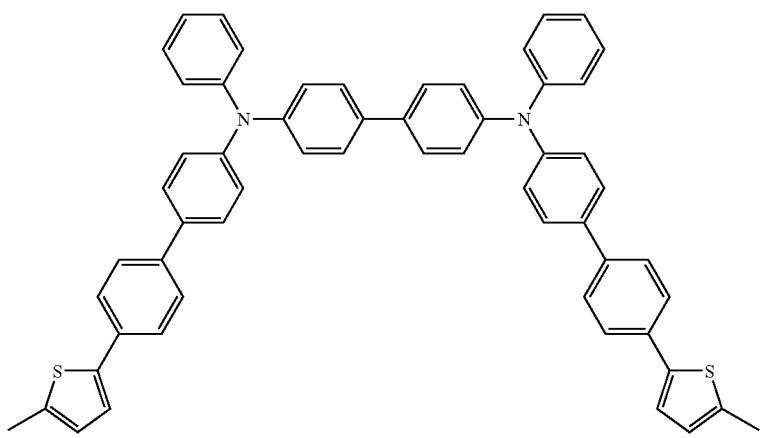

-continued
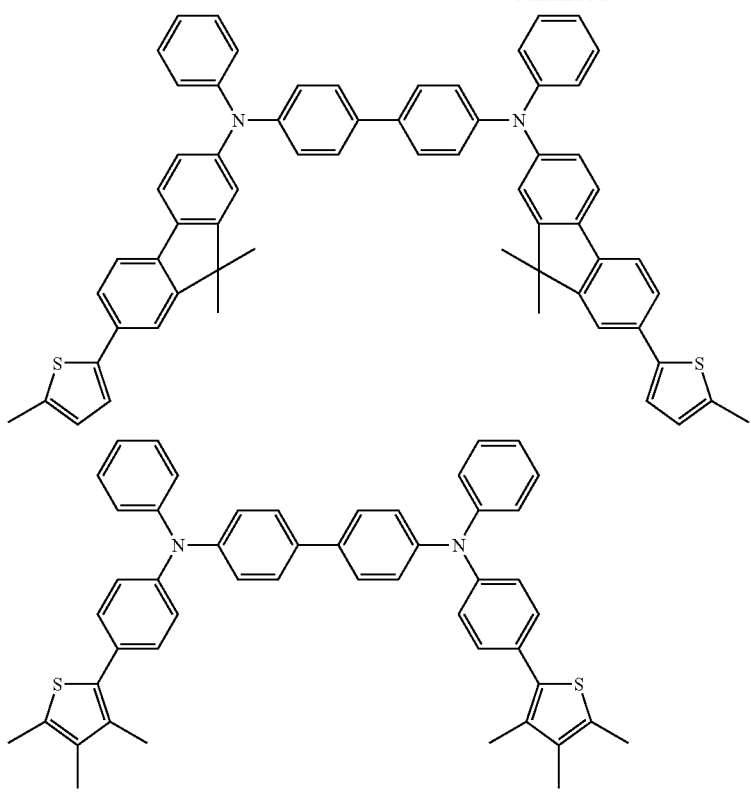
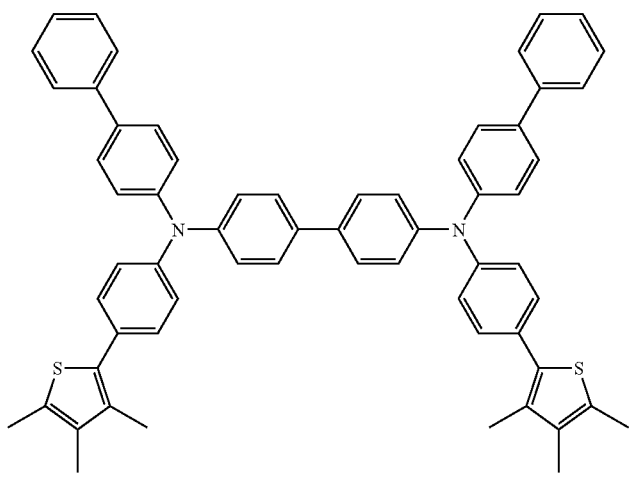
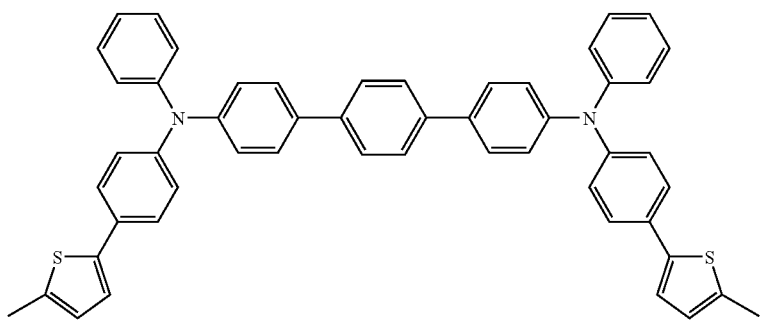

-continued
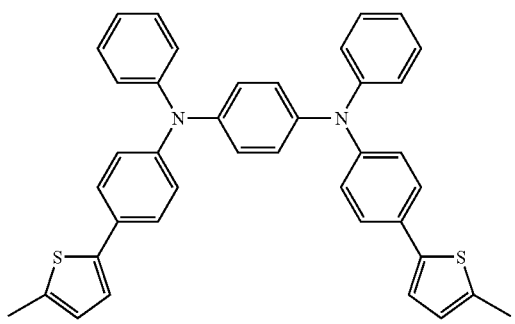
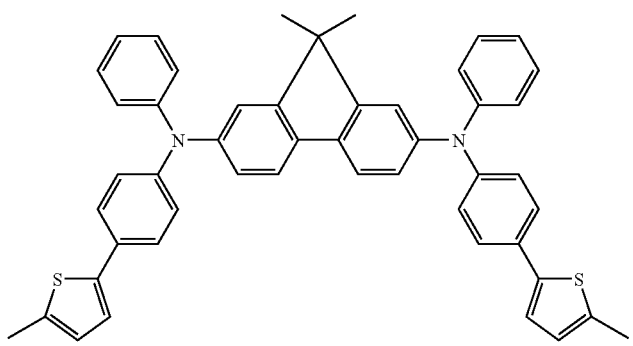
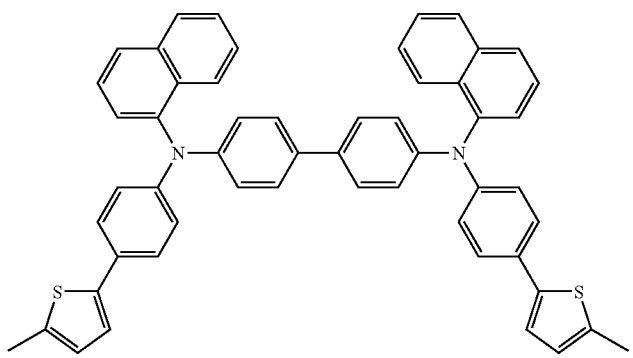
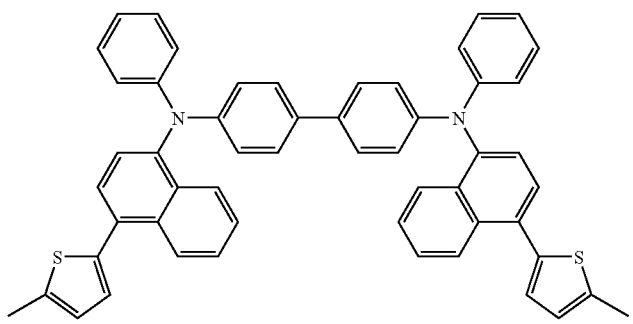

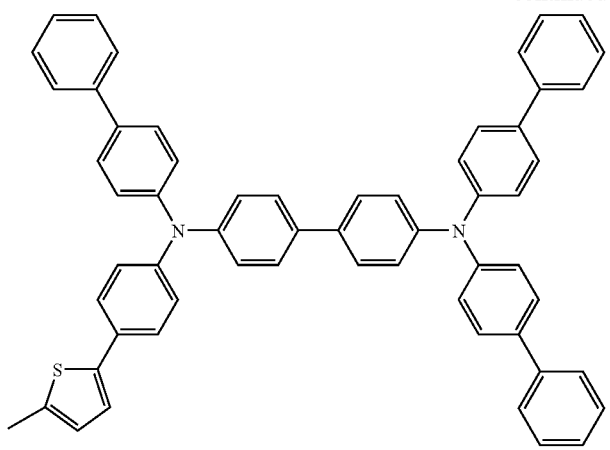
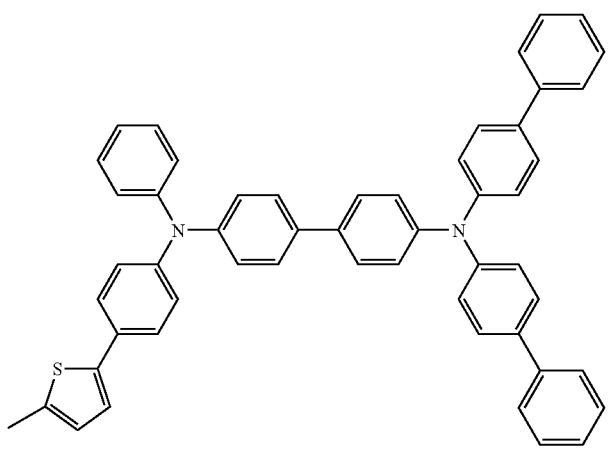
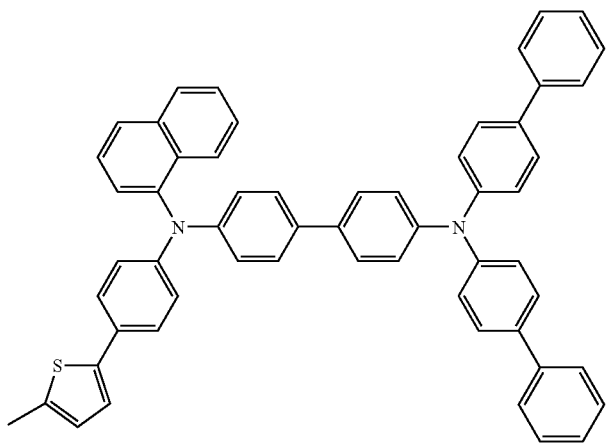

-continued
[Chem 10]
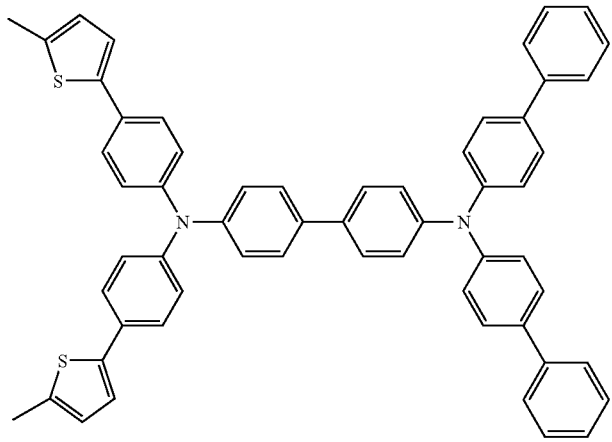
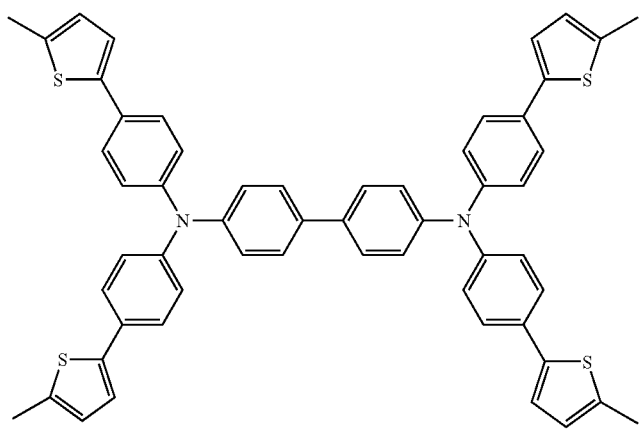
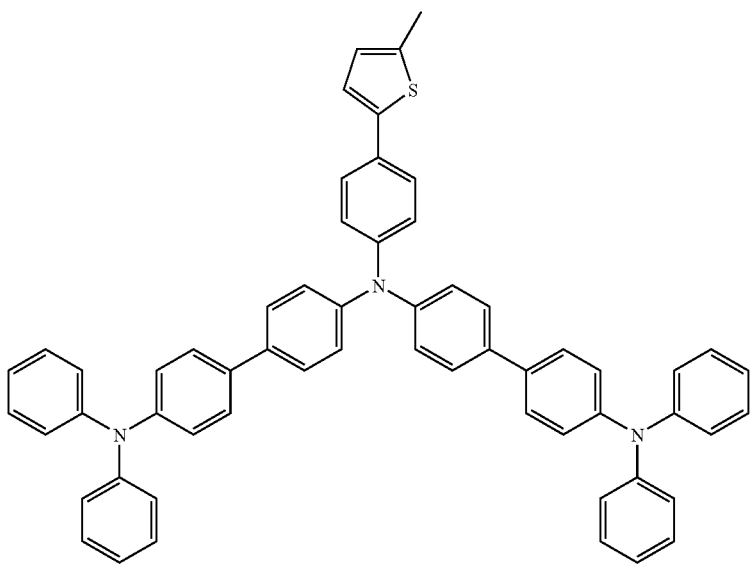

-continued
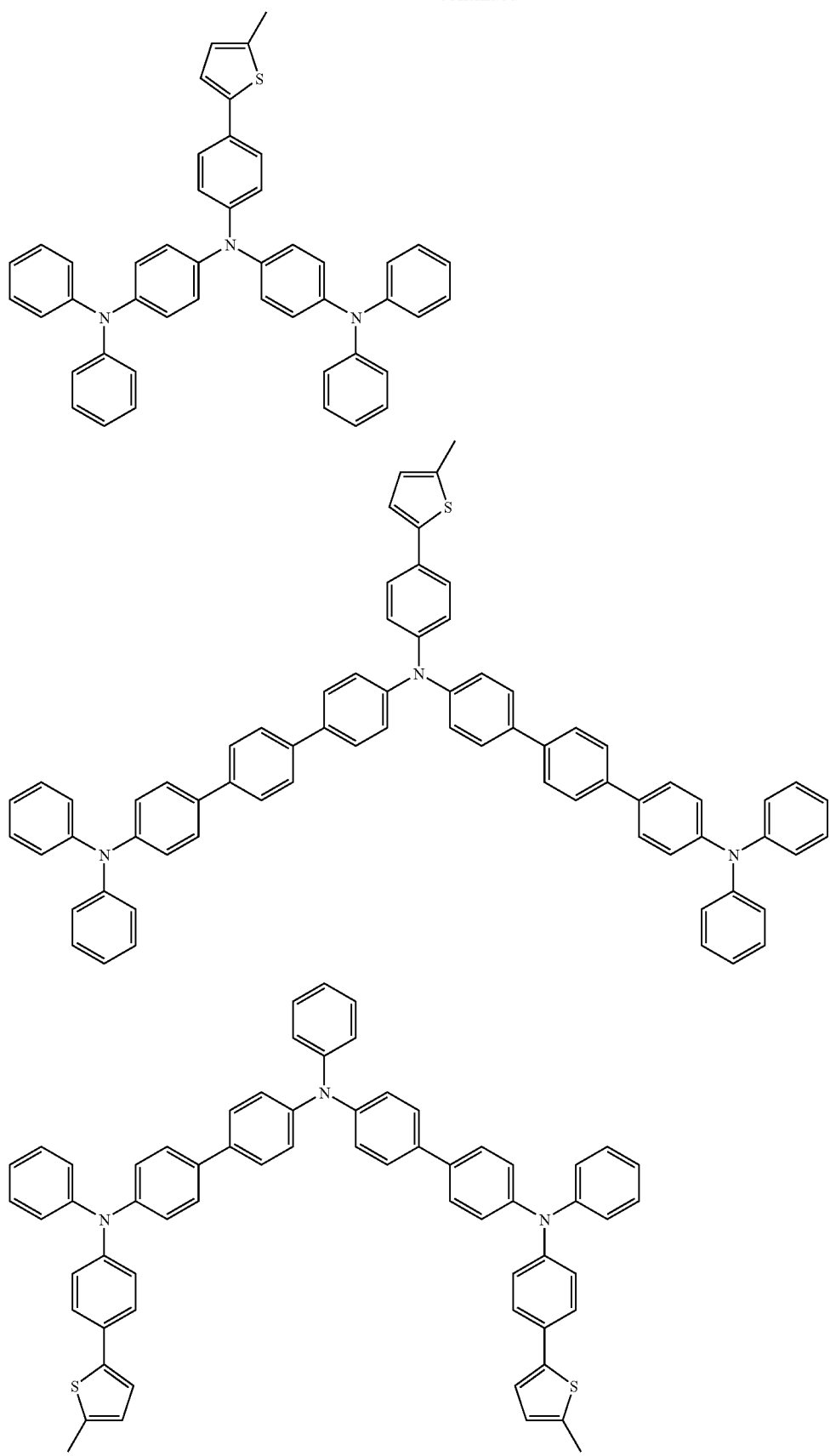

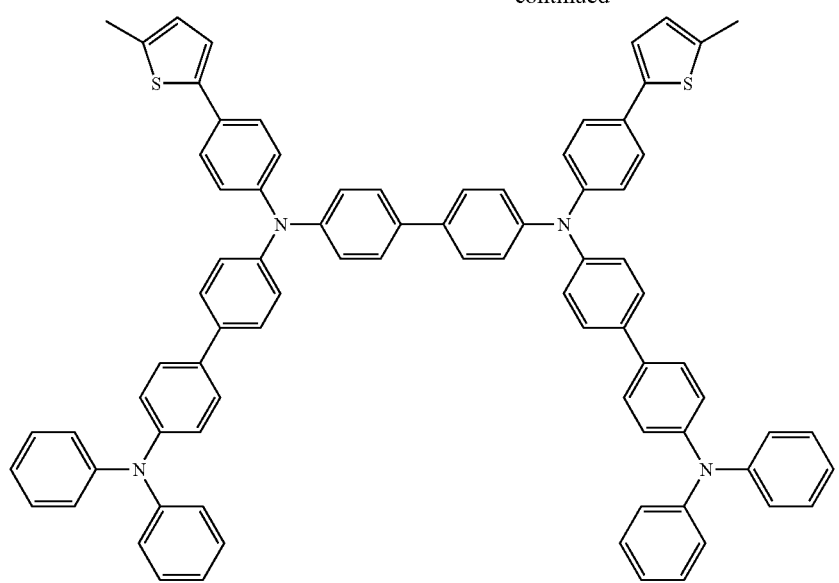
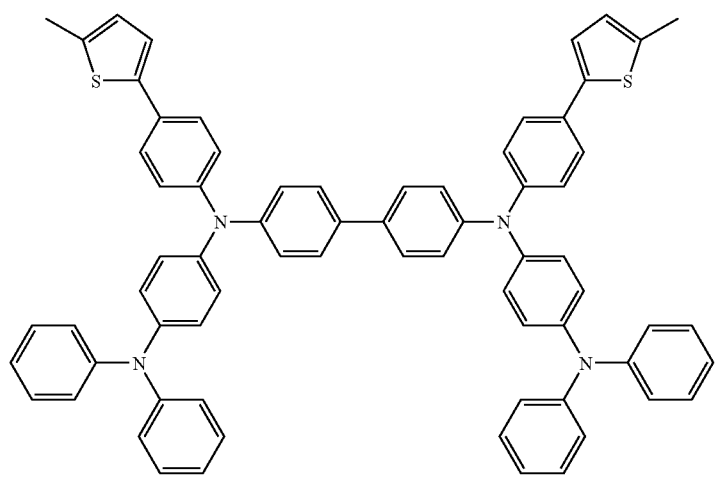
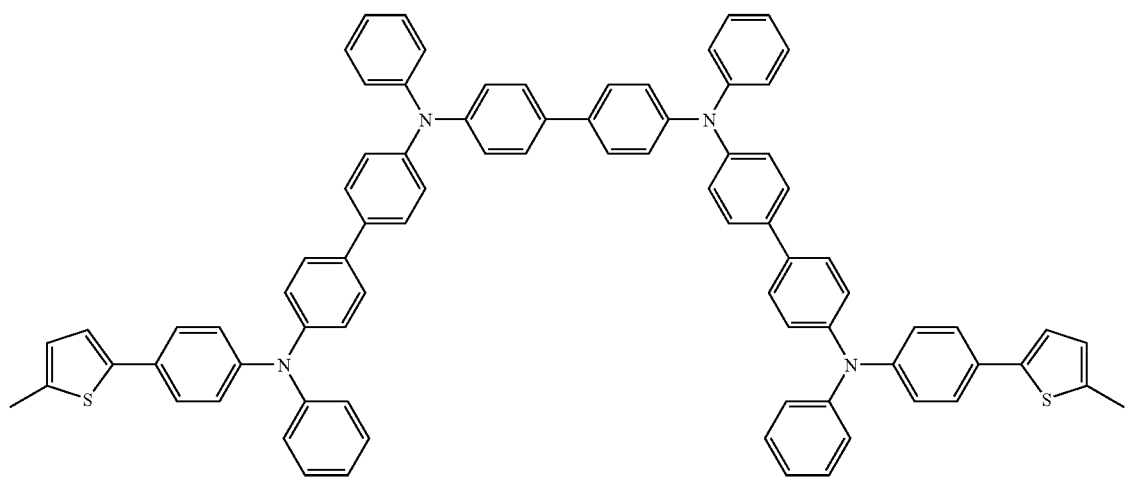

-continued
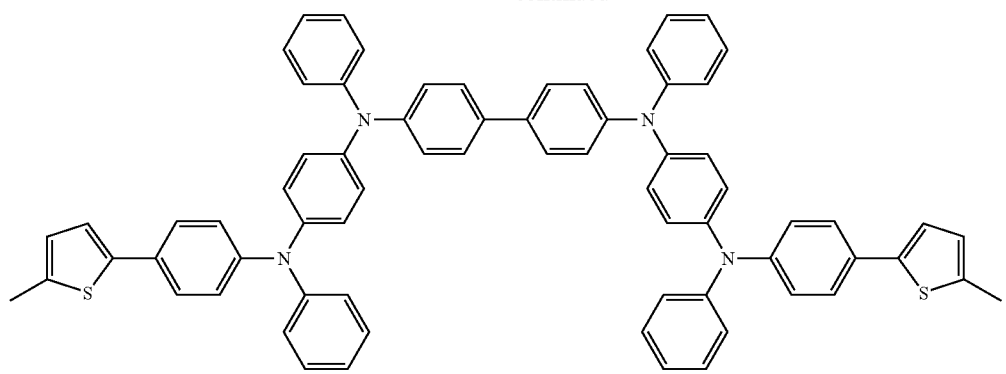
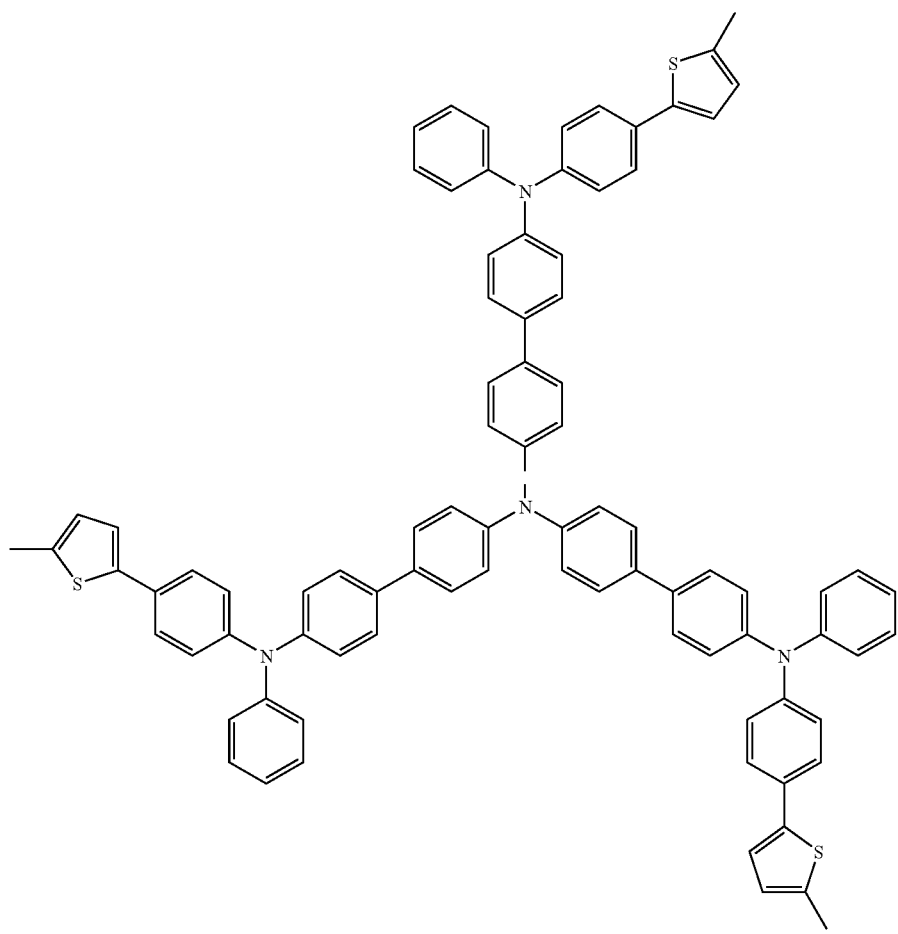

-continued
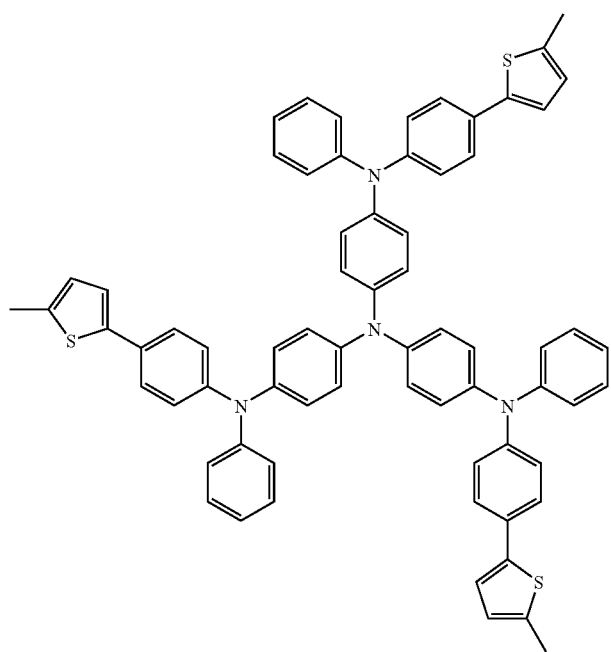
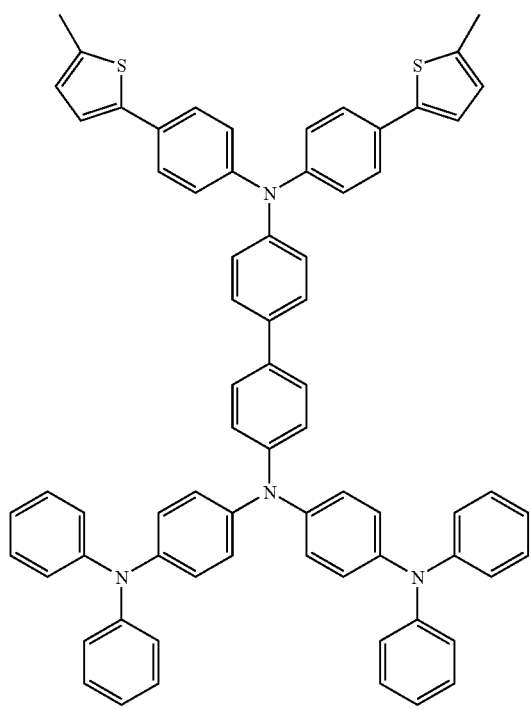

-continued

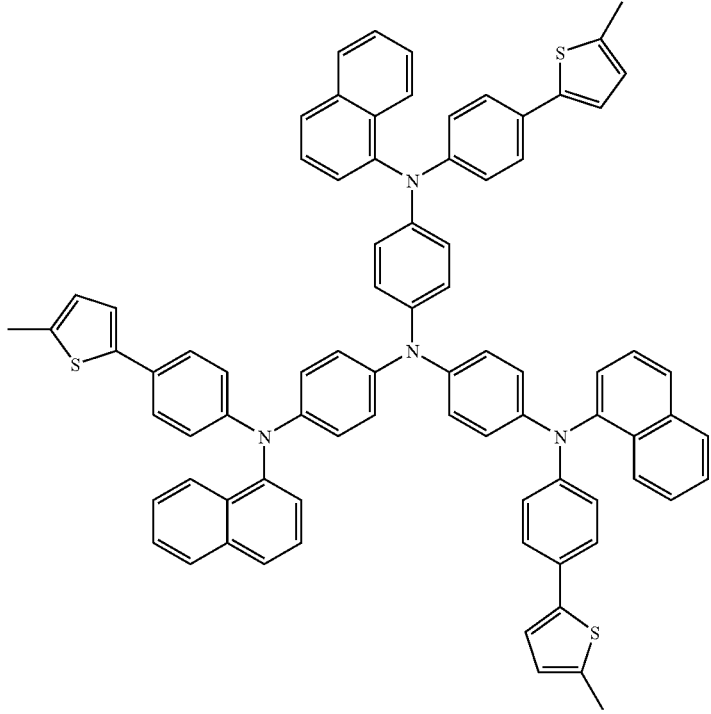 [SMILES: Cc1ccc(-c2ccc(N(c3ccc(N(c4ccc(N(c5ccc(-c6ccc(C)s6)cc5)c5cccc6ccccc56)cc4)c4ccc(N(c5ccc(-c6ccc(C)s6)cc5)c5cccc6ccccc56)cc4)cc3)c3cccc4ccccc34)cc2)s1]

(Aromatic Amine Derivative Y having Specific Substituent)

The specific substituent of the aromatic amine derivative Y is represented by the following formula (2).

[Chem 11]

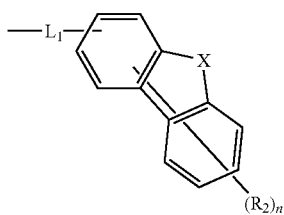

Formula (2)

In the above formula, X represents $NR_1$, $L_1$ represents a substituted or unsubstituted arylene group having 6 to 60 atoms forming a ring, a substituted or unsubstituted fluorenylene group, or a substituted or unsubstituted heteroarylene group having 5 to atoms forming a ring, and $R_1$ represents a substituted or unsubstituted aryl group having 5 to 14 atoms forming a ring, or a branched or linear, substituted or unsubstituted alkyl group having 1 to 6 carbon atoms.

In particular, the aryl group is preferably an aryl group having 6 to 10 atoms forming a ring, or more preferably a phenyl group. Further, the branched or linear alkyl group is preferably a group having 1 to 3 carbon atoms, or more preferably a methyl group.

$R_2$ represents a hydrogen atom, a substituted or unsubstituted aryl group having 5 to 14 atoms forming a ring, a substituted or unsubstituted aryloxy group having 5 to 14 atoms forming a ring, a substituted or unsubstituted arylthio group having 5 to 14 atoms forming a ring, a branched or linear, substituted or unsubstituted alkyl group having 1 to 6 carbon atoms, or a branched or linear, substituted or unsubstituted alkoxycarbonyl group having 1 to 6 carbon atoms, or particularly preferably represents an aryl group having 5 to 14 atoms forming a ring, or a branched or linear alkyl group having 1 to 6 carbon atoms.

In particular, the aryl group is preferably an aryl group having 6 to 10 atoms forming a ring, or more preferably a phenyl group. Further, the branched or linear alkyl group is preferably a group having 1 to 3 carbon atoms, or more preferably a methyl group.

In addition, n represents an integer of 1 to 7, or preferably represents 1 or 2. It should be noted that, when n represents 2 or more, multiple $R_2$'s may be identical to or different from each other.

Examples of the substituents of each group represented by $R_1$ and $R_2$ include: an alkyl group (having preferably 1 to 20 carbon atoms, more preferably 1 to 12 carbon atoms, and particularly preferably 1 to 8 carbon atoms; examples thereof include a methyl group, an ethyl group, an isopropyl group, a tert-butyl group, an n-octyl group, an n-decyl group, an n-hexadecyl group, a cyclopropyl group, a cyclopentyl group, and a cyclohexyl group); an alkenyl group (having preferably 2 to 20 carbon atoms, more preferably 2 to 12 carbon atoms, and particularly preferably 2 to 8 carbon atoms; examples thereof include a vinyl group, allyl group, a 2-butenyl group, and a 3-pentenyl group); an alkynyl group (having preferably 2 to 20 carbon atoms, more preferably 2 to 12 carbon atoms, and particularly preferably 2 to 8 carbon atoms; and examples thereof include a propargyl group and a 3-pentynyl group); an amino group (having preferably 0 to 20 carbon atoms, more preferably 0 to 12 carbon atoms, and particularly preferably 0 to 6 carbon atoms; and examples thereof include an amino group, a methylamino group, a dimethylamino group, a diethylamino group, a diphenylamino group, and a dibenzylamino group); an alkoxy group (having preferably 1 to 20 carbon atoms, more preferably 1 to 12 carbon atoms, and particularly preferably 1 to 8 carbon atoms; examples thereof include a methoxy group, an ethoxy group, and a buthoxy group); an aryloxy group (having preferably 6 to 20 carbon atoms, more preferably 6 to 16 carbon atoms, and particularly preferably 5 to 12 carbon atoms; examples thereof include a phenyloxy group and a 2-naphthyloxy group); an acyl group (having preferably 1 to 20 carbon atoms, more preferably 1 to 16 carbon atoms, and particularly preferably 1 to 12 carbon atoms; examples thereof include an acetyl group, a benzoyl group, a formyl group, and a pivaloyl group);

an alkoxycarbonyl group (having preferably 2 to 20 carbon atoms, more preferably 2 to 16 carbon atoms, and particularly preferably 2 to 12 carbon atoms; examples thereof include a methoxycarbonyl group and an ethoxycarbonyl group); an aryloxycarbonyl group (having preferably 7 to 20 carbon atoms, more preferably 7 to 16 carbon atoms, and particularly preferably 7 to 10 carbon atoms; examples thereof include a phenyloxycarbonyl group); an acyloxy group (having preferably 2 to 20 carbon atoms, more preferably 2 to 16 carbon atoms, and particularly preferably 2 to 10 carbon atoms; examples thereof include an acetoxy group and a benzoyloxy group); an acylamino group (having preferably 2 to 20 carbon atoms, more preferably 2 to 16 carbon atoms, and particularly preferably 2 to 10 carbon atoms; examples thereof include an acetylamino group and a benzoylamino group); an alkoxycarbonylamino group (having preferably 2 to 20 carbon atoms, more preferably 2 to 16 carbon atoms, and particularly preferably 2 to 12 carbon atoms; examples thereof include a methoxycarbonylamino group); an aryloxycarbonylamino group (having preferably 7 to 20 carbon atoms, more preferably 7 to 16 carbon atoms, and particularly preferably 7 to 12 carbon atoms; examples thereof include a phenyloxycarbonylamino group); a sulfonylamino group (having preferably 1 to 20 carbon atoms, more preferably 1 to 16 carbon atoms, and particularly preferably 1 to 12 carbon atoms; examples thereof include a methanesulfonylamino group and a benzenesulfonylamino group); a sulfamoyl group (having preferably 0 to 20 carbon atoms, more preferably 0 to 16 carbon atoms, and particularly preferably 0 to 12 carbon atoms; examples thereof include a sulfamoyl group, a methylsulfamoyl group, a dimethylsulfamoyl group, and a phenylsulfamoyl group);

a carbamoyl group (having preferably 1 to 20 carbon atoms, more preferably 1 to 16 carbon atoms, and particularly preferably 1 to 12 carbon atoms; examples thereof include a carbamoyl group, a methylcarbamoyl group, a diethylcarbamoyl group, and a phenylcarbamoyl group); an alkylthio group (having preferably 1 to 20 carbon atoms, more preferably 1 to 16 carbon atoms, and particularly preferably 1 to 12 carbon atoms; examples thereof include a methylthio group and an ethylthio group); an arylthio group (having preferably 5 to 20 carbon atoms, more preferably 5 to 16 carbon atoms, and particularly preferably 5 to 12 carbon atoms; examples thereof include a phenylthio group); a sulfonyl group (having preferably 1 to 20 carbon atoms, more preferably 1 to 16 carbon atoms, and particularly preferably 1 to 12 carbon atoms; examples thereof include a mesyl group and a tosyl group); a sulfinyl group (having preferably 1 to 20 carbon atoms, more preferably 1 to 16 carbon atoms, and particularly preferably 1 to 12 carbon atoms; examples thereof include a methanesulfinyl group and a benzenesulfinyl group); a ureide group (having preferably 1 to 20 carbon atoms, more preferably 1 to 16 carbon atoms, and particularly preferably 1 to 12 carbon atoms; examples thereof include a ureide group, a methylureide group, and a phenylureide group); a phosphoric amide group (having preferably 1 to 20 carbon atoms, more preferably 1 to 16 carbon atoms, and particularly preferably 1 to 12 carbon atoms; examples thereof include a diethylphosphoric amide group and a phenylphosphoric amide group);

a hydroxy group; a mercapto group; halogen atoms (such as a fluorine atom, a chlorine atom, a bromine atom, and an iodine atom); a cyano group; a sulfo group; a carboxyl group; a nitro group; a hydroxamic acid group; a sulfino group; a hydrazino group; an imino group; a heterocyclic group (having preferably 1 to 30 carbon atoms and more preferably 1 to 12 carbon atoms; examples of heteroatoms include those which contain, for example, a nitrogen atom, an oxygen atom, and a sulfur atom, and specific examples thereof include an imidazolyl group, a pyridyl group, a quinolyl group, a furyl group, a thienyl group, a piperidyl group, a morpholino group, a benzoxazolyl group, a benzoimidazolyl group, a benzothiazolyl group, and carbazolyl group); and a silyl group (having preferably 3 to 40 carbon atoms, more preferably 3 to 30 carbon atoms, and particularly preferably 3 to 24 carbon atoms; examples thereof include a trimethylsilyl group and a triphenylsilyl group). Those substituents may be further substituted. In addition, when two or more substituents are present, they may be identical to or different from each other. Further, those substituents may possibly combine with each other to form a ring.

The aromatic amine derivative according to the present invention incorporated into the hole transporting layer or the hole injecting/transporting layer is preferably represented by any one of the following formulae (3) and (15) to (18).

[Chem 12]

(3)

(15)

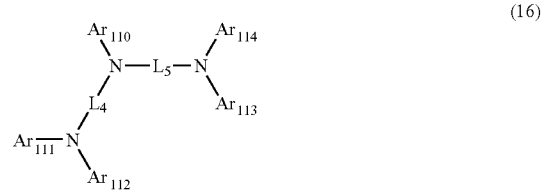

(16)

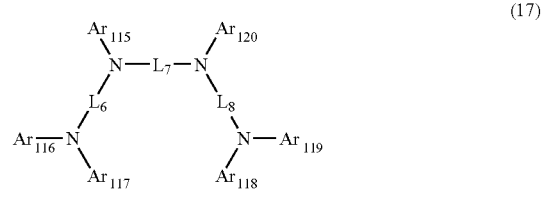

(17)

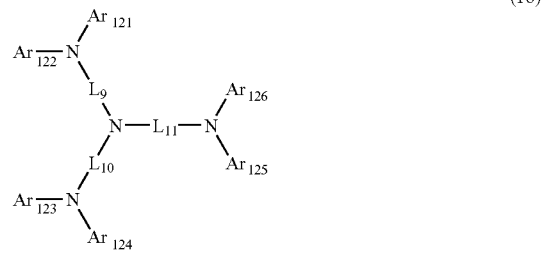

(18)

where at least one of $Ar_{101}$ to $Ar_{103}$ represents the substituent represented by the formula (2), at least one of $Ar_{106}$ to $Ar_{109}$ represents the substituent represented by the formula (2), at least one of $Ar_{110}$ to $Ar_{114}$ represents the substituent represented by the formula (2), at least one of $Ar_{115}$ to $Ar_{120}$ represents the substituent represented by the formula (2), at least one of $Ar_{121}$ to $Ar_{126}$ represents the substituent represented by the formula (2) groups represented by $Ar_{101}$ to $Ar_{103}$ and $Ar_{106}$ to $Ar_{124}$ except the substituent represented by the formula (2) each independently represent a substituted or unsubstituted aryl group having 6 to 50 atoms forming a ring, or a substituted or unsubstituted heteroaryl group having 5 to 60 atoms forming a ring, and, when a group represented by any one of $Ar_{101}$ to $Ar_{103}$ and $Ar_{106}$ to $Ar_{124}$ has a substituent, the substituent includes an aryl group having 6 to 50 atoms forming a ring, or a branched or linear alkyl group having 1 to 50 carbon atoms.

Examples of the substituted or unsubstituted aryl group represented by $Ar_{101}$ to $Ar_{103}$ and $Ar_{106}$ to $Ar_{126}$ in the formulae (3) and (15) to (18) and $R_1$ and $R_2$ in the formula (2) include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p—terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a fluoranthenyl group, and a fluorenyl group. Note that in the case of formula (2), as described above, groups are chosen from those having 5 to 14 atoms forming a ring.

Of those, a phenyl group, a naphthyl group, a biphenylyl group, a terphenylyl group, and a fluorenyl group are preferable.

A thiophene compound has high reactivity at 2- and 5-positions thereof; thus, it is preferable to protect those substitution positions. As a reference document, "Macromol. Rapid Commun., 2001, 22, 266-270" is given, and reports that the polymerization proceeds under electrically unstable conditions. An alkyl group or an aryl group is preferable as a substituent, and from a viewpoint of the stability of the compound, an aryl group is preferable and an unsubstituted aryl group is more preferable.

In addition, examples of the substituted or unsubstituted heteroaryl group include heteroaryl groups listed in the following description of a linker portion.

Examples of the substituted or unsubstituted arylene group having 5 to 50 atoms forming a ring represented by any one of $L_3$ to $L_{11}$ in the formulae (15) to (18) and $L_1$ in the formulae (2) include groups obtained by making the examples of the aryl group divalent.

Examples of the substituted or unsubstituted alkyl group represented by $R_1$ and $R_2$ in the formula (2) include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a trifluoromethyl group, a cyclopropyl group, a cyclobutyl group, a cyclopentyl group, a cyclohexyl group, and a 4-methylcyclohexyl group. The group is preferably a saturated, chain, branched, or cyclic alkyl group formed of a hydrocarbon, and specific examples of such a group include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a cyclopropyl group, a cyclobutyl group, a cyclopentyl group, a cyclohexyl group, and a 4-methylcyclohexyl group.

Example of the above aryloxy group include a phenyloxy group, a 1-naphthyloxy group, a 2-naphthyloxy group, a 4-biphenylyloxy group, a p-terphenyl-4-yloxy group, and a p-tolyloxy group. Preferred are a phenyloxy group and a 2-naphthyloxy group.

Example of the above arylthio group include a phenylthio group, a 1-naphthylthio group, a 2-naphthylthio group, a 4-biphenylylthio group, a p-terphenyl-4-ylthio group, and a p-tolylthio group. Preferred are a phenylthio group and a 2-naphthylthio group.

Example of the above alkoxycarbonyl group include a methoxycarbonyl group, an ethoxycarbonyl group, an n-propoxycarbonyl group, an iso-propoxycarbonyl group, an n-butoxycarbonyl group, and a tert-butoxycarbonyl group. Preferred are a methoxycarbonyl group and an ethoxycarbonyl group.

Each of those groups may be further substituted, and when the group is substituted with two or more groups, the groups may be identical to or different from each other, or if possible, the groups may be linked to each other to form a ring.

In addition, linker portions in the above formulae ($L^1$ to $L^{11}$ in the formulae (1), (2), and (15) to (18)) are each preferably a substituted or unsubstituted arylene group having 6 to 60 atoms forming a ring, a substituted or unsubstituted fluorenylene group, or a substituted or unsubstituted heteroarylene group having 5 to 60 atoms forming a ring.

Examples of an arylene group and a heteroarylene group for $L_1$ to $L_{11}$ include those in which the following groups are each made into a divalent group: a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl) phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a fluoranthenyl group, a fluorenyl group, a 1-pyrrolyl group, a 2-pyrrolyl group, a 3-pyrrolyl group, a pyradinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenadinyl group, a 2-phenadinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

As an arylene group for $L_1$, preferably exemplified are a phenylene group, a biphenylene group, a terphenylene group, a quaterphenylene group, a naphthylene group, an anthracenylene group, a phenanthrylene group, a crycenylene group, a pyrenylene group, a perylenylene group, and a fluorenylene group. More preferred are a phenylene group, a biphenylene group, a terphenylene group, a fluorenylene group, a naphthylene group, and a phenanthrylene group. Still more preferred is a phenylene group, a biphenylene group, a terphenylene group, a naphthylene group, a phenanthrylene group, or a fluorenylene group.

As a heteroarylene group, preferred are those in which the following groups are each made into a divalent group: a thiophenylyl group, a 1-phenylthiophenylyl group, a 1,4-diphenylthiophenylyl group, a benzothiophenylyl group, a 1-phenylbenzothiophenylyl group, a 1,8-diphenylbenzothiophenylyl group, a furyl group, a 1-phenyldibenzothiophenylyl group, a 1,8-diphenylthiophenylyl group, a furyl group, a dibenzofuranyl group, a 1-phenyldibenzofuranyl group, a 1,8-diphenyldibenzofuranyl group, and a benzothiazolyl group. More preferred are those in which the following groups are each made into a divalent group: a 1-phenylthiophenylyl group, a 1-phenylbenzothiophenylyl group, a 1-phenyldibenzofuranyl group, and a benzothiazolyl group.

The linker portions are more preferably represented by the following formulae (A) to (C), or still more preferably represented by the following formula (A) or (B).

[Chem 13]

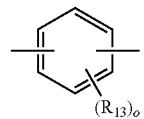

(A)

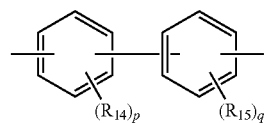

(B)

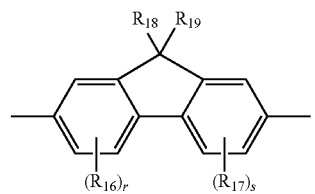

(C)

In the above formulae:

$R_{13}$ to $R_{17}$ each independently represent a linear or branched alkyl group formed of a hydrocarbon having 1 to 10 carbon atoms, a cycloalkyl group having 3 to 10 atoms forming a ring, a trialkylsilyl group having 3 to 10 carbon atoms, a triarylsilyl group having 18 to 30 atoms forming a ring, an alkylarylsilyl group having 8 to 15 atoms forming a ring (the aryl portion of which has 6 to 14 atoms forming a ring), an aryl group having 6 to 14 atoms forming a ring, a halogen atom, or a cyano group, $R_{18}$ and $R_{19}$ each independently represent a linear or branched alkyl group formed of a hydrocarbon having 1 to 10 carbon atoms, or a cycloalkyl group having 3 to 10 atoms forming a ring, and multiple $R_{13}$'s, $R_{14}$'s, $R_{15}$'s, $R_{16}$'s, or $R_{17}$'s adjacent to each other may be bonded to form a saturated or unsaturated ring; and o, p, and q each independently represent an integer of 0 to 4, and r and s each independently represent an integer of 0 to 3.)

The aromatic amine derivative (Y) is preferably a derivative having at least one substituent represented by the formula (2) or more preferably a derivative represented by any one of the formulae (3) and (15) to (18) or still more preferably a derivative represented by the formula (3). The derivative is particularly preferably an aromatic amine derivative represented by the following formula (21).

[Chem 14]

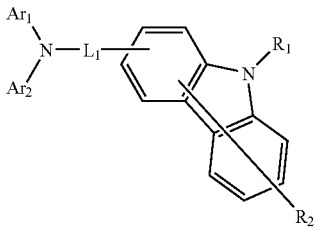

(21)

In the above formula (21), $Ar_1$ has the same meaning as that of $Ar_1$ in the formula (3), $Ar_2$ has the same meaning as that of $Ar_2$ in the formula (3), $L_1$ has the same meaning as that of $L_1$ in the formula (2), $R_1$ has the same meaning as that of $R_1$ in the formula (2), and $R_2$ has the same meaning as that of $R_2$ in the formula (2).

The aromatic amine derivative (Y) represented by the formula (21) is preferably of a structure represented by any one of the following formulae (21-a), (21-b), (21-c), (21-d), (21-e), and (21-f).

[Chem 15]

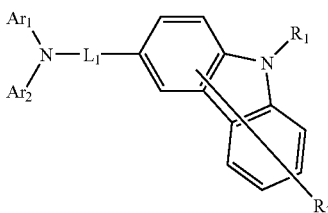

(21-a)

In the formula (21-a):

$L_1$, $Ar_1$, $Ar_2$, $R_1$, and $R_2$ each have the same meaning as that of the corresponding one in the formula (21), specific examples of each of them include the same examples as those described above, preferable examples of each of them include the same examples as those described above, and substituents for them are the same as those described above;

$Ar_1$ and $Ar_2$ may be identical to or different from one another.

[Chem 16]

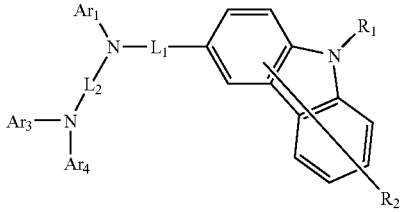

(21-b)

In the formula (21-b):

$L_1$, $Ar_1$, $R_1$, and $R_2$ each have the same meaning as that of the corresponding one in the formula (21), specific examples of each of them include the same examples as those described above, preferable examples of each of them include the same examples as those described above, and substituents for them are the same as those described above;

$L_2$ represents a substituted or unsubstituted arylene group having 6 to 60 atoms forming a ring, or a substituted or unsubstituted heteroarylene group having 5 to 60 atoms forming a ring, specific examples of $L_2$ include the same examples as those of $L_1$ described above, preferable examples of $L_2$ include the same examples as those of $L_1$ described above, and substituents for $L_2$ are the same as those for $L_1$ described above;

$Ar_3$ and $Ar_4$ each independently represent a substituted or unsubstituted aryl group having 6 to 60 atoms forming a ring, or a substituted or unsubstituted fluorenyl group, specific examples of the aryl group include the same examples as those of $Ar_1$ described above, preferable examples of the aryl group include the same examples as those of $Ar_1$ described above, and substituents for the aryl group are the same as those for $Ar_1$ described above, provided that none of $Ar_3$ and $Ar_4$ includes a fluorene structure; and $Ar_1$, $Ar_3$, and $Ar_4$ may be identical to or different from one another.

[Chem 17]

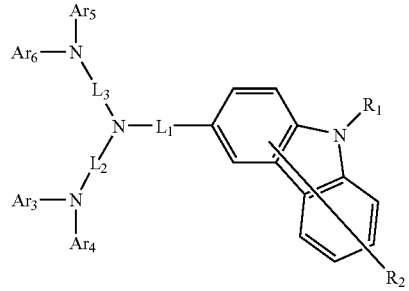

(21-c)

In the formula (21-c):

$L_1$, $R_1$, and $R_2$ each have the same meaning as that of the corresponding one in the formula (21), specific examples of each of them include the same examples as those described above, preferable examples of each of them include the same examples as those described above, and substituents for them are the same as those described above;

$L_2$ and $L_3$ each represent a substituted or unsubstituted arylene group having 6 to 60 atoms forming a ring, or a substituted or unsubstituted heteroarylene group having 5 to 60 atoms forming a ring, specific examples of $L_2$ and $L_3$ include the same examples as those of $L_1$ described above, preferable examples of $L_2$ and $L_3$ include the same examples as those of $L_1$ described above, and substituents for $L_2$ and $L_3$ are the same as those for $L_1$ described above;

$Ar_3$ to $Ar_6$ each independently represent a substituted or unsubstituted aryl group having 6 to 60 atoms forming a ring, and specific examples of the aryl group include the same examples as those of $Ar_1$ described above, preferable examples of the aryl group include the same examples as those of $Ar_1$ described above, and substituents for the aryl group are the same as those for $Ar_1$ described above, provided that none of $Ar_3$ to $Ar_6$ includes a fluorene structure; and $Ar_3$ to $Ar_6$ may be identical to or different from one another.

[Chem 18]

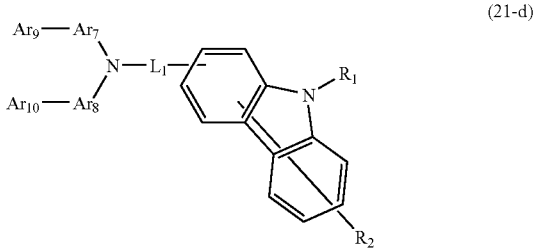

(21-d)

In the formula (21-d):

$L_1$, $R_1$, and $R_2$ each have the same meaning as that of the corresponding one in the above-mentioned formula (21), specific examples of each of them include the same examples as those described above, preferable examples of each of them include the same examples as those described above, and substituents for them are the same as those described above;

$Ar_7$ and $Ar_8$ each independently represent a substituted or unsubstituted arylene group having 6 to 60 atoms forming a ring, or a substituted or unsubstituted heteroarylene group having 5 to 60 atoms forming a ring, specific examples of each of them include groups obtained by making the same examples as those of $Ar_1$ described above divalent, preferable examples of each of them include groups obtained by making the same examples as those of $Ar_1$ described above divalent, and substituents for them are the same as those described above;

$Ar_9$ and $Ar_{10}$ each independently represent a substituted or unsubstituted aryl group having 6 to 60 atoms forming a ring, or a substituted or unsubstituted heteroaryl group having 5 to 60 atoms forming a ring, specific examples of each of them include the same examples as those of $Ar_1$ described above, preferable examples of each of them include the same examples as those of $Ar_1$ described above, and substituents for them are the same as those for $Ar_1$ described above, provided that none of $Ar_7$ and $Ar_{10}$ includes a fluorene structure; and $Ar_7$ to $Ar_{10}$ may be identical to or different from one another.

[Chem 19]

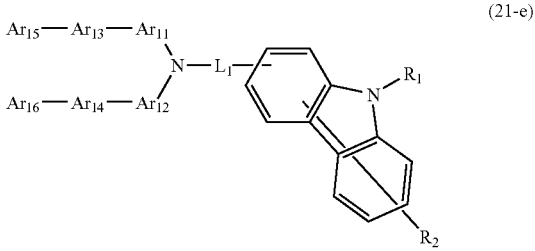

(21-e)

In the formula (21-e):

$L_1$, $R_1$, and $R_2$ each have the same meaning as that of the corresponding one in the formula (21), specific examples of each of them include the same examples as those described above, preferable examples of each of them include the same examples as those described above, and substituents for them are the same as those described above;

$Ar_{11}$ to $Ar_{14}$ each independently represent a substituted or unsubstituted arylene group having 6 to 60 atoms forming a ring, or a substituted or unsubstituted heteroarylene group having 5 to 60 atoms forming a ring, specific examples of each of them include groups obtained by making the same examples as those of $Ar_1$ described above divalent, preferable examples of each of them include groups obtained by making the same examples as those of $Ar_1$ described above divalent, and substituents for them are the same as those described above;

$Ar_{15}$ and $Ar_{16}$ each independently represent a substituted or unsubstituted aryl group having 6 to 60 atoms forming a ring, or a substituted or unsubstituted heteroaryl group having 5 to 60 atoms forming a ring, specific examples of each of them include the same examples as those of $Ar_1$ described above, preferable examples of each of them include the same examples as those of $Ar_1$ described above, and substituents for them are the same as those for $Ar_1$ described above, provided that none of $Ar_{11}$ to $Ar_{16}$ includes a fluorene structure; and $Ar_{11}$ to $Ar_{16}$ may be identical to or different from one another.

[Chem 20]

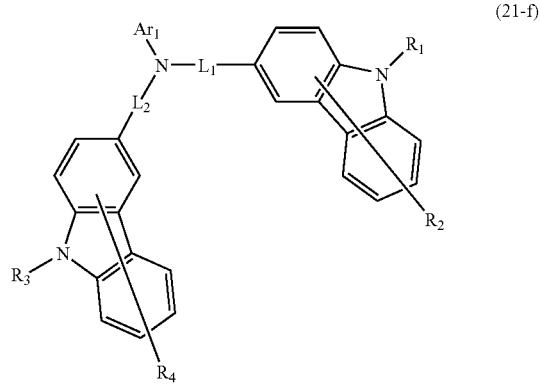

(21-f)

In the formula (21-f):

$L_1$, $Ar_1$, $R_1$, and $R_2$ each have the same meaning as that of the corresponding one in the formula (21);

$L_2$ represents a substituted or unsubstituted arylene group having 6 to 60 atoms forming a ring, or a substituted or unsubstituted heteroarylene group having 5 to 60 atoms forming a ring;

$R_3$ has the same meaning as that of $R_1$, specific examples of $R_3$ include the same examples as those of $R_1$ described above, preferable examples of $R_3$ include the same examples as those of $R_1$ described above, and substituents for $R_3$ are the same as those for $R_1$ described above; and $R_4$ has the same meaning as that of $R_2$, specific examples of $R_4$ include the same examples as those of $R_2$ described above, preferable examples of $R_4$ include the same examples as those of $R_2$ described above, and substituents for $R_4$ are the same as those for $R_2$ described above.

The aromatic amine derivative represented by the formula (21), (21-a), (21-b) (21-c), (21-d), (21-e), or (21-f) preferably has one carbazole structure or two carbazole structures.

In addition, it is preferred that, in the formulae (21), (21-a), (21-b), (21-c), (21-d), (21-e), and (21-f), $Ar_1$ to $Ar_6$, $Ar_9$ and $Ar_{10}$, and $Ar_{15}$ and $Ar_{16}$ each represent a substituted or unsubstituted phenyl group, a biphenylyl group, a terphenylyl group, an α-naphthyl group, a β-naphthyl group, or a phenanthryl group, and Ar$_7$ and Ar$_8$, and Ar$_{11}$ to Ar$_{14}$ each represent a substituted or unsubstituted phenylene group, a biphenylylene group, a terphenylylene group, a naphthylene group, or a phenanthrylene group.

Specific examples of the aromatic amine derivative (Y) represented by the formula (21) according to the present invention are shown below. However, the derivative is not limited to these exemplified compounds.

[Chem 21]

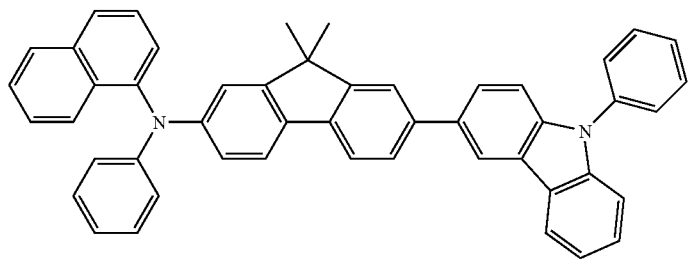

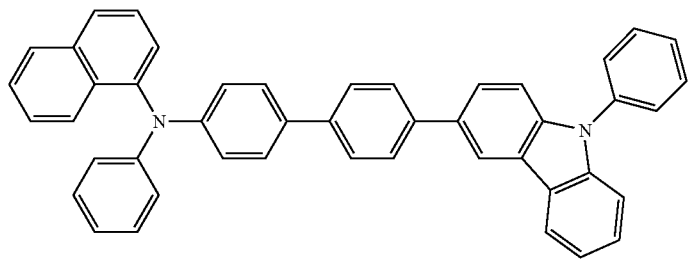

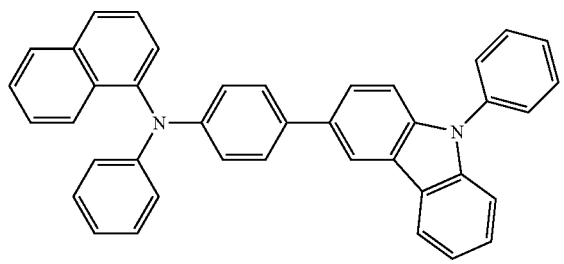

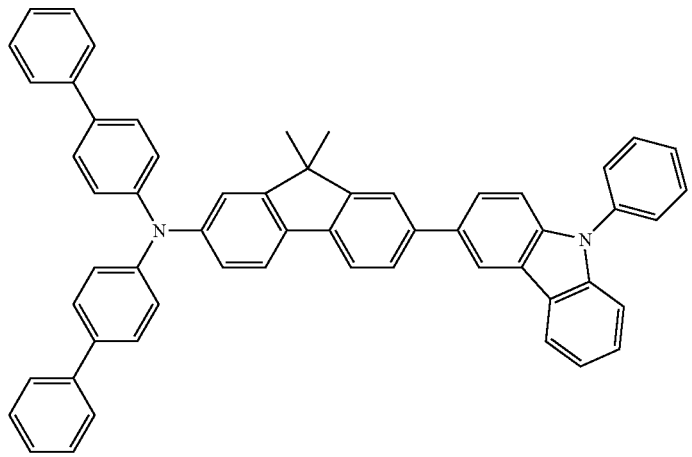

-continued
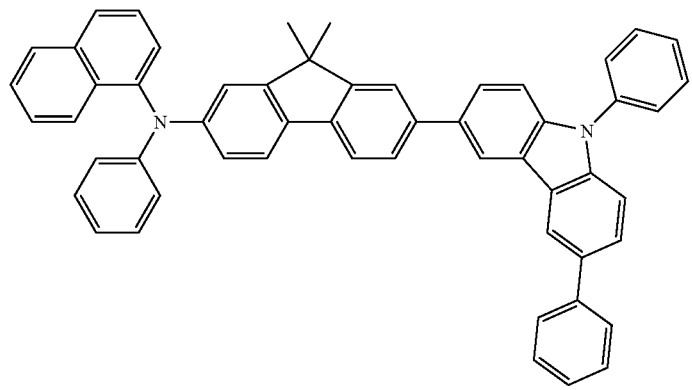
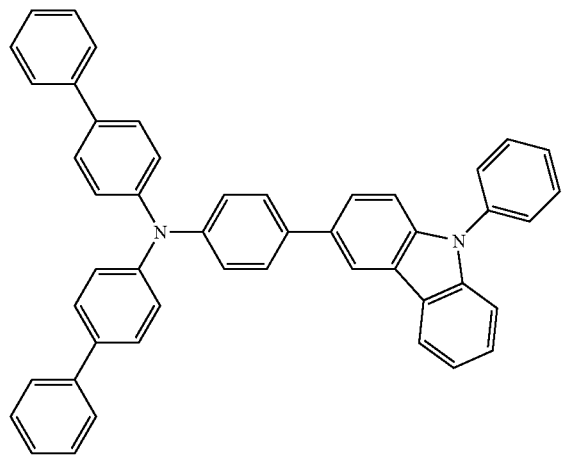
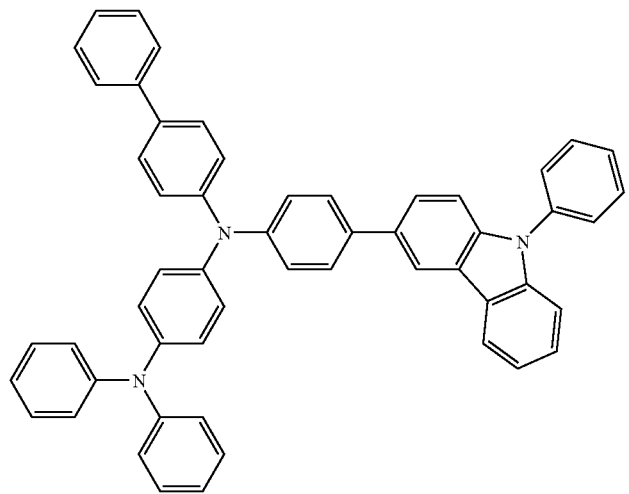

-continued
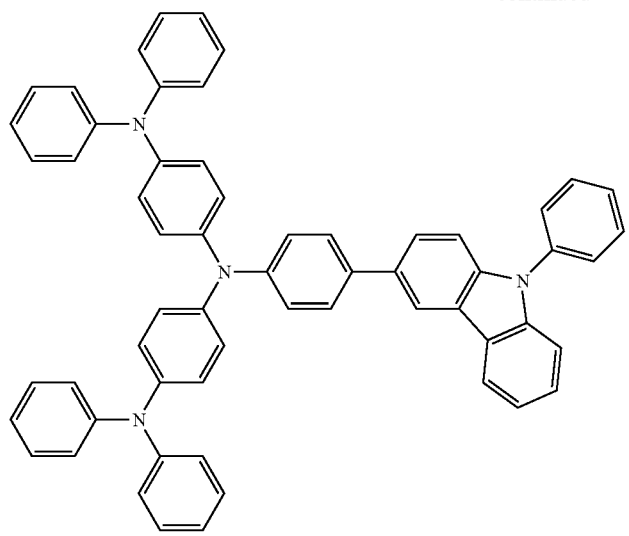
[Chem 22]
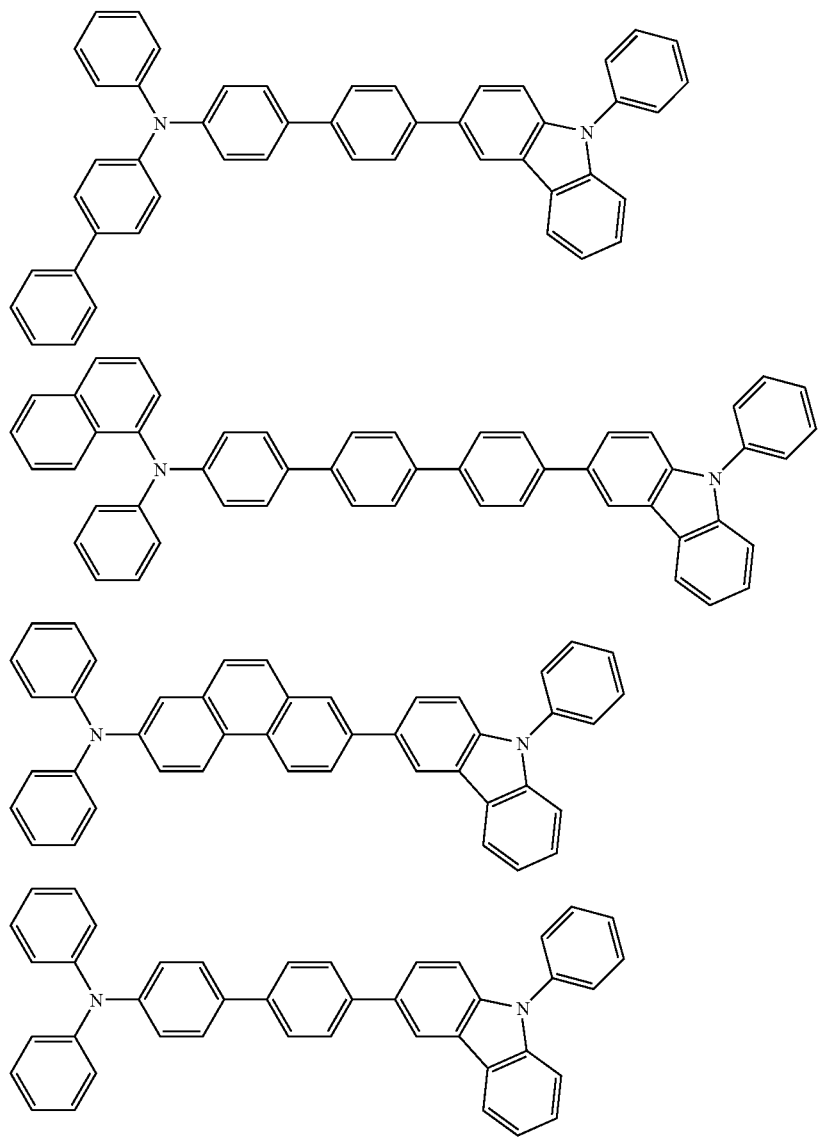

-continued
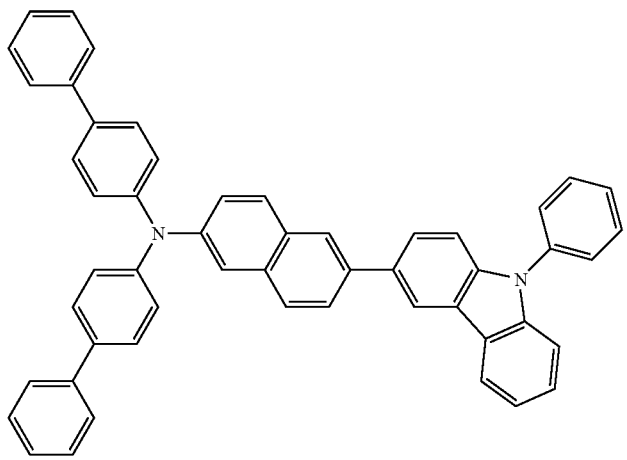
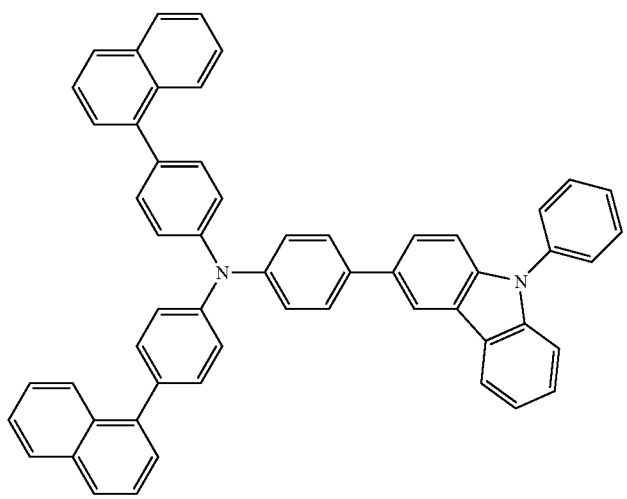
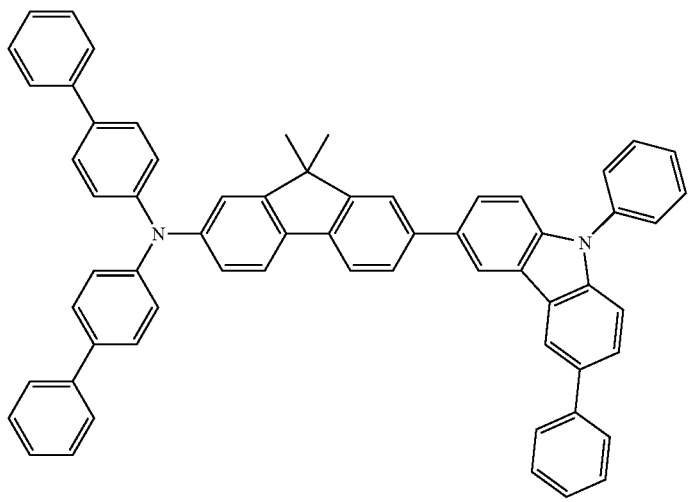

-continued
81
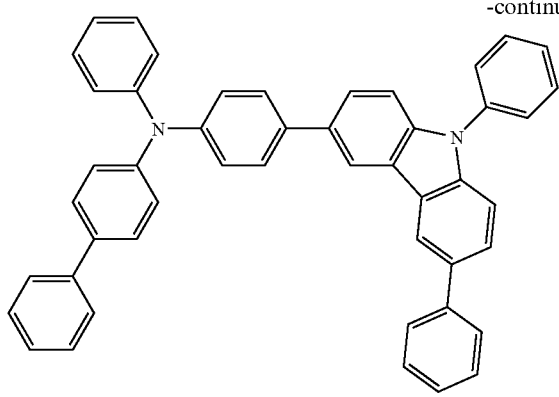
82
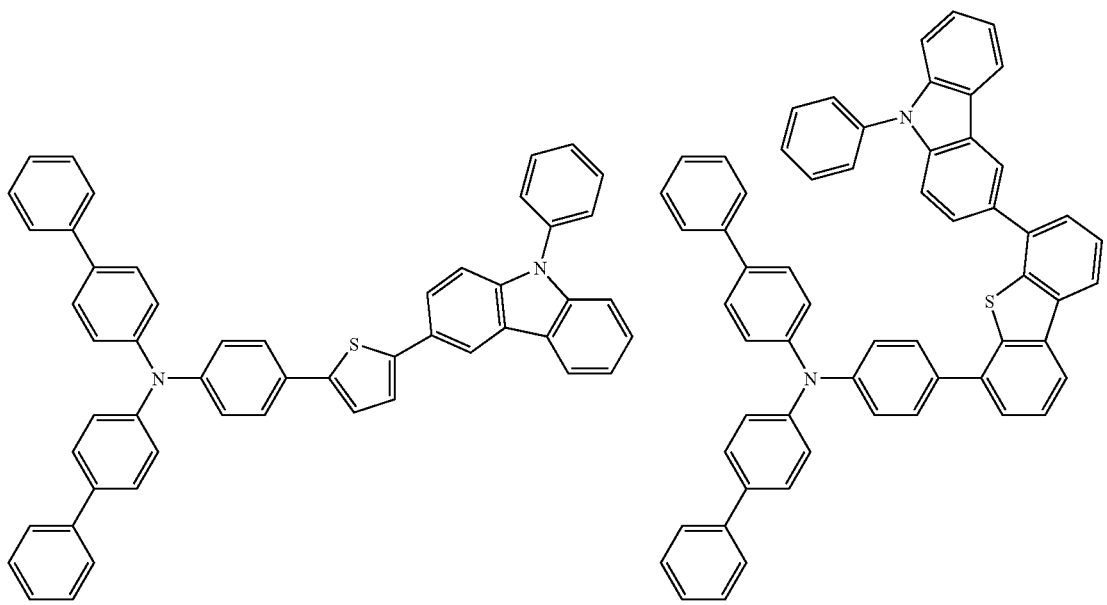
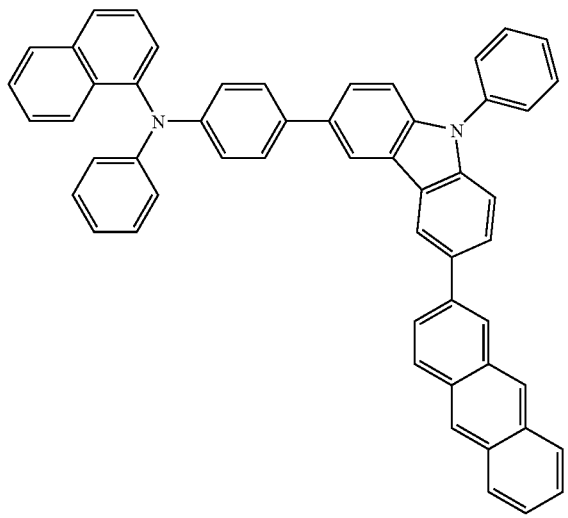

-continued
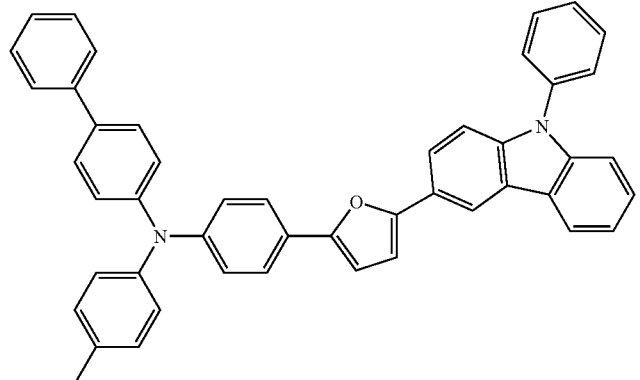
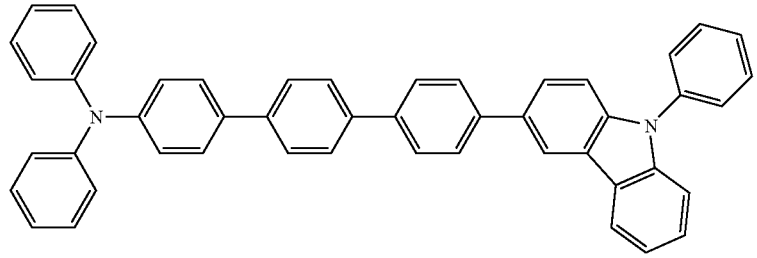
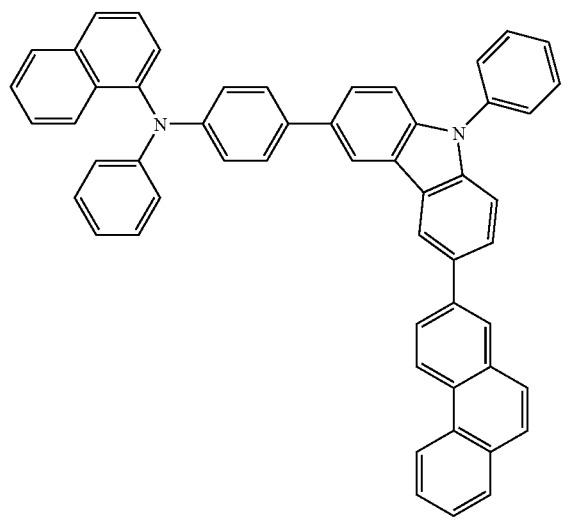
[Chem 23]
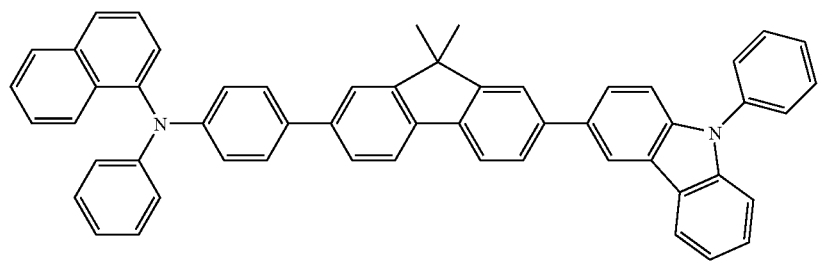

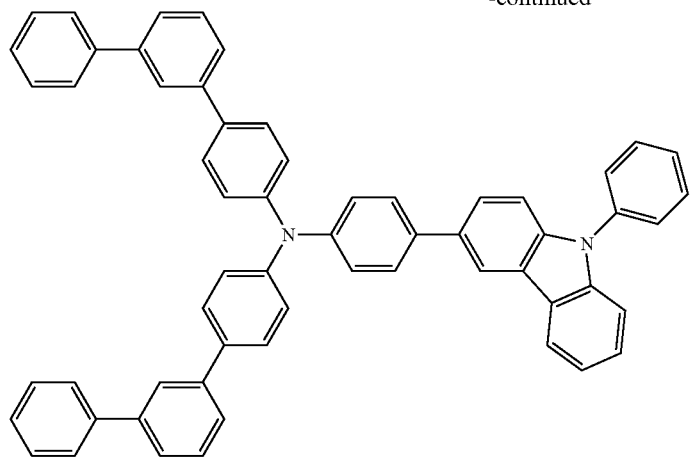
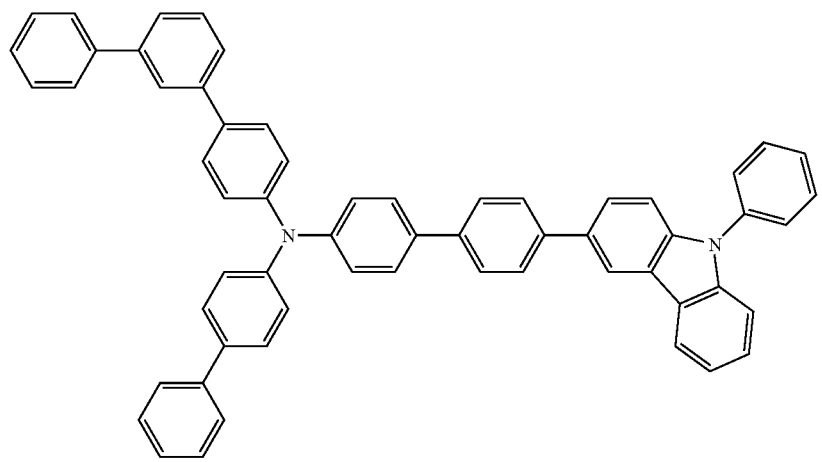
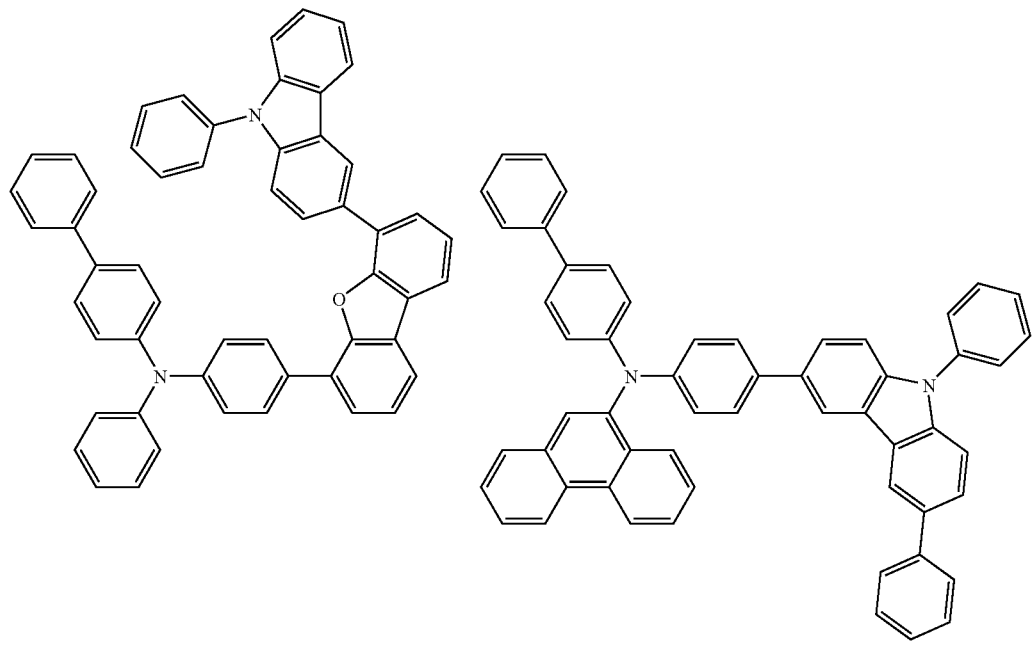

-continued
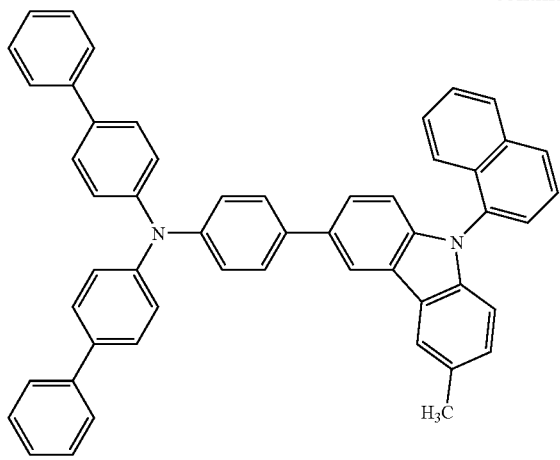
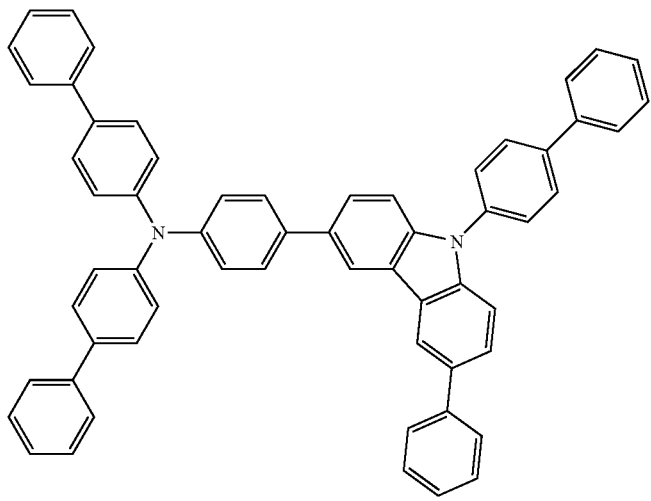
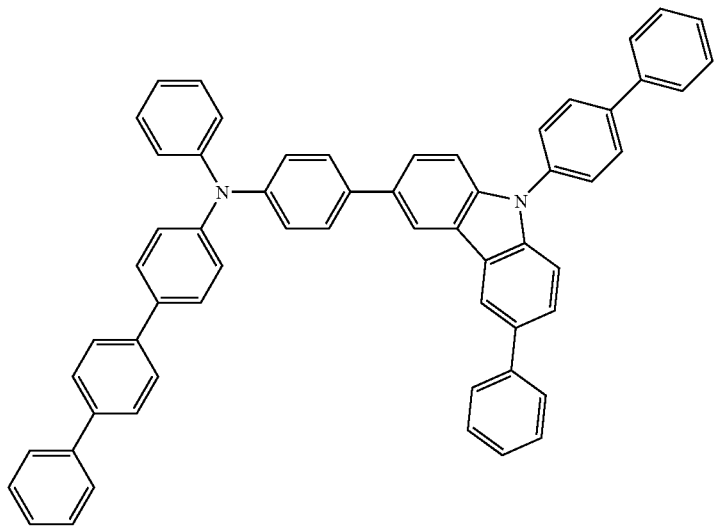

-continued
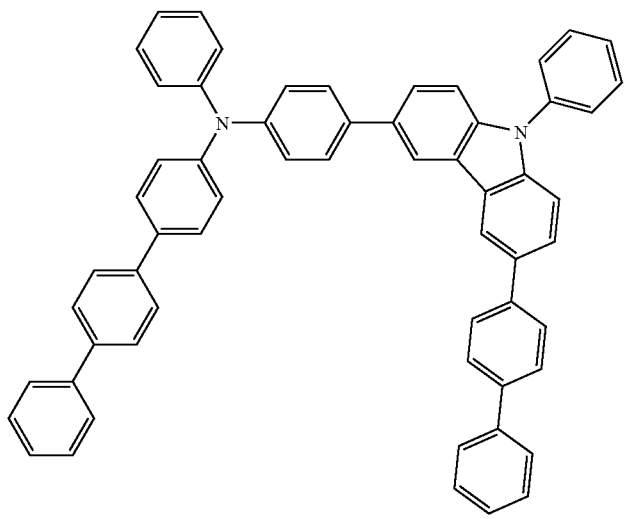
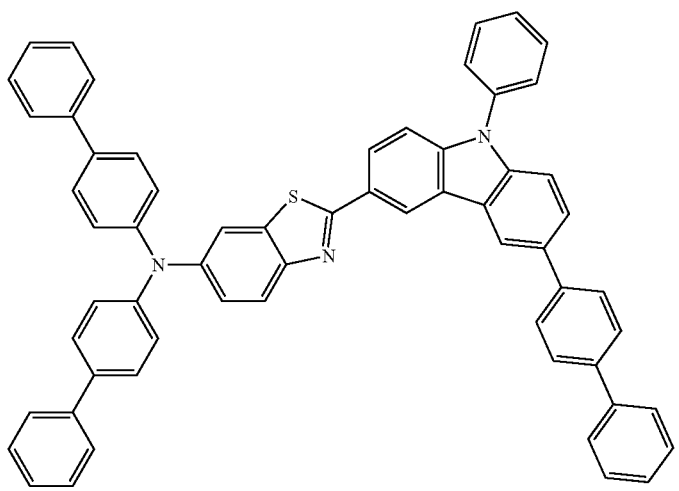
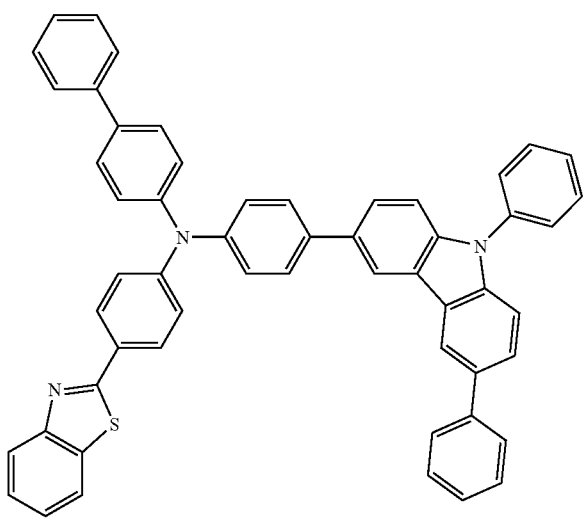

[Chem 24]
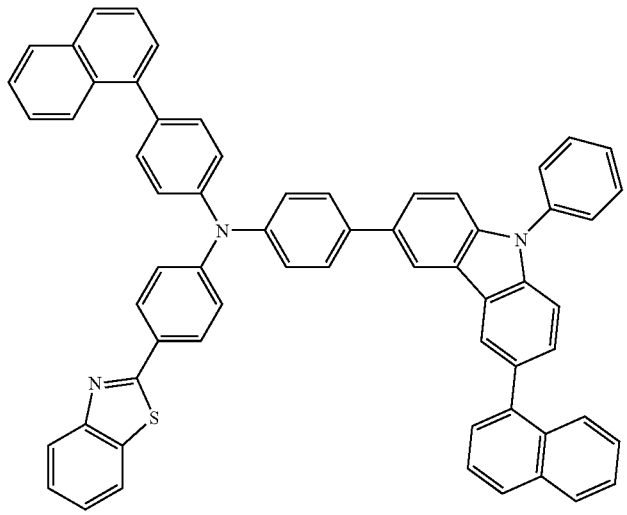
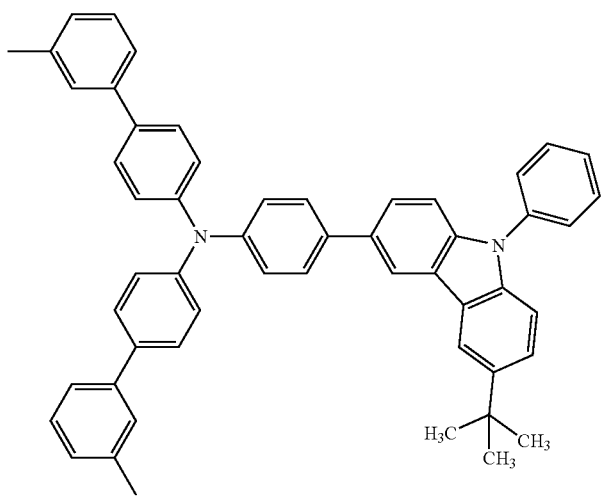
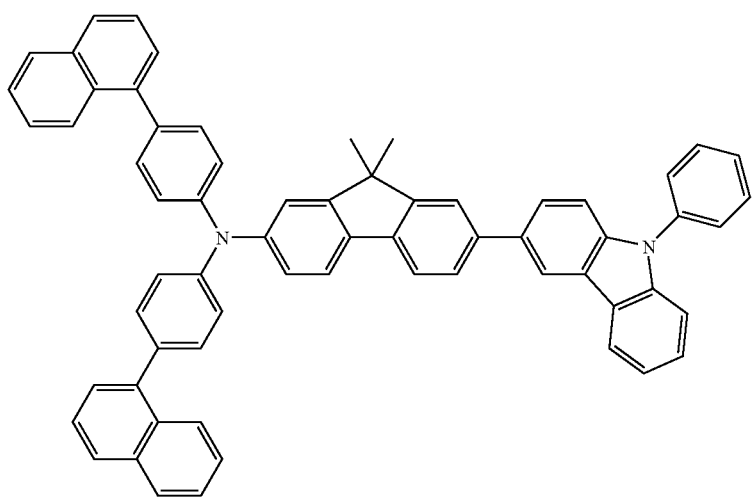

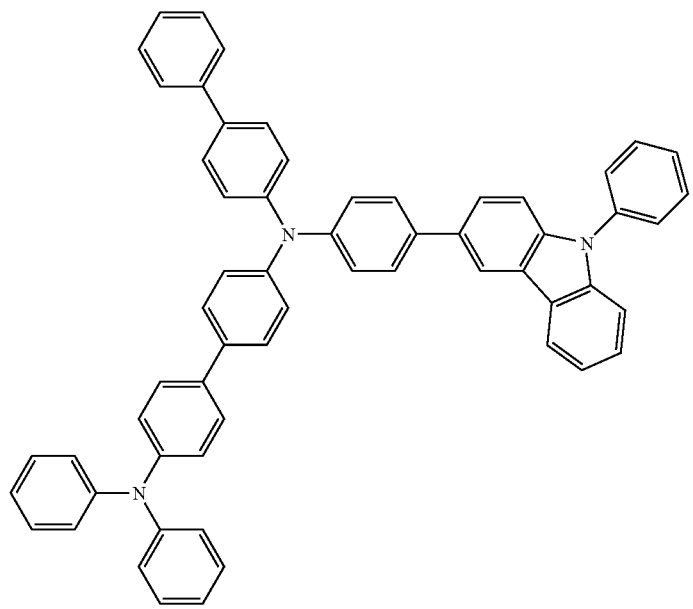
[Chem 25]
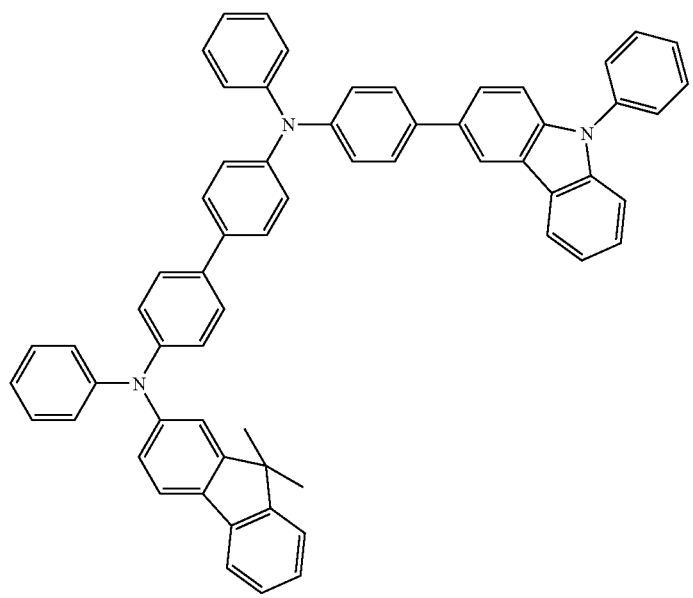

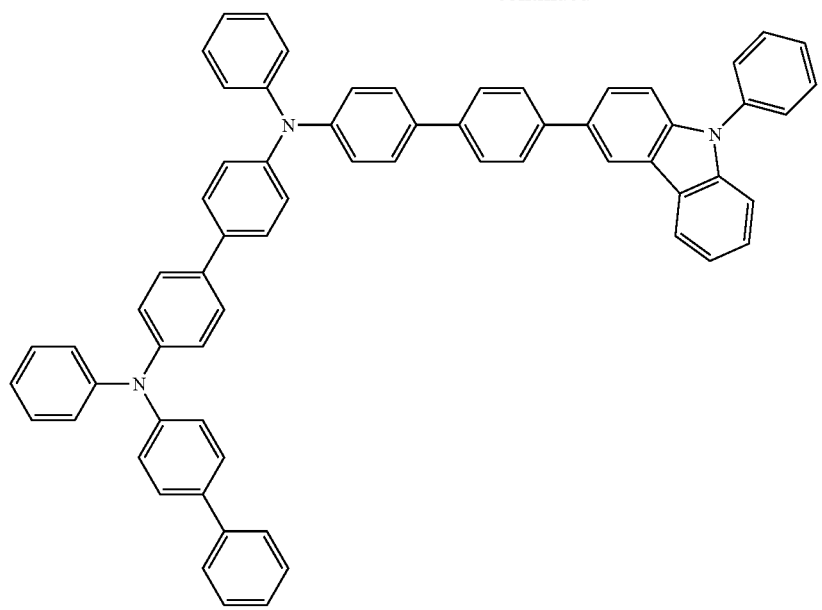
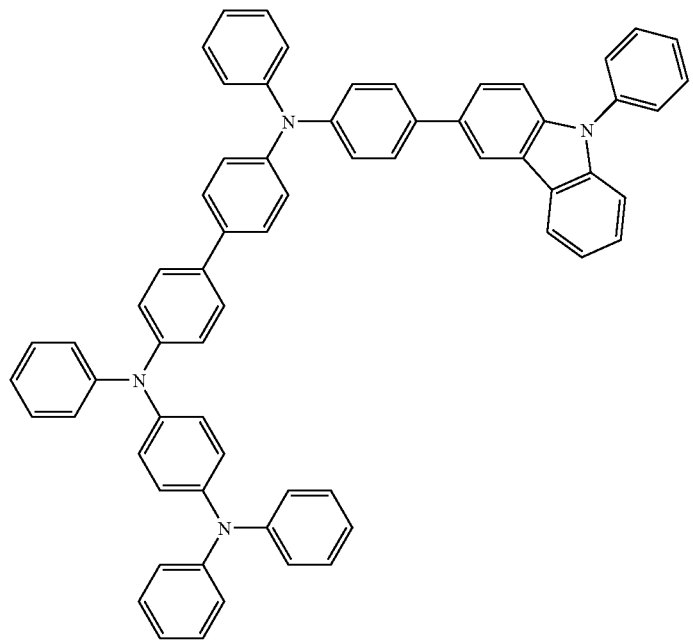

-continued
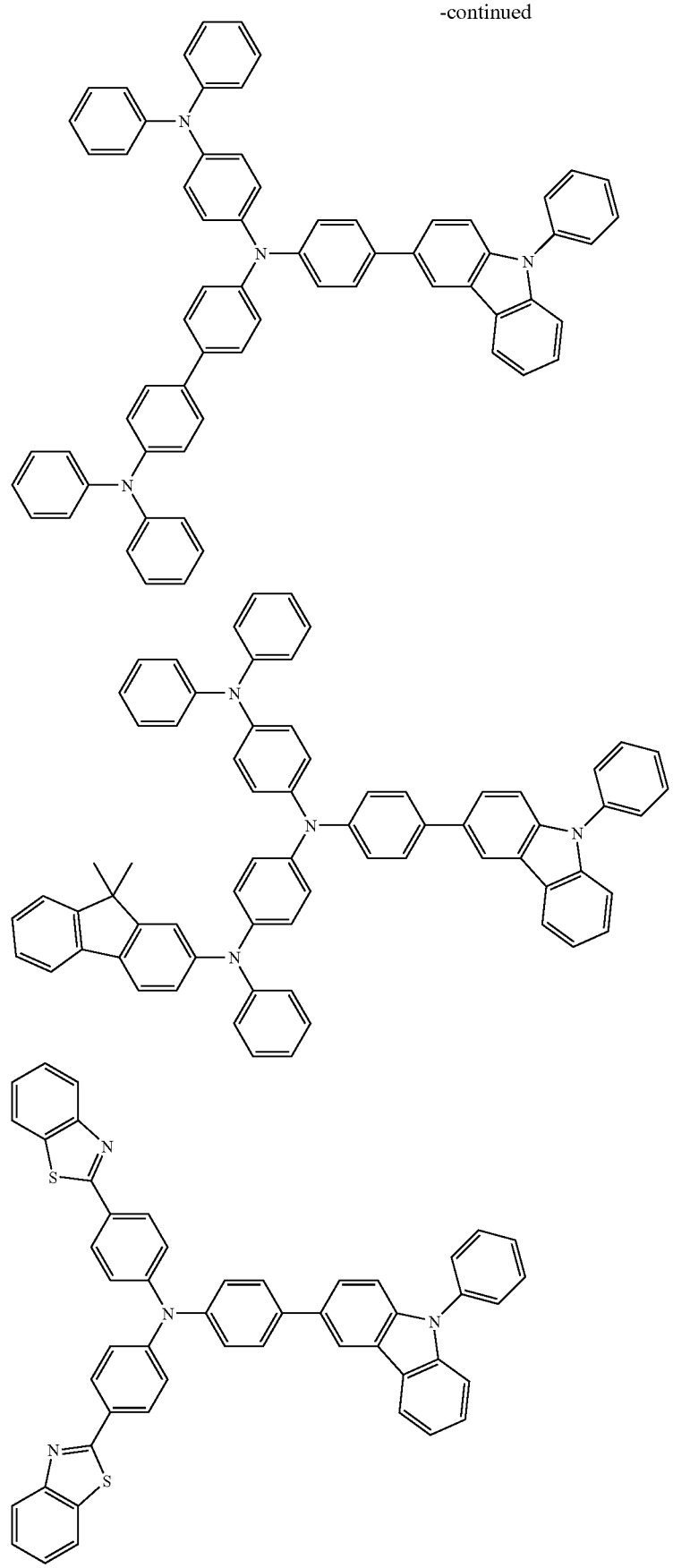

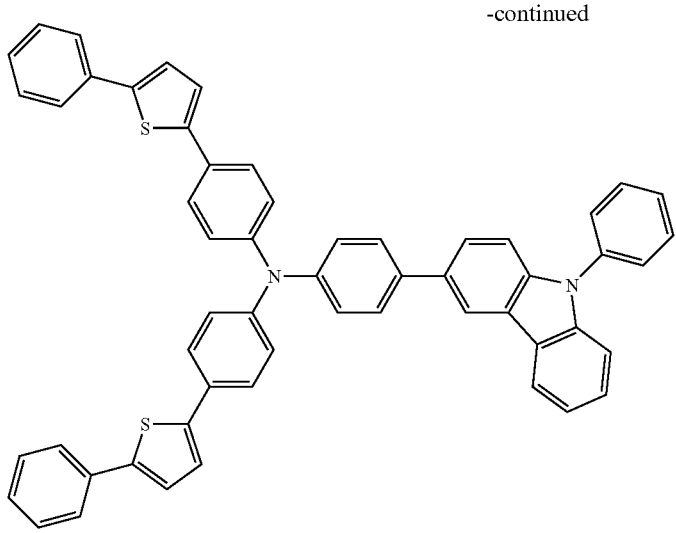
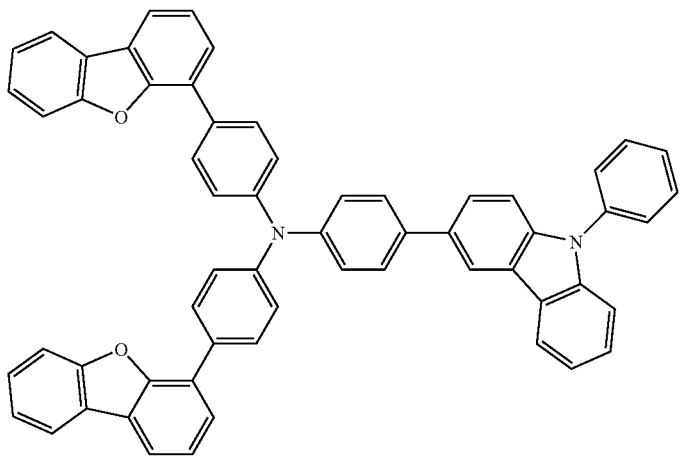
[Chem 26]
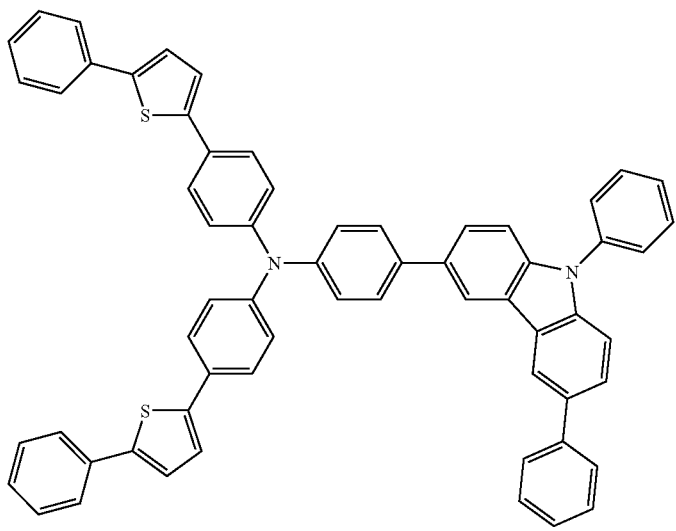

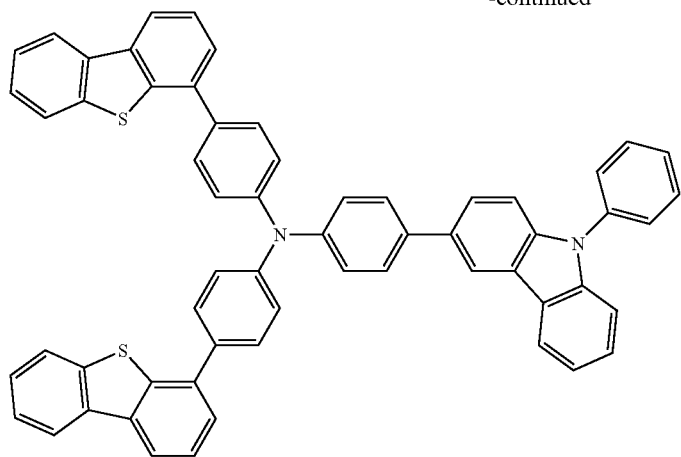
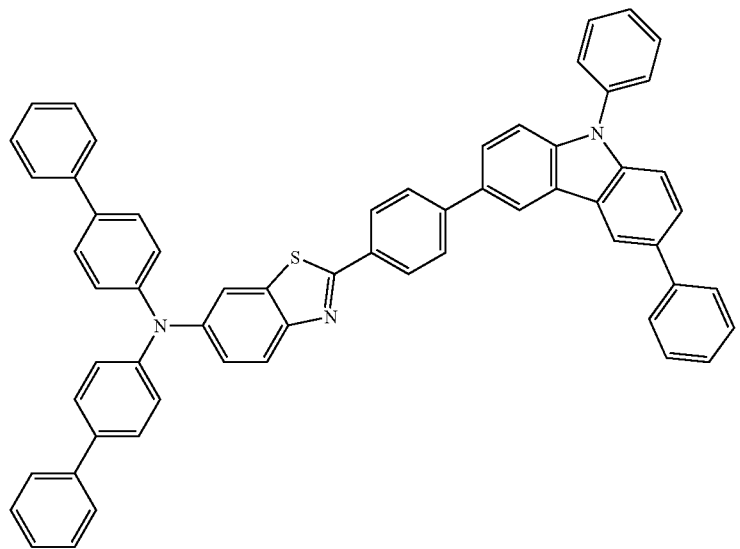
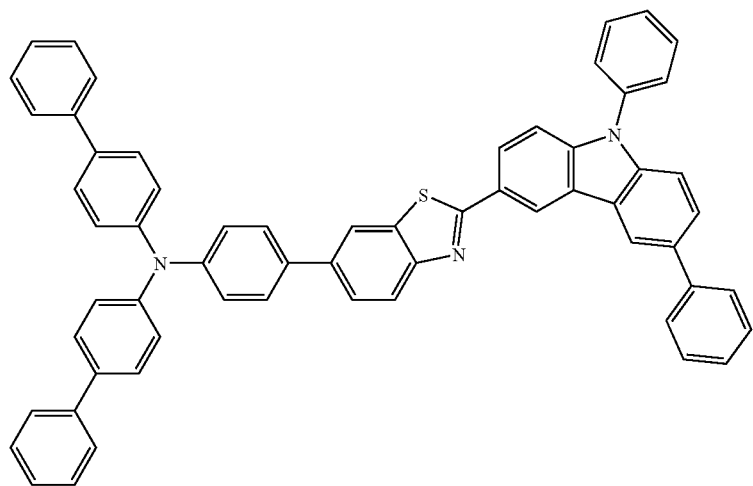

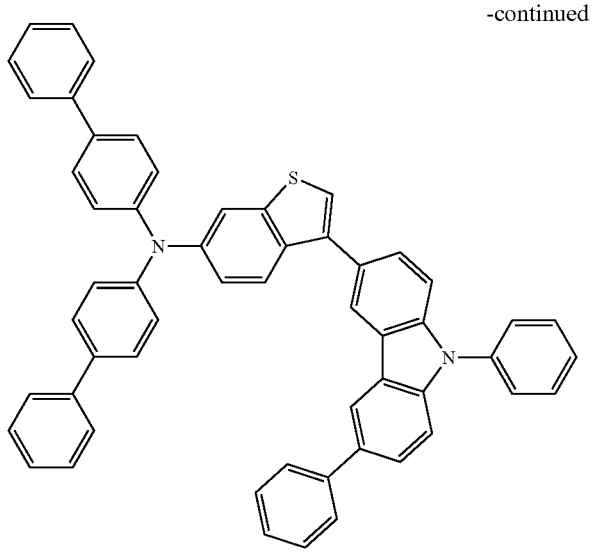
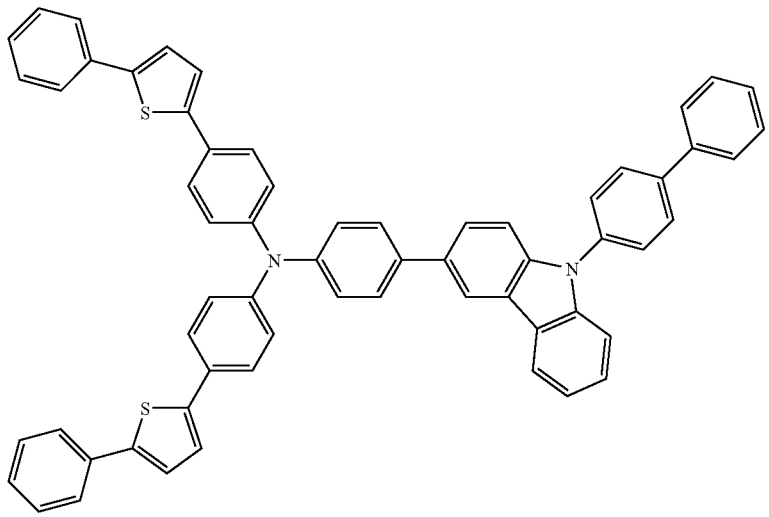
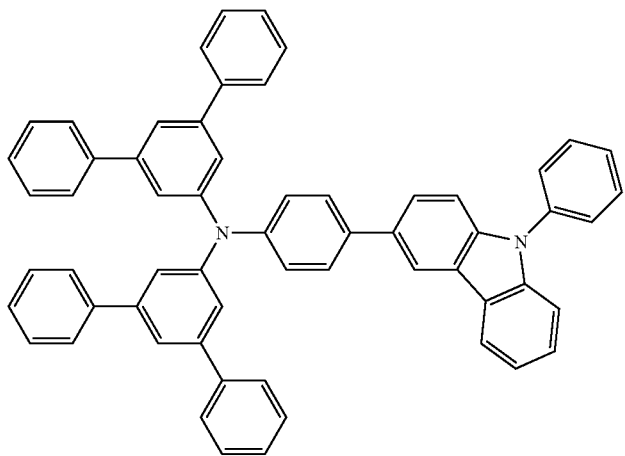

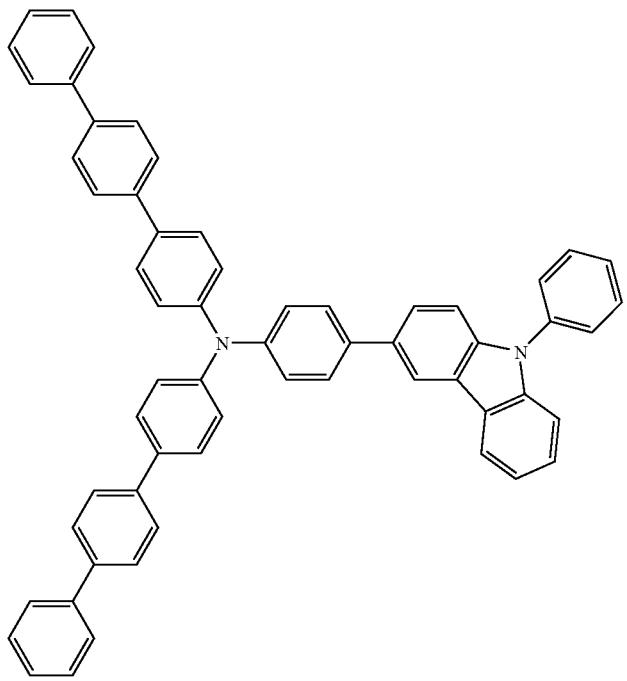
[Chem 27]
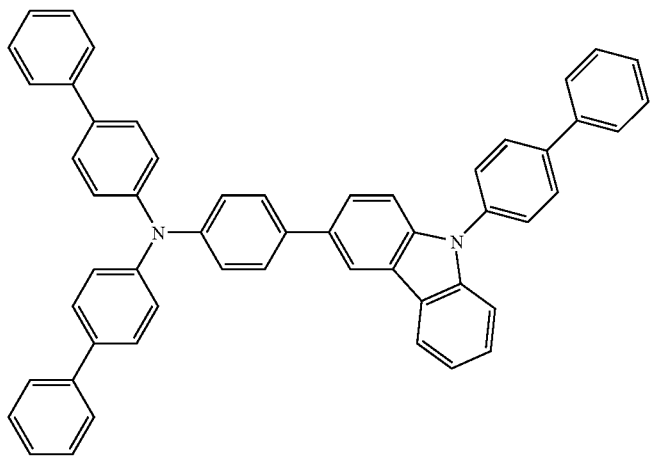
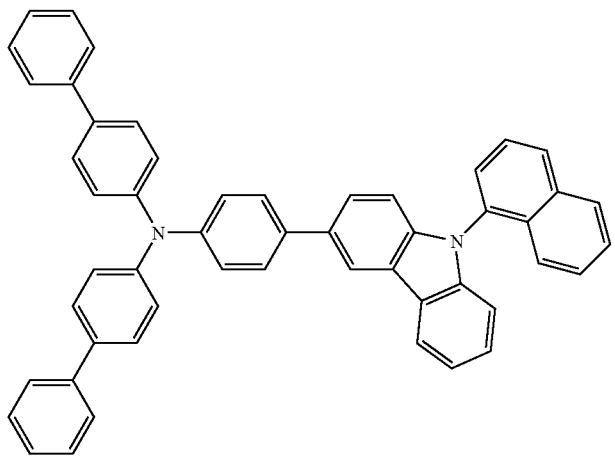

-continued
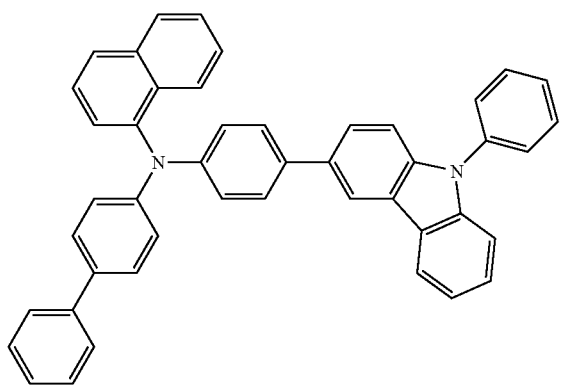
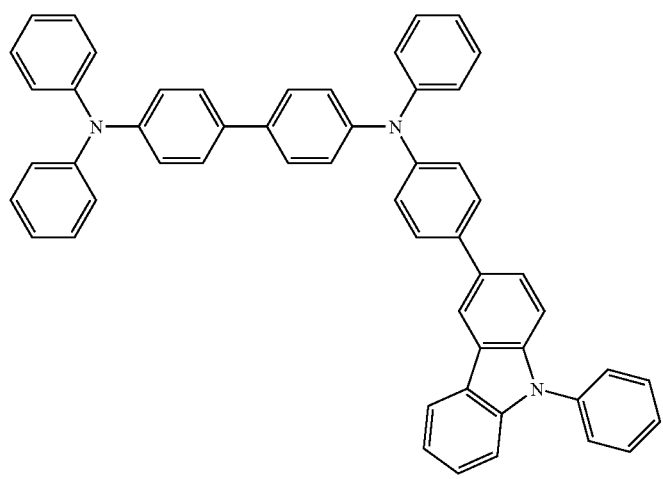
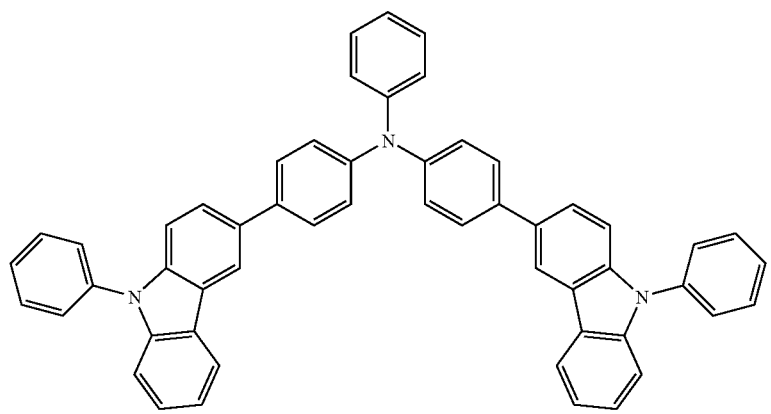

-continued
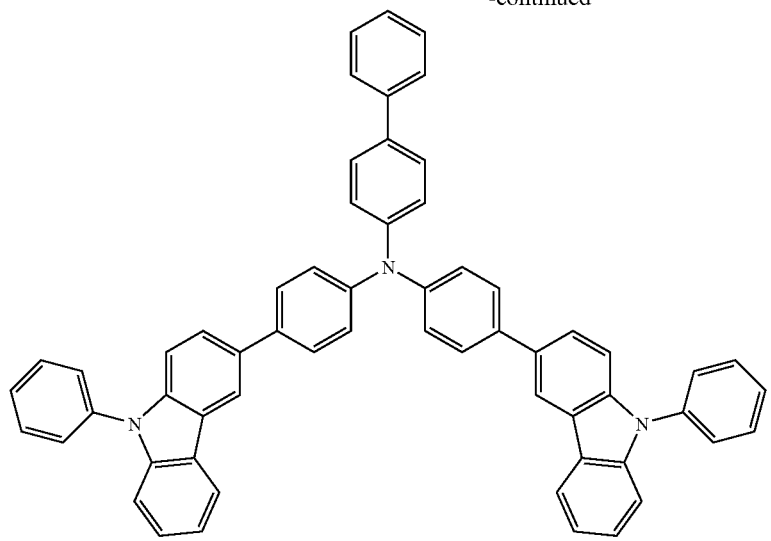
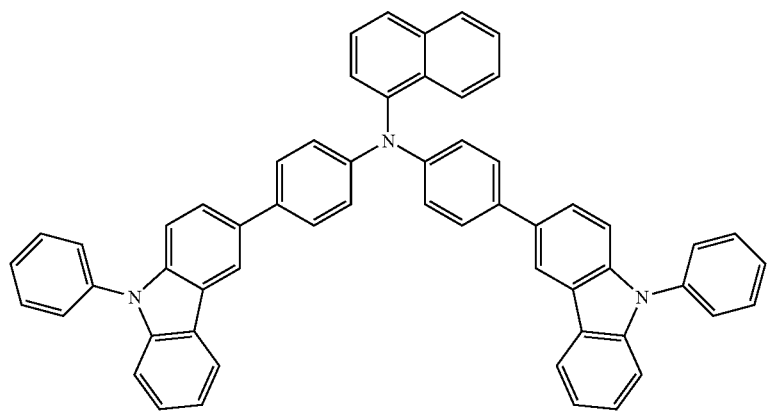
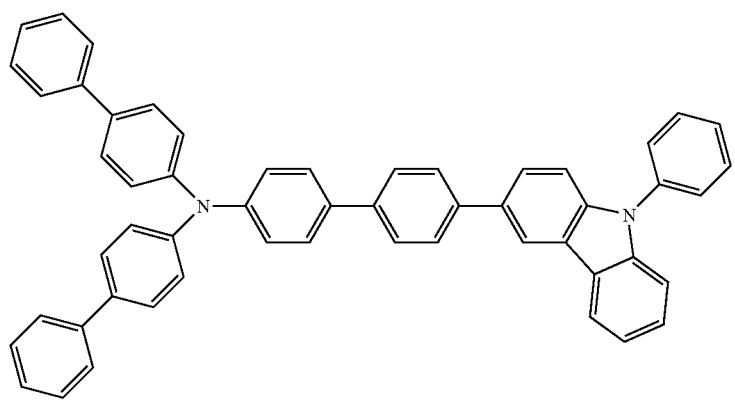

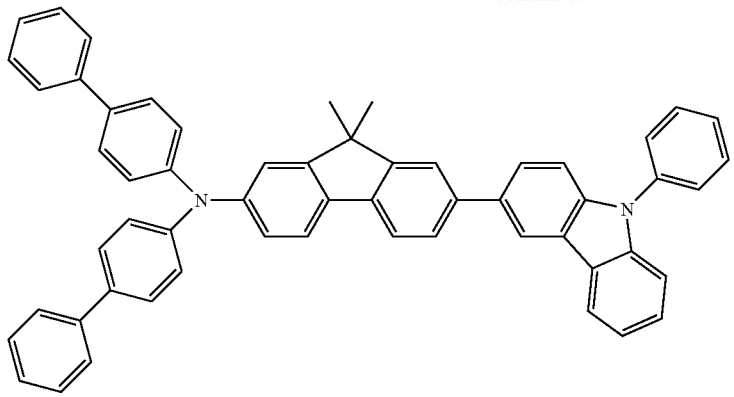 [SMILES: CC1(C)c2cc(-c3ccc4c(c3)c3ccccc3n4-c3ccccc3)ccc2-c2ccc(N(c3ccc(-c4ccccc4)cc3)c3ccc(-c4ccccc4)cc3)cc21]

The organic EL device of the present invention is an organic EL device having organic thin film layers formed of multiple layers including at least a light emitting layer, the organic thin film layers being interposed between a cathode and an anode, the organic EL device further having a hole transporting layer and a hole injecting layer, or a hole injecting/transporting layer. The aromatic amine derivative (X) according to the present invention is incorporated into the hole injecting layer, and the content of the aromatic amine derivative (X) is preferably 30 mass % or more. In addition, the aromatic amine derivative (Y) according to the present invention is incorporated into the hole transporting layer, and the content of the aromatic amine derivative (Y) is preferably mass % or more. In addition, in the case of the hole injecting/transporting layer that exerts the respective functions of the hole transporting layer and the hole injecting layer, a mass ratio (X/Y) of the aromatic amine derivative (X) according to the present invention to the aromatic amine derivative (Y) according to the present invention is preferably 0.7 to 1.3, or more preferably 0.8 to 1.2.

A fluorescent dopant in the light emitting layer is preferably a compound selected from, for example, an amine-based compound, an aromatic compound, a chelate complex such as a tris(8-quinolinolato) aluminum complex, a coumarin derivative, a tetraphenyl butadiene derivative, a bisstyrylarylene derivative, and an oxadiazole derivative in accordance with a required luminescent color. Specific examples of the compound include arylamine compounds and aryldiamine compounds, and out of them, a styrylamine compound, a styryldiamine compound, an aromatic amine compound, or an aromatic diamine compound is more preferable. Alternatively, a fused polycyclic aromatic compound (except an amine compound) is more preferable. One kind of those fluorescent dopants may be used alone, or two or more kinds of them may be used in combination.

The organic EL device of the present invention preferably contains a styrylamine compound and/or an arylamine as a fluorescent dopant/fluorescent dopants. The styrylamine compound and/or the arylamine are each/is preferably represented by the following general formula (50).

[Chem 28]

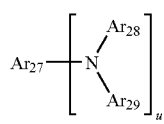

(50)

In the general formula (50), $Ar_{27}$ to $Ar_{29}$ each represent a substituted or unsubstituted aromatic group having 6 to 40 carbon atoms forming a ring, u represents an integer of 1 to 4, or preferably represents an integer of 1 or 2, one of $Ar_{27}$ to $Ar_{29}$ may represent a group containing a styryl group, and, when one of $Ar_{27}$ and $Ar_{28}$ represents a group containing a styryl group, at least one of $Ar_{28}$ and $Ar_{29}$ is preferably substituted with a styryl group.

Here, examples of the aromatic group having 6 to 40 ring forming carbon atoms include a phenyl group, a naphthyl group, an anthranyl group, a phenanthryl group, a pyrenyl group, a coronyl group, a biphenyl group, a terphenyl group, a pyrrolyl group, a furanyl group, a thiophenyl group, a benzothiophenyl group, an oxadiazolyl group, a diphenylanthranyl group, an indolyl group, a carbazolyl group, a pyridyl group, a benzoquinolyl group, a fluoranthenyl group, an acenaphtho fluoranthenyl group, a stilbene group, a perylenyl group, a chrysenyl group, a picenyl group, a triphenylenyl group, a rubicenyl group, a benzoanthracenyl group, a phenylanthracenyl group, a bisanthracenyl group, and arylene groups represented by the following general formulae (C) and (D). Of those, a naphthyl group, an anthranyl group, a chrysenyl group, a pyrenyl group, and arylene groups represented by the general formula (D) are preferable.

[Chem 29]

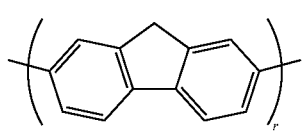

(C)

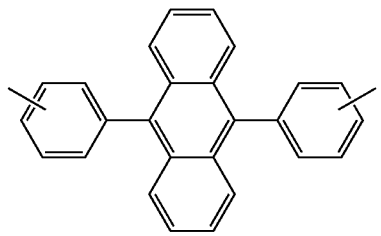

(D)

In the formula (C), r represents an integer of 1 to 3.

Note that examples of preferred substituents which are substituted with the aryl group and the arylene group include alkyl groups each having 1 to 6 carbon atoms (such as an ethyl group, a methyl group, an isopropyl group, an n-propyl group, an s-butyl group, a t-butyl group, a pentyl group, a hexyl group, a cyclopentyl group, and a cyclohexyl group), alkoxy groups each having 1 to 6 carbon atoms (such as an ethoxy group, a methoxy group, an isopropoxy group, an n-propoxy group, an s-butoxy group, a t-butoxy group, a pentoxy group, a hexyloxy group, a cyclopentoxy group, and a cyclohexyloxy group), aryl groups having 5 to 40 carbon atoms, amino groups substituted by aryl groups having 5 to 40 carbon atoms, and ester groups containing an aryl group having 5 to 40 carbon atoms, ester groups containing an alkyl group having 1 to 6 carbon atoms, a cyano group, a nitro group, and halogen atoms.

A light emitting material in the light emitting layer is not particularly limited, and a host material for the layer is, for example, a material selected from: polycyclic aromatic compounds such as an anthracene compound, a phenanthrene compound, a fluoranthene compound, a tetracene compound, a triphenylene compound, a chrysene compound, a pyrene compound, a coronene compound, a perylene compound, a phthaloperylene compound, a naphthaloperylene compound, a naphthacene compound, and a pentacene compound; oxadiazole; bisbenzoxazoline; bisstyryl; cyclopentadiene; a quinoline metal complex; a tris(8-hydroxyquinolinato)aluminum complex; a tris(4-methyl-8-quinolinato)aluminum complex; a tris(5-phenyl-8-quinolinato)aluminum complex; an aminoquinoline metal complex; a benzoquinoline metal complex; tri-(p-terphenyl-4-yl)amine; a 1-aryl-2,5-di(2-thienyl)pyrrole derivative; pyrane; quinacridone; rubrene; a distyrylbenzene derivative; a distyrylarylene derivative; a porphyrin derivative; a stilbene derivative; a pyrazoline derivative; a coumarin-based dye; a pyrane-based dye; a phthalocyanine-based dye; a naphthalocyanine-based dye; a croconium-based dye; a squalium-based dye; an oxobenzanthracene-based dye; a fluorescein-based dye; a rhodamine-based dye; a pyrylium-based dye; a perylene-based dye; a stilbene-based dye; a polythiophene-based dye; and polymer materials like a rare earth complex-based fluorescent material, a rare earth-based phosphorescent complex (for example, an Ir complex), and a conductive polymer such as polyvinyl carbazole, polysilane, or polyethylene dioxide thiophene (PEDOT). One kind of them may be used alone, or two or more kinds of them may be used as a mixture.

In the organic EL device of the present invention, it is preferred that a layer which is one of respective layers constituting the hole injecting layer and/or the hole transporting layer and is in contact with an anode is a layer containing an acceptor material.

The acceptor is an easily reducing organic compound.

The ease of reduction of the compound can be measured by a reduction potential. In the present invention, in the reduction potential using a saturated calomel electrode (SCE) as a reference electrode, the compound of −0.8 V or more is preferable, and the compound having a larger value than that of the reduction potential of tetracyanoquinodimethane (TCNQ) (about 0 V) is particularly preferable.

As the easily reducing organic compound, an organic compound having an electron-withdrawing substituent is preferably given. Specific examples thereof include quinoid derivatives, pyrazine derivatives, arylborane derivatives, and imide derivatives. The quinoid derivatives include quinodimethane derivatives, thiopyrandioxide derivatives, thioxanthenedioxide derivatives, and quinone derivatives.

The aromatic amine derivative of the present invention is particularly preferably used in an organic EL device which emits blue-based light.

Hereinafter, the device structure of the organic EL device of the present invention is described.

(1) Organic EL Device Structure

Typical examples of the device structure of the organic EL device of the present invention include the following:

(a) an anode/hole injecting layer/hole transporting layer/light emitting layer/electron injecting layer/cathode;

(b) an anode/acceptor-containing layer/hole injecting layer/hole transporting layer/light emitting layer/electron transporting layer/electron injecting layer/cathode;

(c) an anode/insulating layer/hole injecting layer/hole transporting layer/light emitting layer/insulating layer/cathode; and (d) an anode/insulating layer/hole injecting layer/hole transporting layer/light emitting layer/electron injecting layer/cathode.

(The above structure includes the case where a "hole injecting layer/hole transporting layer" is a "hole injecting/transporting layer").

(2) Light-Transmissive Substrate

The organic EL device of the present invention is prepared on a light-transmissive substrate. Here, the light-transmissive substrate is the substrate which supports the organic EL device. It is preferable that the light-transmissive substrate have a transmittance of light of 50% or higher in the visible light region of 400 to 700 nm and be flat and smooth.

Examples of the light-transmissive substrate include glass plates and polymer plates. Specific examples of the glass plates include plates formed of soda-lime glass, glass containing barium and strontium, lead glass, aluminosilicate glass, borosilicate glass, barium borosilicate glass, and quartz. Specific examples of the polymer plates include plates formed of polycarbonate, acrylic, polyethylene terephthalate, polyether sulfide, and polysulfone.

(3) Anode

The anode of the organic EL device of the present invention has the function of injecting holes into the hole transporting layer or the light emitting layer. It is effective that the anode has a work function of 4.5 eV or higher. Specific examples of the material for the anode used in the present invention include indium tin oxide (ITO) alloys, tin oxide (NESA), indium zinc oxide (IZO), gold, silver, platinum, and copper.

The anode can be prepared by forming a thin film of the electrode material described above in accordance with a process such as a vapor deposition process and a sputtering process.

When the light emitted from the light emitting layer is obtained through the anode, it is preferable that the anode have a transmittance of higher than 10% with respect to the emitted light. It is also preferable that the sheet resistance of the anode be several hundred $\Omega/\square$ or smaller. The thickness of the anode is, in general, selected in the range of 10 nm to 1 μm and preferably in the range of 10 to 200 nm although the preferable range may be different depending on the used material.

(4) Light Emitting Layer

The light emitting layer of the organic EL device has a combination of the following functions (1) to (3).

(1) The injecting function: the function of injecting holes from the anode or the hole injecting layer and injecting electrons from the cathode or the electron injecting layer when an electric field is applied.

(2) The transporting function: the function of transporting injected charges (i.e., electrons and holes) by the force of the electric field.

(3) The light emitting function: the function of providing the field for recombination of electrons and holes and leading to the emission of light.

However, the easiness of injection may be different between holes and electrons and the ability of transportation expressed by the mobility may be different between holes and electrons. It is preferable that one of the charges be transferred.

A known process such as a vapor deposition process, a spin coating process, or an LB process is applicable to the formation of the light emitting layer. The light emitting layer is particularly preferably a molecular deposit film. The term "molecular deposit film" as used here refers to a thin film formed by the deposition of a material compound in a vapor phase state, or a film formed by the solidification of a material compound in a solution state or a liquid phase state. The molecular deposit film can be typically distinguished from a thin film formed by the LB process (molecular accumulation film) on the basis of differences between the films in aggregation structure and higher order structure, and functional differences between the films caused by the foregoing differences.

In addition, as disclosed in JP-A-57-51781, the light emitting layer can also be formed by: dissolving a binder such as a resin and a material compound in a solvent to prepare a solution; and forming a thin film from the prepared solution by the spin coating method or the like.

A light emitting material is mainly an organic compound, and examples of a doping material which can be used as the above-mentioned materials or alternative materials include, but not limited to, arylamine compounds and/or strylamine compounds, anthracene, naphthalene, phenanthrene, pyrene, tetracene, coronene, chrysene, fluoresceine, perylene, phthaloperylene, naphthaloperylene, perynone, phthaloperynone, naphthaloperynone, diphenylbutadiene, tetraphenylbutadiene, coumarin, oxadiazole, aldazine, bisbenzoxazoline, bisstyryl, pyrazine, cyclopentadiene, quinoline metal complexes, aminoquinoline metal complexes, benzoquinoline metal complexes, imine, diphenylethylene, vinylanthracene, diaminocarbazole, pyrane, thiopyrane, polymethine, merocyanine, imidazole-chelated oxynoid compounds, quinacridone, rubrene, and fluorescent dyes.

A host material is preferably a compound represented by any one of the following formulae (51) to (57).

An anthracene derivative represented by the following formula (51)

[Chem 30]

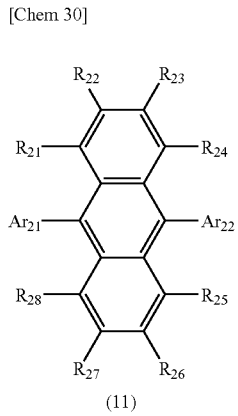

(51)

In the formula (51), $Ar_{21}$ and $Ar_{22}$ each independently represent a substituted or unsubstituted aromatic ring group having 6 to 60 carbon atoms, $R_{21}$ to $R_{28}$ each independently represent a hydrogen atom, a substituted or unsubstituted aromatic ring group having 6 to 50 carbon atoms, a substituted or unsubstituted aromatic heterocyclic group having 5 to 50 atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 atoms, a substituted or unsubstituted arylthio group having 5 to 50 atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxy group.

A pyrene derivative represented by the following formula (52)

[Chem 31]

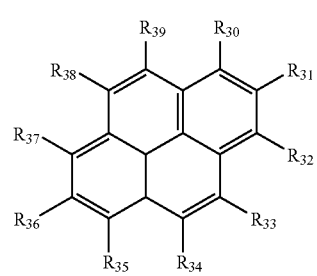

(52)

In the formula (52), $R_{30}$ to $R_{39}$ each independently represent a hydrogen atom, a substituted or unsubstituted aromatic ring group having 6 to 50 carbon atoms, a substituted or unsubstituted aromatic heterocyclic group having 5 to 50 atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 atoms, a substituted or unsubstituted arylthio group having 5 to 50 atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxy group.

An anthracene derivative represented by the following formula (53)

[Chem 32]

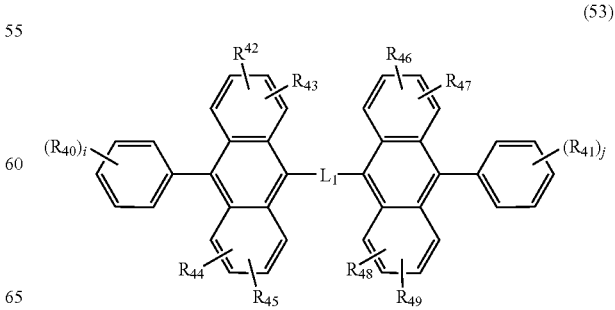

(53)

In the formula (53):

$R_{40}$ to $R_{49}$ each independently represent a hydrogen atom, an alkyl group, a cycloalkyl group, an aryl group which may be substituted, an alkoxyl group, an aryloxy group, an alkylamino group, an alkenyl group, an arylamino group, or a heterocyclic group which may be substituted;

i and j each represent an integer of 1 to 5, and, when i or j represents 2 or more, $R_{40}$'s or $R_{41}$'s may be identical to or different from each other, or $R_{40}$'s or $R_{41}$'s may be bonded to each other to form a ring; $R_{42}$ and $R_{43}$, $R_{44}$ and $R_{45}$, $R_{46}$ and $R_{47}$, or $R_{48}$ and $R_{49}$ may be bonded to each other to form a ring; and $L_1$ represents a single bond, —O—, —S—, —N(R)— where R represents an alkyl group or an aryl group which may be substituted, an alkylene group, or an arylene group.

An anthracene derivative represented by the following formula (54)

[Chem 33]

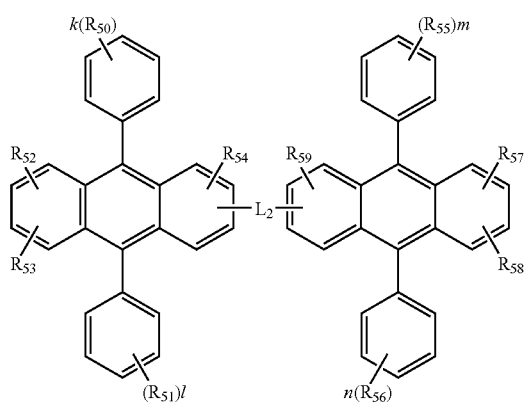

(54)

In the formula (54):

$R_{50}$ to $R_{59}$ each independently represent a hydrogen atom, an alkyl group, a cycloalkyl group, an aryl group, an alkoxyl group, an aryloxy group, an alkylamino group, an arylamino group, or a heterocyclic group which may be substituted;

k, l, m, and n each represent an integer of 1 to 5, and, when any one of, l, m, and n represents 2 or more, $R_{50}$'s, $R_{51}$'s, $R_{55}$'s, or $R_{56}$'s may be identical to or different from each other, or $R_{52}$'s, $R_{53}$'s, $R_{54}$'s, or $R_{55}$'s may be bonded to each other to form a ring; $R_{52}$ and $R_{53}$, or $R_{57}$ and $R_{58}$ may be bonded to each other to form a ring; and $L_2$ represents a single bond, —O—, —S—, —N(R)— where R represents an alkyl group or an aryl group which may be substituted, an alkylene group, or an arylene group.

A spirofluorene derivative represented by the following formula (55)

[Chem 34]

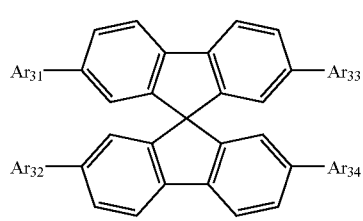

(55)

In the formula (55), $Ar_{31}$ to $Ar_{34}$ each independently represent a substituted or unsubstituted biphenylyl group, or a substituted or unsubstituted naphthyl group.

A compound represented by the following formula (56)

[Chem 35]

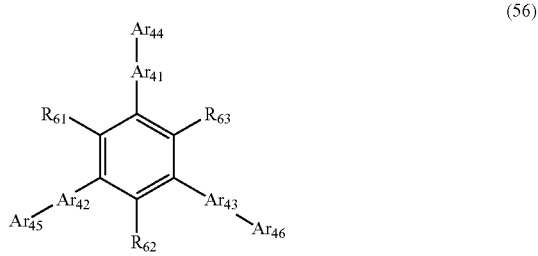

(56)

In the formula (56):

$Ar_{41}$ to $Ar_{43}$ each independently represent a substituted or unsubstituted arylene group having 6 to 60 carbon atoms, and $Ar_{44}$ to $Ar_{46}$ each independently represent a hydrogen atom, or a substituted or unsubstituted aryl group having 6 to 60 carbon atoms; and $R_{61}$ to $R_{63}$ each independently represent a hydrogen atom, an alkyl group having 1 to 6 carbon atoms, a cycloalkyl group having 3 to 6 carbon atoms, an alkoxyl group having 1 to 6 carbon atoms, an aryloxy group having 5 to 18 carbon atoms, an aralkyloxy group having 7 to 18 carbon atoms, an arylamino group having 5 to 16 carbon atoms, a nitro group, a cyano group, an ester group having 1 to 6 carbon atoms, or a halogen atom.

A fluorene compound represented by the following formula (57)

[Chem 36]

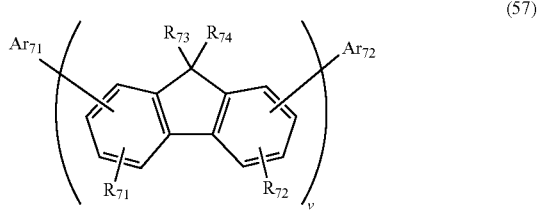

(57)

In the formula (57):

$R_{73}$ and $R_{74}$ each represent a hydrogen atom, a substituted or unsubstituted alkyl group, a substituted or unsubstituted aralkyl group, a substituted or unsubstituted aryl group, a substituted or unsubstituted heterocyclic group, a substituted amino group, a cyano group, or a halogen atom, $R_{73}$'s or $R_{74}$'s bonded to different fluorene groups may be identical to or different from each other, and $R_{73}$ and $R_{74}$ bonded to the same fluorene group may be identical to or different from each other; $R_{71}$ and $R_{72}$ each represent a hydrogen atom, a substituted or unsubstituted alkyl group, a substituted or unsubstituted aralkyl group, a substituted or unsubstituted aryl group, or a substituted or unsubstituted heterocyclic group, $R_{71}$'s or $R_{72}$'s bonded to different fluorene groups may be identical to or different from each other, and $R_{71}$ and $R_{72}$ bonded to the same fluorene group may be identical to or different from each other; and $Ar_{71}$ and $Ar_{72}$ each represent a substituted or unsubstituted fused polycyclic aromatic group having three or more benzene rings in total, or a substituted or unsubstituted fused polycyclic heterocyclic group that has three or more rings each of which is a benzene ring or a heterocyclic ring in total and that is bonded to a fluorene group by carbon, and $Ar_{71}$ and $Ar_{72}$ may be identical to or different from each other, and v represents an integer of 1 to 10.

Of the above-mentioned host materials, an anthracene derivative is preferable, a monoanthracene derivative is more preferable, and an asymmetric anthracene is particularly preferable.

A host formed of a compound containing a carbazole ring and suitable for phosphorescence is a compound having a function of causing a phosphorescent compound to emit light as a result of the occurrence of energy transfer from the excited state of the host to the phosphorescent compound. The host compound is not particularly limited as long as it is a compound capable of transferring exciton energy to a phosphorescent compound, and can be appropriately selected in accordance with a purpose. The host compound may have, for example, an arbitrary heterocyclic ring in addition to a carbazole ring.

Specific examples of such a host compound include carbazole derivatives, triazole derivatives, oxazole derivatives, oxadiazole derivatives, imidazole derivatives, polyarylalkane derivatives, pyrazoline derivatives, pyrazolone derivatives, phenylene diamine derivatives, arylamine derivatives, aminosubstituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, anthraquinodimethane derivatives, anthrone derivatives, diphenylquinone derivatives, thiopyranedioxide derivatives, carbodiimide derivatives, fluorenilidene methane derivatives, distyrylpyrazine derivatives, heterocyclic tetracarboxylic anhydrides such as naphthaleneperylene, phthalocyanine derivatives, various metal complex polysilane-based compounds typified by metal complexes of 8-quinolinol derivatives or metal complexes having metal phthalocyanine, benzooxazole, or benzothiazole as a ligand, poly(N-vinylcarbazole) derivatives, aniline-based copolymers, conductive high molecular weight oligomers such as thiophene oligomers or polythiophene, polymer compounds such as polythiophene derivatives, polyphenylene derivatives, polyphenylene vinylene derivatives, and polyfluorene derivatives. One of the host materials may be used alone, or two or more thereof may be used in combination.

Specific examples thereof include the compounds as described below.

[Chem 37]

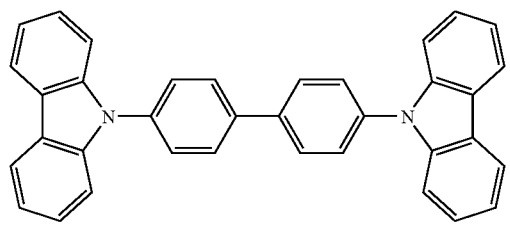

-continued

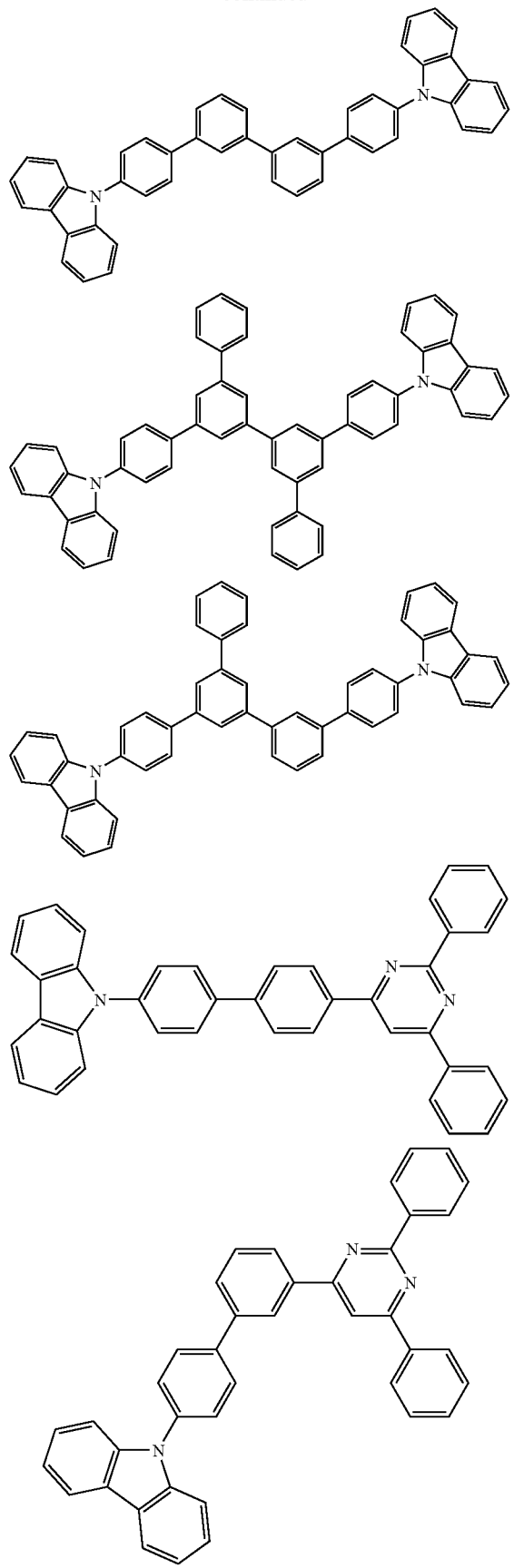

[Chem 38]

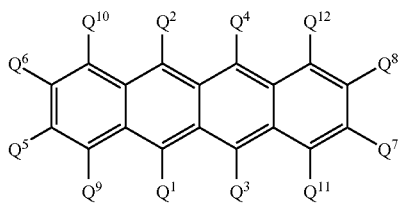

(xii)

In the formula (xii), $Q^1$ to $Q^{12}$ each independently represent a hydrogen atom, a substituted or unsubstituted alkyl group having 1 to 20 carbon atoms, a substituted or unsubstituted aryl group having 5 to 20 carbon atoms forming a ring, an amino group, a substituted or unsubstituted alkoxy group having 1 to 20 carbon atoms, a substituted or unsubstituted alkylthio group having 1 to 20 carbon atoms, a substituted or unsubstituted aryloxy group having 5 to 20 carbon atoms forming a ring, a substituted or unsubstituted arylthio group having 5 to 20 carbon atoms forming a ring, a substituted or unsubstituted alkenyl group having 2 to 20 carbon atoms, a substituted or unsubstituted aralkyl group having 7 to 20 carbon atoms forming a ring, or a substituted or unsubstituted heterocyclic group having 5 to 20 carbon atoms forming a ring, and $Q^1$ to $Q^{12}$ may be identical to or different from one another.

The naphthacene derivative represented by the above formula (xii) is more preferably a naphthacene derivative represented by the following formula (xiii).

[Chem 39]

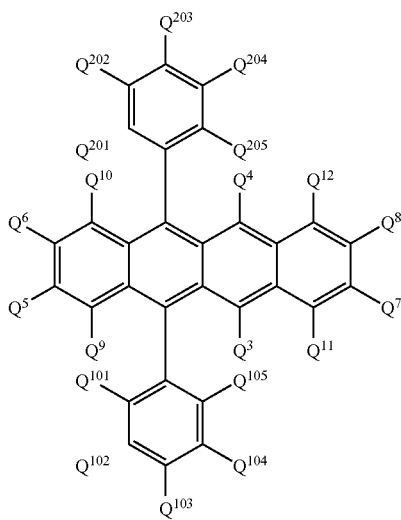

(xiii)

In the formula (xiii), $Q^3$ to $Q^{12}$, $Q^{101}$ to $Q^{105}$, and $Q^{201}$ to $Q^{205}$ each independently represent any one of the same groups as those represented by $Q^3$ to $Q^{12}$ of the above formula (xii), and may be identical to or different from one another, or two or more of them adjacent to each other may be bonded to each other to form a ring.

Of the above host materials, a host material for a blue to yellow dopant is preferably an anthracene derivative, more preferably a monoanthracene derivative, or particularly preferably an asymmetric anthracene. In addition, a host material for a yellow to red dopant is preferably a naphthacene derivative.

A host formed of a compound containing a carbazole ring and suitable for phosphorescence is a compound having a function of causing a phosphorescent compound to emit light as a result of the occurrence of energy transfer from the excited state of the host to the phosphorescent compound. The host compound is not particularly limited as long as it is a compound capable of transferring exciton energy to a phosphorescent compound, and can be appropriately selected in accordance with a purpose. The host compound may have, for example, an arbitrary heterocyclic ring in addition to a carbazole ring.

Specific examples of such a host compound include carbazole derivatives, triazole derivatives, oxazole derivatives, oxadiazole derivatives, imidazole derivatives, polyarylalkane derivatives, pyrazoline derivatives, pyrazolone derivatives, phenylene diamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, anthraquinodimethane derivatives, anthrone derivatives, diphenylquinone derivatives, thiopyranedioxide derivatives, carbodiimide derivatives, fluorenilidene methane derivatives, distyrylpyrazine derivatives, heterocyclic tetracarboxylic anhydrides such as naphthaleneperylene, phthalocyanine derivatives, various metal complex polysilane-based compounds typified by metal complexes of 8-quinolinol derivatives or metal complexes having metal phthalocyanine, benzooxazole, or benzothiazole as a ligand, poly(N-vinylcarbazole) derivatives, aniline-based copolymers, conductive high molecular weight oligomers such as thiophene oligomers or polythiophene, polymer compounds such as polythiophene derivatives, polyphenylene derivatives, polyphenylene vinylene derivatives, and polyfluorene derivatives. One of the host materials may be used alone, or two or more thereof may be used in combination.

Specific examples thereof include the compounds as described below.

[Chem 40]

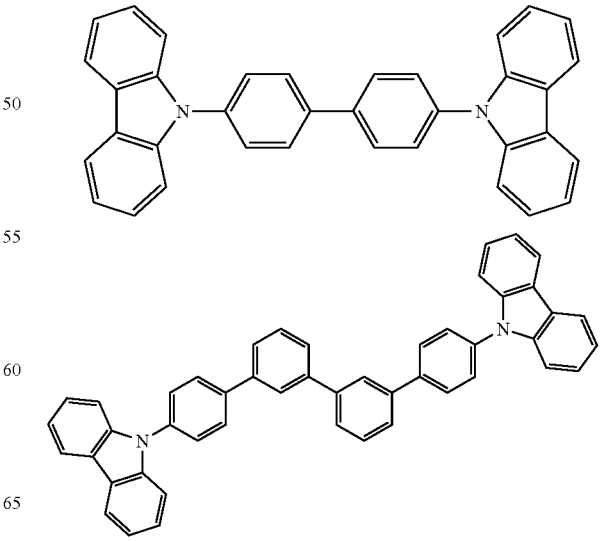

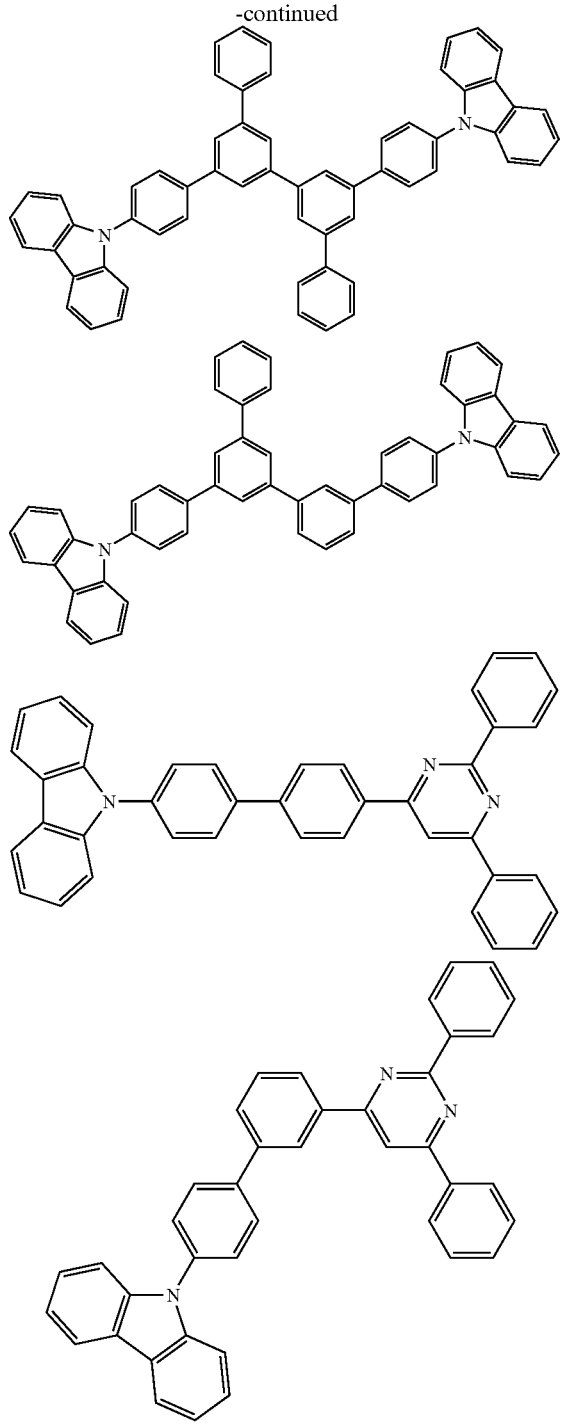

A phosphorescent dopant is a compound capable of emitting light from a triplet exciton. The dopant, which is not particularly limited as long as light is emitted from a triplet exciton, is preferably a metal complex containing at least one metal selected from the group consisting of Ir, Ru, Pd, Pt, Os, and Re, and is preferably a porphyrin metal complex or an orthometalated metal complex. A porphyrin platinum complex is preferable as the porphyrin metal complex. One kind of a phosphorescent compound may be used alone, or two or more kinds of phosphorescent compounds may be used in combination.

There are various ligands which may be used for forming an orthometalated metal complex. Examples of a preferable ligand include 2-phenylpyridine derivatives, 7,8-benzoquinoline derivatives, 2-(2-thienyl)pyridine derivatives, 2-(1-naphthyl)pyridine derivatives, and 2-phenylquinoline derivatives. Each of those derivatives may have a substituent as required. A fluoride of any one of those derivatives, or one obtained by introducing a trifluoromethyl group into any one of those derivatives is a particularly preferable blue-based dopant. The metal complex may further include a ligand other than the above-mentioned ligands, such as acetylacetonato or picric acid as an auxiliary ligand.

The content of the phosphorescent dopant in the light emitting layer is not particularly limited, and can be appropriately selected in accordance with a purpose. The content is, for example, 0.1 to 70 mass %, and is preferably 1 to 30 mass %. When the content of the phosphorescent compound is less than 0.1 mass %, the intensity of emitted light is weak, and an effect of the incorporation of the compound is not sufficiently exerted. When the content exceeds 70 mass %, a phenomenon referred to as concentration quenching becomes remarkable, and device performance reduces.

In addition, the light emitting layer may contain a hole transporting material, an electron transporting material, or a polymer binder as required.

Further, the thickness of the light emitting layer is preferably 5 to 50 nm, more preferably 7 to 50 nm, or most preferably 10 to 50 nm. When the thickness is less than 5 nm, it becomes difficult to form the light emitting layer, so the adjustment of chromaticity may become difficult. When the thickness exceeds 50 nm, the driving voltage may increase.

(5) Hole Injecting Layer and Hole Transporting Layer (Hole Injecting/Transporting Layer)

Various conventionally known embodiments are applicable to the hole injecting layer and the hole transporting layer (the hole injecting/transporting layer) except that each layer contains the aromatic amine derivative according to the present invention as described above.

(6) Electron Injecting/Transporting Layer

Next, the electron injecting layer and electron transporting layer are layers which help injection of electrons into the light emitting layer, transports the holes to the light emitting region, and exhibits a great mobility of electrons. The adhesion improving layer is an electron injecting layer including a material exhibiting particularly improved adhesion with the cathode.

In addition, it is known that, in an organic EL device, emitted light is reflected by an electrode (cathode in this case), so emitted light directly extracted from an anode and emitted light extracted via the reflection by the electrode interfere with each other. The thickness of an electron transporting layer is appropriately selected from the range of several nanometers to several micrometers in order that the interference effect may be effectively utilized. When the thickness of the electron transporting layer is particularly large, an electron mobility is preferably at least $10^{-5}$ cm$^2$/V·s or more upon application of an electric field of $10^4$ to $10^6$ V/cm in order to avoid an increase in voltage.

A metal complex of 8-hydroxyquinoline or of a derivative of 8-hydroxyquinoline, or an oxadiazole derivative is suitable as a material to be used in the electron injecting layer. Specific examples of the metal complex of 8-hydroxyquinoline or of the derivative of 8-hydroxyquinoline that can be used as an electron injecting material include metal chelate oxynoid compounds each containing a chelate of oxine (generally 8-quinolinol or 8-hydroxyquinoline), such as tris (8-quinolinol) aluminum.

On the other hand, examples of the oxadiazole derivative include electron transfer compounds represented by the following general formula:

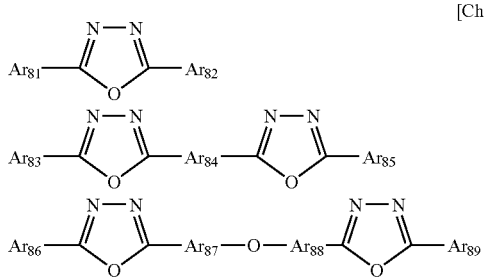

[Chem 41]

where $Ar_{81}$, $Ar_{82}$, $Ar_{83}$, $Ar_{85}$, $Ar_{86}$ and $Ar_{89}$ each represent a substituted or unsubstituted aryl group and may represent the same group or different groups; and $Ar_{84}$, $Ar_{87}$ and $Ar_{88}$ each represent a substituted or unsubstituted arylene group and may represent the same group or different groups.

Examples of the aryl group include a phenyl group, a biphenylyl group, an anthryl group, a perylenyl group, and a pyrenyl group. Examples of the arylene group include a phenylene group, a naphthylene group, a biphenylylene group, an anthrylene group, a perylenylene group, and a pyrenylene group. Examples of the substituent include alkyl groups each having 1 to 10 carbon atoms, alkoxyl groups each having 1 to 10 carbon atoms, and a cyano group. As the electron transfer compound, compounds having a property of being capable of forming which thin films are preferable.

Specific examples of the electron transfer compounds described above include the following.

[Chem 42]

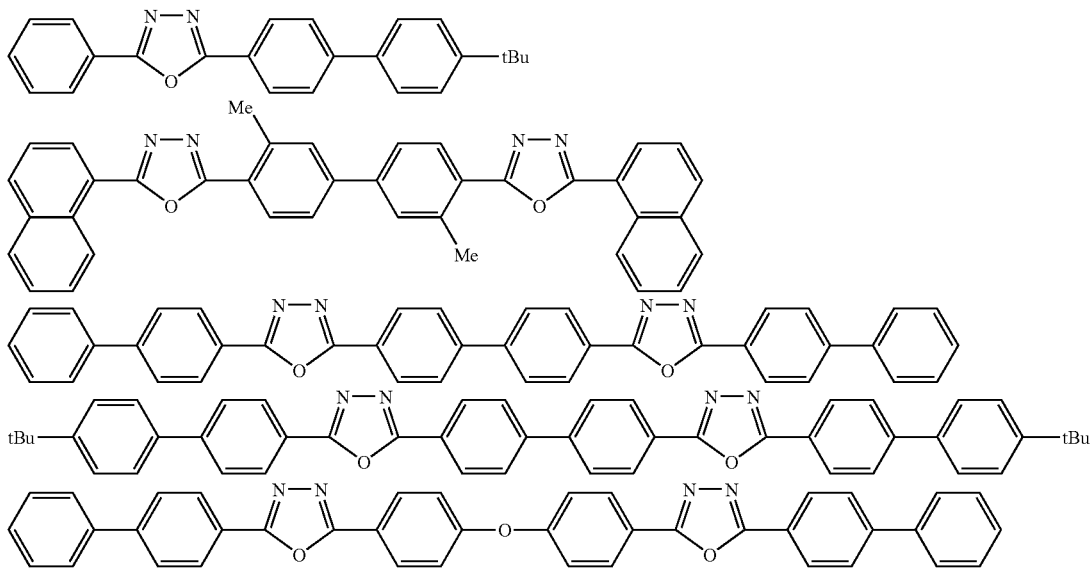

Further, a nitrogen-containing heterocyclic derivative represented by the following formula is preferably used as a material used in an electron injecting layer and an electron transporting layer (in particular an electron transporting layer) of the organic EL device of the present invention. As compared to any other electron transporting material (such as Alq), each of the following nitrogen-containing heterocyclic derivatives, when used in combination with the aromatic amine derivative according to the present invention, can improve the effects of the present invention, i.e., an improvement in efficiency of the device and a reduction in voltage at which the device is driven:

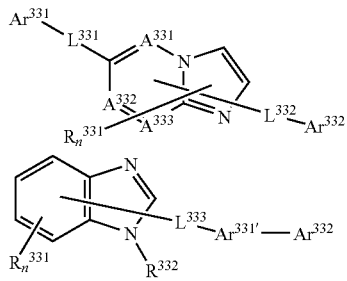

[Chem 43]

where:
$A^{331}$ to $A^{333}$ each represent a nitrogen atom or a carbon atom, $R^{331}$ and $R^{332}$ each represent a substituted or unsubstituted aryl group having 6 to 60 atoms forming a ring, a substituted or unsubstituted heteroaryl group having 3 to 60 atoms forming a ring, an alkyl group having 1 to 20 carbon atoms, a haloalkyl group having 1 to 20 carbon atoms, or alkoxy group having 1 to 20 carbon atoms, n represents an integer of 0 to 5, and, when n represents an integer of 2 or more, multiple $R^{331}$'s may be identical to or different from each other, and multiple $R^{331}$'s adjacent to each other may be bonded to each other to form a substituted or unsubstituted, carbocyclic aliphatic ring, or a substituted or unsubstituted, carbocyclic aromatic ring;

$Ar^{331}$ represents a substituted or unsubstituted aryl group having 6 to 50 atoms forming a ring, or a substituted or unsubstituted heteroaryl group having 3 to 60 atoms forming a ring;

$Ar^{331'}$ represents a substituted or unsubstituted arylene group having 6 to 60 atoms forming a ring, or a substituted or unsubstituted heteroarylene group having 3 to 60 atoms forming a ring;

$Ar^{332}$ represents a hydrogen atom, an alkyl group having 1 to 20 carbon atoms, a haloalkyl group having 1 to 20 carbon atoms, an alkoxy group having 1 to 20 carbon atoms, a substituted or unsubstituted aryl group having 6 to 60 atoms forming a ring, or a substituted or unsubstituted heteroaryl group having 3 to 60 atoms forming a ring, provided that one of $Ar^{331}$ and $Ar^{332}$ represents a substituted or unsubstituted fused ring group having 10 to 60 atoms forming a ring, or a substituted or unsubstituted heterocyclic fused ring group having 3 to 60 atoms forming a ring; and $L^{331}$, $L^{332}$, and $L^{333}$ each represent a single bond, a substituted or unsubstituted arylene group having 6 to 60 atoms forming a ring, a substituted or unsubstituted divalent heterocyclic fused ring having 3 to 50 atoms forming a ring, or a substituted or unsubstituted fluorenylene group.

Other electron transporting materials include the following. In other words,

   (C)

representing a nitrogen-containing heterocyclic derivative, where HAr represents a nitrogen-containing heterocyclic ring which has 3 to 40 carbon atoms and may have a substituent; L represents a single bond, an arylene group which has 6 to 60 carbon atoms and may have a substituent, a heteroarylene group which has 3 to 60 carbon atoms and may have a substituent, or a fluorenylene group which may have a substituent; $Ar^{1a}$ represents a divalent aromatic hydrocarbon group which has 6 to 60 atoms forming a ring and may have a substituent; and $Ar^{2a}$ represents an aryl group which has 6 to 60 atoms forming a ring and may have a substituent, or a heteroaryl group which has 3 to 60 carbon atoms and may have a substituent;

[Chem 44]

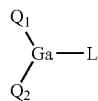   (F)

representing a ligand, where $Q^1$ and $Q^2$ each represent a ligand represented by the following formula (G); and L represents a ligand represented by a halogen atom, a substituted or unsubstituted alkyl group, a substituted or unsubstituted cycloalkyl group, a substituted or unsubstituted aryl group, a substituted or unsubstituted heterocyclic group, —$OR^1$ where $R^1$ represents a hydrogen atom, a substituted or unsubstituted alkyl group, a substituted or unsubstituted cycloalkyl group, a substituted or unsubstituted aryl group, or a substituted or unsubstituted heterocyclic group, or a ligand represented by —O—Ga-$Q^3$ ($Q^4$) where $Q^3$ and $Q^4$ have the same meaning as $Q^1$ and $Q^2$, respectively:

[Chem 45]

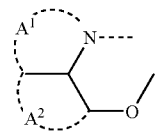   (G)

where rings $A^1$ and $A^2$ are six-membered aryl ring structures which are fused with each other and each of which may have a substituent.

The metal complex behaves strongly as an n-type semiconductor, and has a large electron injecting ability. Further, generation energy upon formation of the complex is low. As a result, the metal and the ligand of the formed metal complex are bonded to each other so strongly that the fluorescence quantum efficiency of the complex as a light emitting material improves.

Specific examples of a substituent in the rings $A^1$ and $A^2$ which each form a ligand of the formula (G) include: halogen atoms such as chlorine, bromine, iodine, or fluorine; substituted or unsubstituted alkyl groups such as a methyl group, an ethyl group, a propyl group, a butyl group, an s-butyl group, a t-butyl group, a pentyl group, a hexyl group, a heptyl group, an octyl group, a stearyl group, or a trichloromethyl group; substituted or unsubstituted aryl groups such as a phenyl group, a naphthyl group, a 3-methylphenyl group, a 3-methoxyphenyl group, a 3-fluorophenyl group, a 3-trichloromethylphenyl group, a 3-trifluoromethylphenyl group, or a 3-nitrophenyl group; substituted or unsubstituted alkoxy groups such as a methoxy group, an n-butoxy group, a t-butoxy group, a trichloromethoxy group, a trifluoroethoxy group, a pentafluoropropoxy group, a 2,2,3,3-tetrafluoropropoxy group, a 1,1,1,3,3,3-hexafluoro-2-propoxy group, or a 6-(perfluoroethyl)hexyloxy group; substituted or unsubstituted aryloxy groups such as a phenoxy group, a p-nitrophenoxy group, a p-t-butylphenoxy group, a 3-fluorophenoxy group, a pentafluorophenyl group, or a 3-trifluoromethylphenoxy group; substituted or unsubstituted alkylthio groups such as a methylthio group, an ethylthio group, a t-butylthio group, a hexylthio group, an octylthio group, or a trifluoromethylthio group; substituted or unsubstituted arylthio groups such as a phenylthio group, a p-nitrophenylthio group, a p-t-butylphenylthio group, a 3-fluorophenylthio group, a pentafluorophenylthio group, or a 3-trifluoromethylphenylthio group; monosubstituted or di-substituted amino groups such as a cyano group, a nitro group, an amino group, a methylamino group, a diethylamino group, an ethylamino group, a diethylamino group, a dipropylamino group, a dibutylamino group, or a diphenylamino group; acylamino groups such as a bis(acetoxymethyl)amino group, a bis(acetoxyethyl)amino group, a bis(acetoxypropyl)amino group, or a bis(acetoxybutyl) amino group; a hydroxyl group; a siloxy group; an acyl group; carbamoyl groups such as a methylcarbamoyl group, a dimethylcarbamoyl group, an ethylcarbamoyl group, a diethylcarbamoyl group, a propylcarbamoyl group, a butylcarbamoyl group, or a phenylcarbamoyl group; a carboxylic acid group; a sulfonic acid group; an imide group; cycloalkyl groups such as a cyclopentane group or a cyclohexyl group; aryl groups such as a phenyl group, a naphthyl group, a biphenylyl group, an anthryl group, a phenanthryl group, a fluorenyl group, or a pyrenyl group; and heterocyclic groups such as a pyridinyl group, a pyrazinyl group, a pyrimidinyl group, a pyridazinyl group, a triazinyl group, an indolinyl group, a quinolinyl group, an acridinyl group, a pyrrolidinyl group, a dioxanyl group, a piperidinyl group, a morpholidinyl group, a piperazinyl group, a carbazolyl group, a furanyl group, a thiophenyl group, an oxazolyl group, an oxadiazolyl group, a benzoxazolyl group, a thiazolyl group, a thiadiazolyl group, a benzothiazolyl group, a triazolyl group, an imidazolyl group, a benzoimidazolyl group, or a puranyl group. In addition, the above-mentioned substituents may be bonded to each other to further form a six-membered aryl ring or a heterocycle.

In addition to the foregoing, a nitrogen-containing heterocyclic derivative represented by the following formula can also be used.

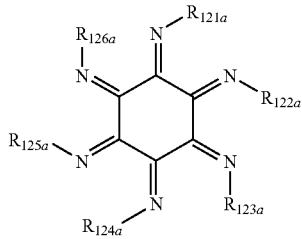

[Chem 46]

In the above formula, $R_{121a}$ to $R_{126a}$ each represent a substituted or unsubstituted alkyl group, a substituted or unsubstituted aryl group, a substituted or unsubstituted aralkyl group, or a substituted or unsubstituted heterocyclic group; provided that $R_{121a}$ to $R_{126a}$ may be identical to or different from one another, and $R_{121a}$ and $R_{122a}$, $R_{123a}$ and $R_{124a}$, $R_{125a}$ and $R_{126a}$, $R_{121a}$ and $R_{126a}$, $R_{122a}$ and $R_{123a}$, or $R_{124a}$ and $R_{125a}$ may form a fused ring.

Further, a compound represented by the following formula can also be used.

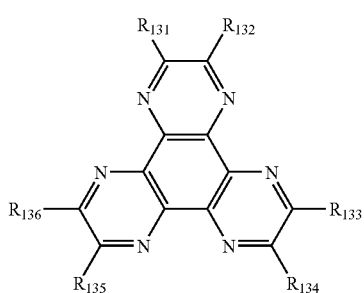

[Chem 47]

In the above formula, $R_{131}$ to $R_{136}$ each represent a substituent, and the substituent is preferably an electron-withdrawing group such as a cyano group, a nitro group, a sulfonyl group, a carbonyl group, a trifluoromethyl group, or a halogen.

Such acceptor materials as typified by those materials can also be used as hole injecting materials. Specific examples of the materials are as described above.

Further, in addition to the above aromatic dimethylidene-based compound exemplified as a material for the light emitting layer, an inorganic compound such as p-type Si or p-type SiC can also be used as a material for each of the hole injecting layer and the hole transporting layer.

A preferable embodiment of the organic EL device of the present invention includes an element including a reducing dopant in the region of electron transport or in the interfacial region of the cathode and the organic layer. Here, the reducing dopant is defined as a substance which can reduce a compound having the electron transporting property. Therefore, various compounds can be used as the reducing dopant as long as the compounds have a uniform reductive property. For example, at least one substance selected from the group consisting of alkali metals, alkaline earth metals, rare earth metals, alkali metal oxides, alkali metal halides, alkaline earth metal oxides, alkaline earth metal halides, rare earth metal oxides, rare earth metal halides, organic complexes of alkali metals, organic complexes of alkaline earth metals, and organic complexes of rare earth metals can be suitably used.

More specifically, particularly preferable examples of the reducing dopant include substances having a work function of 2.9 eV or smaller, and specific examples of which include at least one alkali metal selected from the group consisting of Li (the work function: 2.9 eV), Na (the work function: 2.36 eV), K (the work function: 2.28 eV), Rb (the work function: 2.16 eV), and Cs (the work function: 1.95 eV) and at least one alkaline earth metal selected from the group consisting of Ca (the work function: 2.9 eV), Sr (the work function: 2.0 to 2.5 eV), and Ba (the work function: 2.52 eV). Of those, at least one alkali metal selected from the group consisting of K, Rb, and Cs is more preferable, Rb and Cs are still more preferable, and Cs is most preferable as the reducing dopant. In particular, those alkali metals have great reducing ability, and the luminance of the emitted light and the lifetime of the organic EL device can be increased by addition of a relatively small amount of the alkali metal into the electron injecting zone. As the reducing dopant having a work function of 2.9 eV or smaller, combinations of two or more alkali metals thereof are also preferable. Combinations having Cs such as the combinations of Cs and Na, Cs and K, Cs and Rb, and Cs, Na, and K are particularly preferable. The reducing ability can be efficiently exhibited by the combination having Cs. The luminance of emitted light and the lifetime of the organic EL device can be increased by adding the combination having Cs into the electron injecting zone.

The present invention may further include an electron injecting Layer which is formed of an insulating material or a semiconductor and disposed between the cathode and the organic layer. At this time, the electron injecting property can be improved by preventing a leak of electric current effectively. As the insulating material, at least one metal compound selected from the group consisting of alkali metal chalcogenides, alkaline earth metal chalcogenides, alkali metal halides, and alkaline earth metal halides is preferable. It is preferable that the electron injecting layer be formed of the above-mentioned substance such as the alkali metal chalcogenide because the electron injecting property can be further improved. Preferable examples of the alkali metal chalcogenides include $Li_2O$, $K_2O$, $Na_2S$, $Na_2Se$, and $Na_2O$. To be specific, preferable examples of the alkaline earth metal chalcogenides include CaO, BaO, SrO, BeO, BaS, and CaSe. Preferable examples of the alkali metal halides include LiF, NaF, KF, LiCl, KCl, and NaCl. Preferable examples of the alkaline earth metal halides include fluorides such as $CaF_2$, $BaF_2$, $SrF_2$, $MgF_2$, and $BeF_2$ and halides other than the fluorides.

Examples of the semiconductor forming the electron transporting layer include a single kind of oxides, nitrides, and oxide nitrides containing at least one element selected from Ba, Ca, Sr, Yb, Al, Ga, In, Li, Na, Cd, Mg, Si, Ta, Sb, and Zn or a combination of two or more kinds. It is preferable that the inorganic compound forming the electron transporting layer form a crystallite or amorphous insulating thin film. When the electron transporting layer is formed of the insulating thin film described above, a more uniform thin film can be formed, and defects of pixels such as dark spots can be decreased. Note that, examples of the inorganic compounds include alkali metal chalcogenides, alkaline earth metal chalcogenides, alkali metal halides, and alkaline earth metal halides which were described above.

(7) Cathode

As the cathode, a material such as a metal, an alloy, an electroconductive compound, or a mixture of those materials which has a small work function (4 eV or smaller) is used as an electrode material because the cathode is used for injecting electrons to the electron injecting/transporting layer or the light emitting layer. Specific examples of the electrode material include sodium, sodium-potassium alloys, magnesium, lithium, magnesium-silver alloys, aluminum/aluminum oxide, aluminum-lithium alloys, indium, and rare earth metals.

The cathode can be prepared by forming a thin film of the electrode material described above in accordance with a process such as the vapor deposition process or the sputtering process.

When the light emitted from the light emitting layer is obtained through the cathode, it is preferable that the cathode have a transmittance of higher than 10% with respect to the emitted light.

It is also preferable that the sheet resistivity of the cathode be several hundred $\Omega/\square$ or smaller. The thickness of the cathode is, in general, selected in the range of 10 nm to 1 μm and preferably in the range of 50 to 200 nm.

(8) Insulating Layer

Defects in pixels tend to be formed in organic EL device due to leak and short circuit because an electric field is applied to ultra-thin films. In order to prevent the formation of the defects, a layer of a thin film having an insulating property is preferably inserted between the pair of electrodes.

Examples of the material used for the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide. Mixtures and laminates of the above-mentioned compounds may also be used.

(9) Method of Producing Organic EL Device

In order to prepare the organic EL device, the anode and the light emitting layer, and, where necessary, the hole injecting/transporting layer and the electron injecting/transporting layer are formed in accordance with the illustrated process using the illustrated materials, and the cathode is formed in the last step. The organic EL device may also be prepared by forming the above-mentioned layers in the order reverse to the order described above, i.e., the cathode being formed in the first step and the anode in the last step.

Hereinafter, an embodiment of the process for preparing an organic EL device having a construction in which an anode, a hole injecting layer, a light emitting layer, an electron injecting layer, and a cathode are disposed successively on a light-transmissive substrate is described.

First, on a suitable light-transmissive substrate, a thin film made of a material for the anode is formed in accordance with a process such as the vapor deposition process or the sputtering process so that the thickness of the formed thin film is 1 μm or smaller and preferably in the range of 10 to 200 nm. The formed thin film is used as the anode. Then, a hole injecting layer is formed on the anode. The hole injecting layer can be formed in accordance with a process such as the vacuum vapor deposition process, the spin coating process, the casting process, or the LB process, as described above. The vacuum vapor deposition process is preferable because, for example, a uniform film can be easily obtained and the possibility of formation of pin holes is small. When the hole injecting layer is formed in accordance with the vacuum vapor deposition process, in general, it is preferable that the conditions be suitably selected in the following ranges: the temperature of the source of the deposition: 50 to 450° C.; the vacuum: $10^{-7}$ to $10^{-3}$ Torr; the rate of deposition: 0.01 to 50 nm/second; the temperature of the substrate: −50 to 300° C.; and the thickness of the film: 5 nm to 5 μm although the conditions of the vacuum vapor deposition are different depending on the compound to be used (i.e., material for the hole injecting layer) and the crystal structure and the recombination structure of the target hole injecting layer.

Then, when the light emitting layer is formed on the hole injecting layer, a thin film of the organic light emitting material can be formed by using a desired organic light emitting material in accordance with a process such as the vacuum vapor deposition process, the sputtering process, the spin coating process, or the casting process, and the formed thin film is used as the light emitting layer. The vacuum vapor deposition process is preferable because, for example, a uniform film can be easily obtained and the possibility of formation of pin holes is small. When the light emitting layer is formed in accordance with the vacuum vapor deposition process, in general, the conditions of the vacuum vapor deposition process can be selected from the same ranges as the conditions described for the vacuum vapor deposition of the hole injecting layer, although the conditions are different depending on the compounds to be used.

Next, an electron injecting layer is formed on the light emitting layer. Similarly to the hole injecting layer and the light emitting layer, it is preferable that the electron injecting layer be formed in accordance with the vacuum vapor deposition process because a uniform film must be obtained. The conditions of the vacuum vapor deposition can be selected from the same ranges as the conditions described for the vacuum vapor deposition of the hole injecting layer and the light emitting layer.

When the vapor deposition process is used, the aromatic amine derivative of the present invention can be deposited by vapor in combination with other materials, although the situation may be different depending on which layer in the light emitting zone or in the hole transporting zone includes the derivative. When the spin coating process is used, the derivative can be incorporated into the formed layer by using a mixture of the derivative with other materials.

A cathode is laminated in the last step, and an organic EL device can be obtained.

The cathode is formed of a metal and can be formed in accordance with the vacuum vapor deposition process or the sputtering process. However, it is preferable that the vacuum vapor deposition process be used in order to prevent formation of damages on the lower organic layers during the formation of the film.

In the above-mentioned preparation of the organic EL device, it is preferable that the above-mentioned layers from the anode to the cathode be formed successively while the preparation system is kept in a vacuum after being evacuated once.

The method of forming the layers in the organic EL device of the present invention is not particularly limited. A conventionally known formation process such as the vacuum vapor deposition process or the spin coating process can be used. The organic thin film layer which is used in the organic EL device of the present invention and includes the compound represented by the formula (1) described above can be formed in accordance with a known process such as the vacuum vapor deposition process or the molecular beam epitaxy process (MBE process) or, using a solution prepared by dissolving the compounds into a solvent, in accordance with a coating process such as the dipping process, the spin coating process, the casting process, the bar coating process, or the roll coating process.

The thickness of each organic layer in the organic EL device of the present invention is not particularly limited. In general, an excessively thin layer tends to have defects such as pin holes, whereas an excessively thick layer requires a high applied voltage to decrease the efficiency. Therefore, a thickness in the range of several nanometers to 1 μm is usually preferable.

Note that, when a direct voltage is applied to the organic EL device, light emission can be observed when a voltage of 5 to 40 V is applied in the condition that the polarity of the anode is positive (+) and the polarity of the cathode is negative (−). When applying a voltage while the polarity is reversed, no electric current is observed and no light is emitted at all. When an alternating voltage is applied to the organic EL device, the uniform light emission is observed only in the condition that the polarity of the anode is positive and the polarity of the cathode is negative. When an alternating voltage is applied to the organic EL device, any type of wave shape can be used.

EXAMPLES

Hereinafter, the present invention is described specifically by way of examples. However, the present invention is not limited to those examples.

Synthesis Example 1

Synthesis of Following Compound X1

Under an argon stream, to a 50-L reaction container, 750 g of phenylboronic acid, 1,000 g of 2-bromothiophene, 142 g of tetrakis(triphenylphosphine) palladium (Pd (PPh$_3$)$_4$), 9 L of 2 M sodium carbonate (Na$_2$CO$_3$) solution, and 15 L of dimethoxyethane were charged, and the mixture was reacted at 80° C. for 8 hours. The reactant was subjected to extraction with toluene and water, followed by drying with anhydrous sodium sulfate. The resultant was concentrated under reduced pressure, and the obtained coarse product was subjected to column purification, whereby 786 g of white powder were obtained.

Under an argon stream, to a 20-L reaction container, 786 g of the compound obtained in the foregoing and 8 L of dimethylformamide (DMF) were charged, followed by adding slowly 960 g of N-bromosuccinimide (NBS), and the mixture was reacted at room temperature for 12 hours. The reactant was subjected to extraction with hexane and water, followed by drying with anhydrous sodium sulfate. The resultant was concentrated under reduced pressure, and the obtained coarse product was subjected to column purification, whereby 703 g of white powder were obtained.

Under an argon stream, to a 20-L reaction container, 703 g of the compound obtained in the foregoing and 7 L of dehydrated tetrahydro furan (THF) were charged, and the mixture was cooled to −30° C. 2.3 L of n-butyl lithium (n-BuLi) (1.6 M hexane solution) was added thereto, and the mixture was reacted for 1 hour. After the resultant was cooled to −70° C., 1,658 g of boric acid triisopropyl (manufactured by Tokyo Chemical Industry Co., Ltd.) were added thereto. The temperature of the mixture was raised slowly, and the mixture was stirred at room temperature for 1 hour. 1.7 L of 10%-hydrochloric acid solution were added thereto and the mixture was stirred. The mixture was subjected to extraction with ethyl acetate and water, and an organic layer was washed with water. The resultant was dried with anhydrous sodium sulfate to thereby distill off the solvent. The resultant was washed with hexane, whereby 359 g of white powder were obtained.

Under an argon stream, to a 20-L reaction container, 506 g of the compound obtained in the foregoing (5-phenyl-2-thiopheneboronic acid), 600 g of 4-iodobromobenzene, 41 g of tetrakis(triphenylphosphine) palladium (Pd (PPh$_3$)$_4$), 2.6 L of a 2 M sodium carbonate (Na$_2$CO$_3$) solution, and 10 L of dimethoxyethane were charged, and the mixture was reacted at 80° C. for 8 hours. The reactant was subjected to extraction with toluene and water, followed by drying with anhydrous sodium sulfate. The resultant was concentrated under reduced pressure, and the obtained coarse product was subjected to column purification, whereby 277 g of white powder were obtained.

Under an argon stream, 3.4 g of N,N'-diphenylbenzidine, 6.6 g of the compound obtained in the foregoing, 2.6 g of t-butoxy sodium (manufactured by Hiroshima Wako Co., Ltd.), 92 mg of tris (dibenzylideneacetone)dipalladium(0) (manufactured by Sigma-Aldrich Co.), 42 mg of tri-t-butylphosphine, and 100 mL of dehydrated toluene were charged, and the mixture was reacted at 80° C. for 8 hours.

After the reactant was cooled, 500 mL of water were added thereto, and the mixture was filtered with celite. The filtrate was subjected to extraction with toluene and the resultant was dried with anhydrous magnesium sulfate. The resultant was concentrated under reduced pressure, and the obtained coarse product was subjected to column purification. The purified product was recrystallized with toluene, followed by filtration and drying, whereby 4.0 g of pale yellow powder were obtained. By a field desorption mass spectrometry (FD-MS) analysis, the pale yellow powder was identified as Compound X1.

Synthesis Example 2

Synthesis of Compound Y1-1 Shown Below

First, 17.7 g of 9-phenylcarbazole, 6.03 g of potassium iodide, 7.78 g of potassium iodate, 5.90 mL of sulfuric acid, and ethanol were loaded, and the mixture was subjected to a reaction at 75° C. for 2 hours. After the resultant had been cooled, clean water and ethyl acetate were added to the resultant, and the mixture was subjected to separation and extraction. After that, the organic layer was washed with baking soda water and clean water, and was then concentrated. The resultant coarse product was purified by silica gel chromatography (toluene), and the resultant solid was dried under reduced pressure. As a result, 21.8 g of a white solid were obtained.

Then, 21.8 g of the compound obtained in the foregoing, 11.8 g of 4-bromophenylboronic acid, 1.38 g of Pd(PPh$_3$)$_4$, 21.9 g of sodium carbonate, clean water, and dimethoxyethane were loaded, and the mixture was subjected to a reaction under reflux for 8 hours. After having been cooled, the reaction solution was filtrated, and the filtration residue and the separated water layer were extracted with acetone and dichloromethane, respectively. The collected filtrate was separated, and acetone and dichloromethane were added to the resultant. The resultant was separated, and the filtration residue and the separated water layer were extracted with acetone and dichloromethane, respectively. The collected organic layer was washed with clean water and concentrated, and the resultant coarse product was purified by silica gel chromatography (hexane:dichloromethane=9:1). The resultant solid was recrystallized with toluene and methanol, and was then dried under reduced pressure. As a result, 4.18 g of a white solid were obtained.

In a stream of argon, 4.8 g of N-phenyl-1-naphthylamine, 8.0 g of the compound obtained in the foregoing, 231 mg of Pd$_2$ (dba)$_3$, 325 mg of P (t-Bu)$_3$, 2.9 g of tertiary butoxysodium, and toluene were loaded, and the mixture was subjected to a reaction at 80° C. for 4 hours. After the resultant had been cooled, toluene was added to the resultant, and the mixture was subjected to celite filtration. After that, the filtrate was concentrated and purified by silica gel chromatography (hexane:dichloromethane=6:1). The resultant solid was washed with n-hexane and dried under reduced pressure. As a result, 8.96 g of a yellowish white solid were obtained. FD-MS analysis identified the solid as Compound Y1-1.

Example 1

A glass substrate with an ITO transparent electrode measuring 25 mm wide by 75 mm long by 1.1 mm thick (manufactured by Asahi Glass) was subjected to ultrasonic cleaning in isopropyl alcohol for 5 minutes. After that, the substrate was subjected to UV ozone cleaning for 30 minutes.

The glass substrate with the transparent electrode line after the washing was mounted on a substrate holder of a vacuum deposition device. First, the following Compound X1 was formed, by resistance heating, into a film having a thickness of 120 nm on the surface on the side where the transparent electrode line was formed to cover the transparent electrode. The X1 film functions as a hole injecting layer.

Subsequent to the formation of the hole injecting layer, Compound Y1-1 shown below was formed into a film having a thickness of 20 nm on the layer by resistance heating. The Y1-1 film functions as a hole transporting layer.

Further, Compound H1 as a host material and Compound D1 as a fluorescent material were co-deposited from the vapor onto the hole transporting layer by resistance heating so as to serve as a co-deposited film having a thickness of 20 nm. The concentration of Compound D1 was 7.5%. The co-deposited film functions as a light emitting layer.

Then, subsequent to the formation of the light emitting layer, Compound ET1 was formed into a film having a thickness of 30 nm. The ET1 film functions as an electron transporting layer.

Next, LiF was formed into a film having a thickness of 0.5 nm at a film formation rate of 0.1 Å/min to serve as an electron injectable electrode (cathode). Metal Al was deposited from the vapor onto the LiF film so that a metal cathode having a thickness of 150 nm might be formed. As a result, an organic EL device was produced.

[Chem 48]

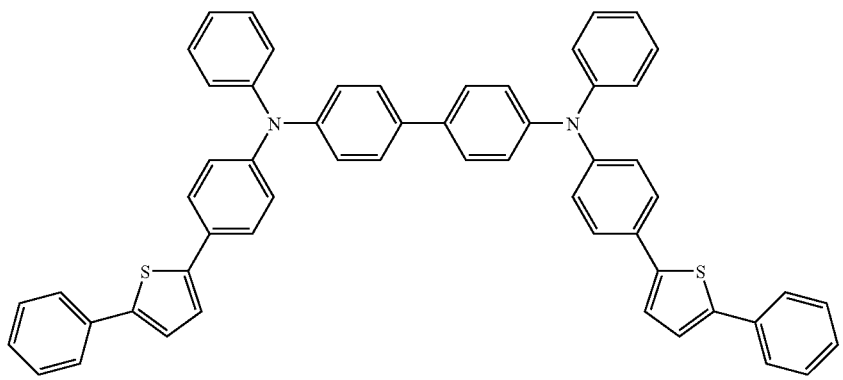

X1

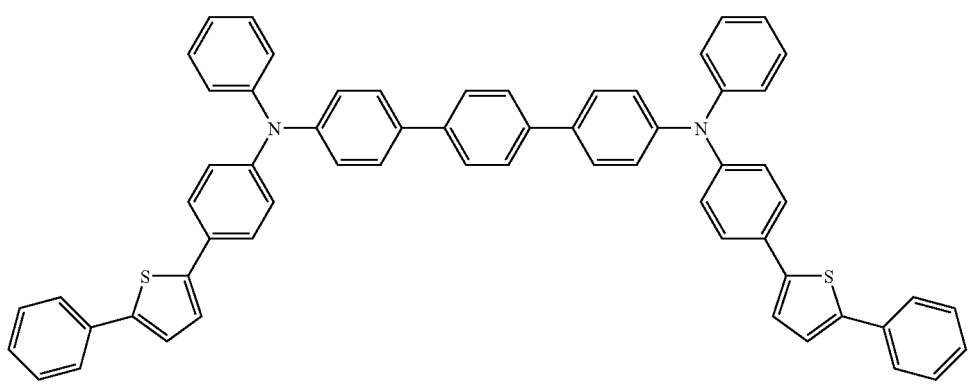

X2

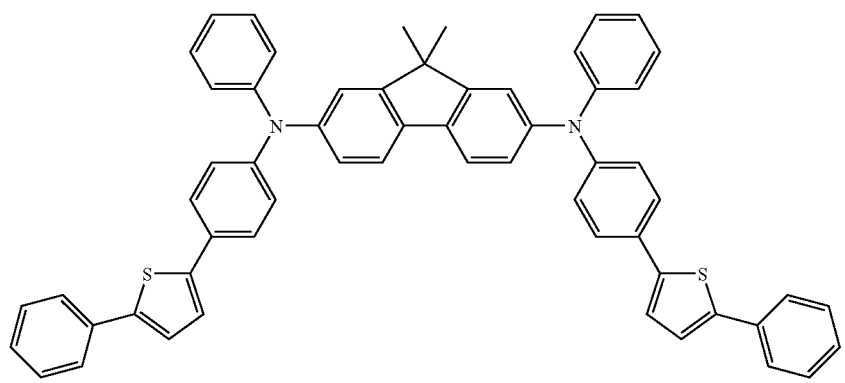
X3
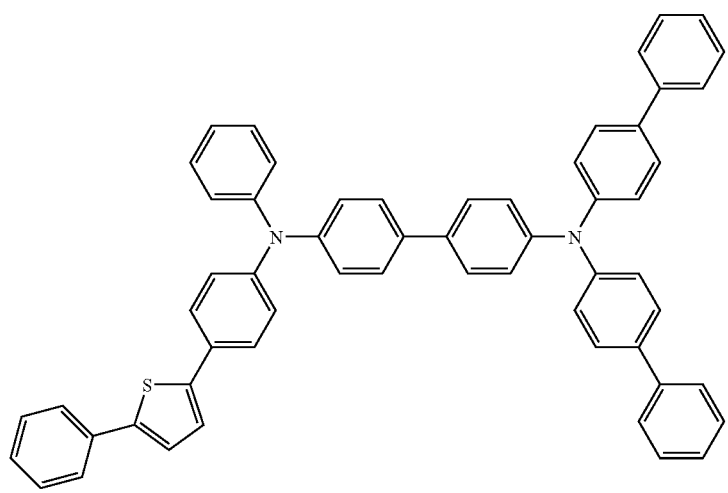
X4
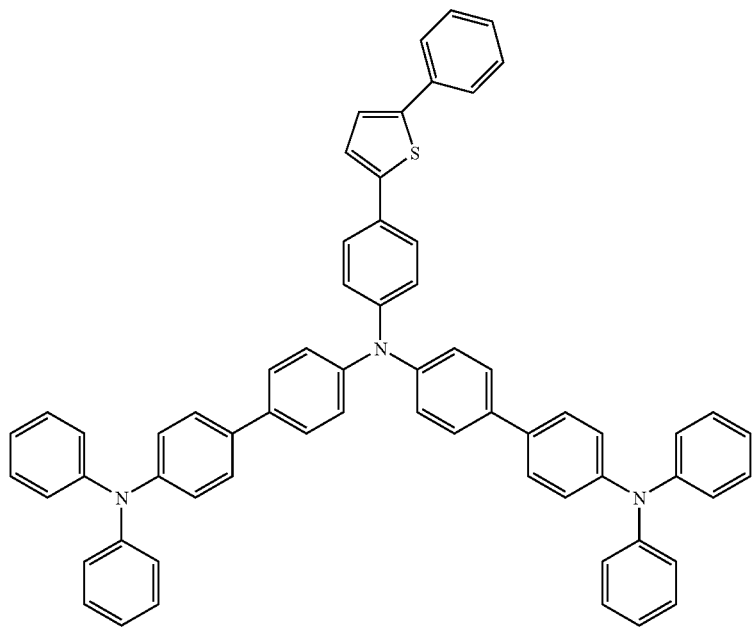
X5

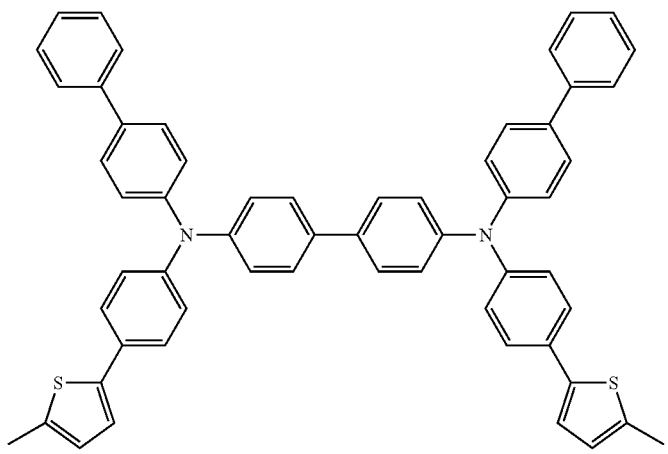
X6
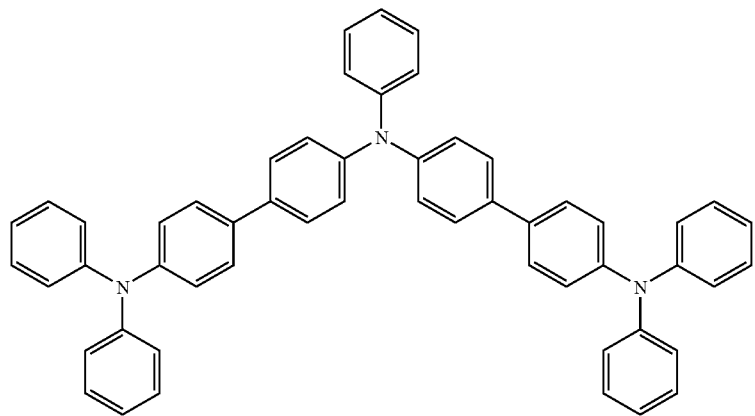
X7
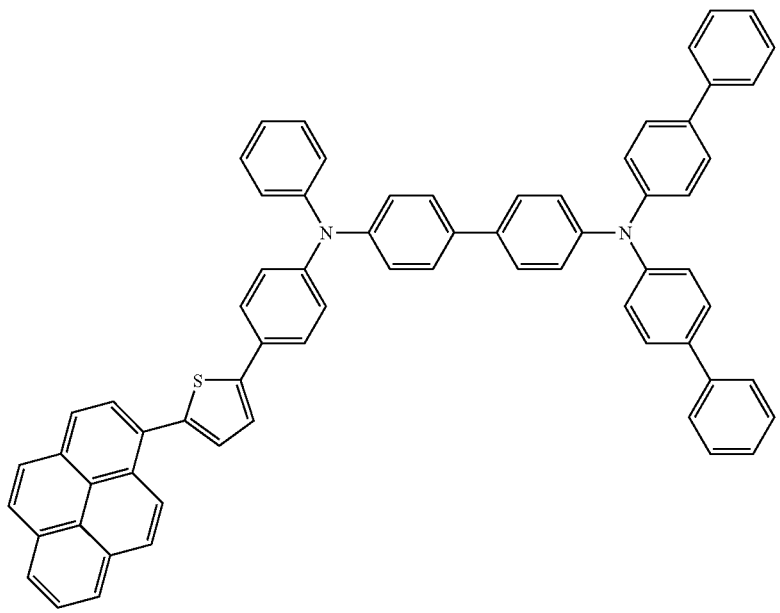
X8

-continued
Y1-1
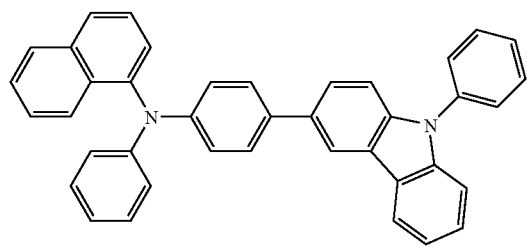
Y1-2
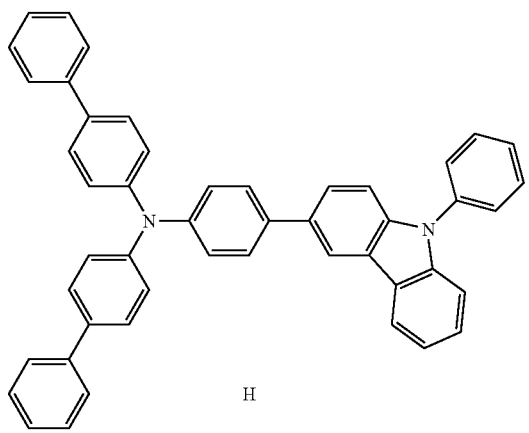
Y1-3
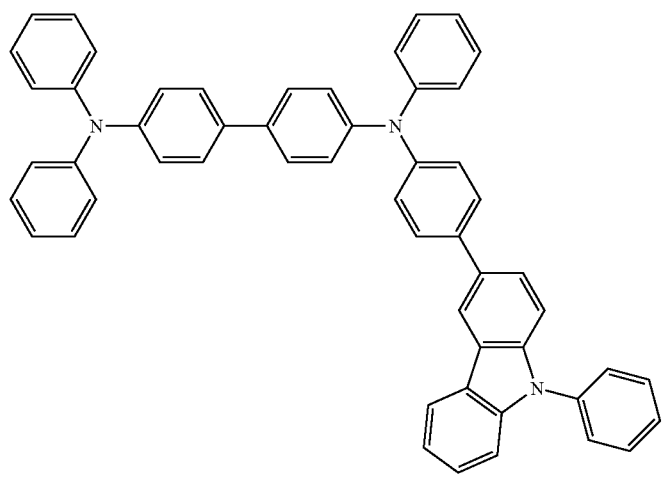
Y1-4
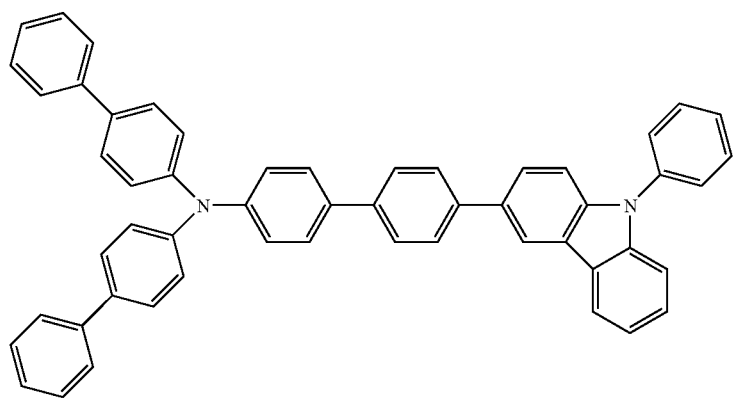

Y1-5
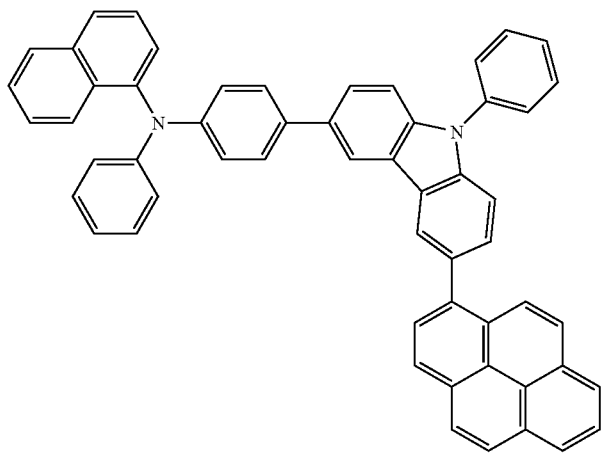
TBDB
[Chem 49]
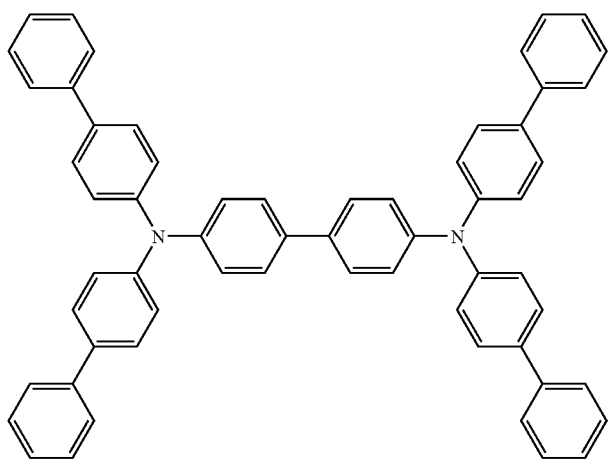
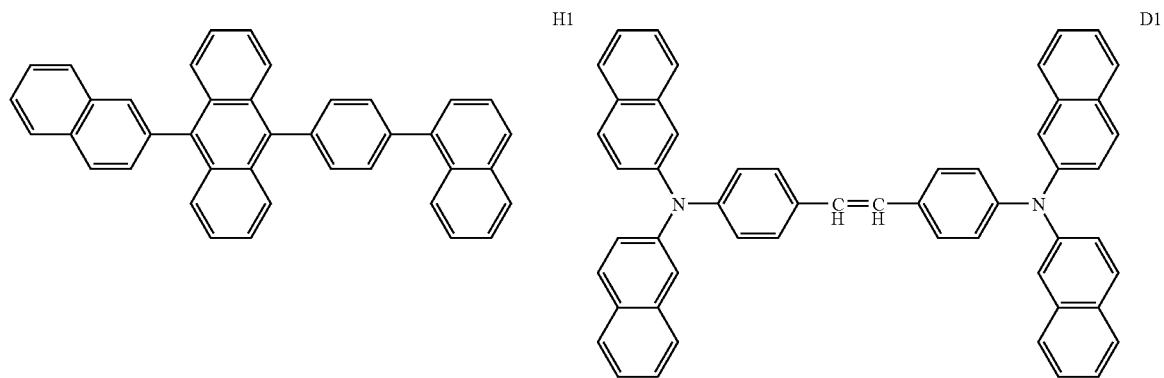

[Chem 50]

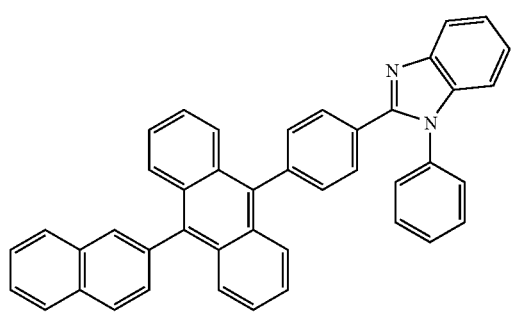
ET1

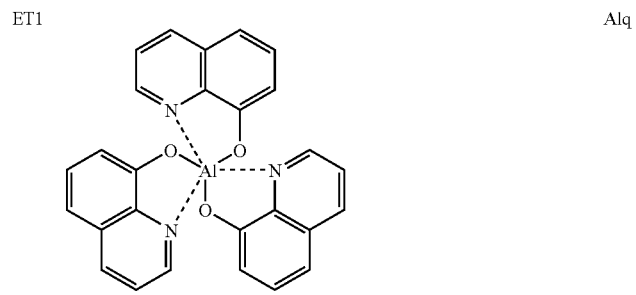
Alq

Examples 2 to 26

Organic EL devices were each produced in the same manner as in Example 1 except that materials shown in Table 1 below were used in the hole injecting layer, the hole transporting layer, and the electron transporting layer in Example 1.

Comparative Examples 1 to 3

Organic EL devices were each produced in the same manner as in Example 1 except that materials shown in Table 1 below were used in the hole injecting layer, the hole transporting layer, and the electron transporting layer in Example 1.

[Evaluation of Organic EL Device for Characteristics and Lifetime]

Table 1 below shows the voltage at which each of the organic EL devices produced as described above is driven at 10 mA/cm$^2$ and the current efficiency of the device at 10 mA/cm$^2$.

TABLE 1

|  | Hole injecting layer | Hole transporting layer | Light emitting layer | Electron transporting layer |
|---|---|---|---|---|
| Example 1 | X1 | Y1-1 | H1:D1 | ET1 |
| Example 2 | X2 | Y1-1 | H1:D1 | ET1 |
| Example 3 | X3 | Y1-1 | H1:D1 | ET1 |
| Example 4 | X4 | Y1-1 | H1:D1 | ET1 |
| Example 5 | X5 | Y1-1 | H1:D1 | ET1 |
| Example 6 | X6 | Y1-1 | H1:D1 | ET1 |
| Example 7 | X1 | Y1-2 | H1:D1 | ET1 |
| Example 8 | X1 | Y1-3 | H1:D1 | ET1 |
| Example 9 | X1 | Y1-4 | H1:D1 | ET1 |
| Example 10 | X2 | Y1-2 | H1:D1 | ET1 |
| Example 11 | X2 | Y1-3 | H1:D1 | ET1 |
| Example 12 | X2 | Y1-4 | H1:D1 | ET1 |
| Example 13 | X1 | Y1-1 | H1:D1 | Alq |
| Example 14 | X2 | Y1-1 | H1:D1 | Alq |
| Comparative Example 1 | X7 | Y1-1 | H1:D1 | ET1 |
| Comparative Example 2 | X1 | TBDB | H1:D1 | ET1 |
| Comparative Example 3 | X1 | TBDB | H1:D1 | Alq |

TABLE 2

Performance at current density of 10 mA/cm$^2$

|  | Voltage at which device is driven (V) | Current efficiency (cd/A) | Luminescent color |
|---|---|---|---|
| Example 1 | 4.1 | 7.1 | Blue |
| Example 2 | 4.2 | 7.2 | Blue |
| Example 3 | 4.2 | 7.5 | Blue |
| Example 4 | 4.2 | 7.4 | Blue |
| Example 5 | 4.3 | 7.8 | Blue |
| Example 6 | 4.2 | 7.1 | Blue |
| Example 7 | 4.2 | 7.6 | Blue |
| Example 8 | 4.2 | 7.2 | Blue |
| Example 9 | 4.2 | 7.2 | Blue |
| Example 10 | 4.2 | 7.3 | Blue |
| Example 11 | 4.1 | 7.4 | Blue |
| Example 12 | 4.2 | 7.1 | Blue |
| Example 13 | 6.5 | 5.3 | Blue |
| Example 14 | 6.7 | 5.2 | Blue |
| Comparative Example 1 | 4.6 | 6.2 | Blue |
| Comparative Example 2 | 4.3 | 5.2 | Blue |
| Comparative Example 3 | 6.9 | 4.6 | Blue |

Example 15

An organic EL device was produced in the same manner as in Example 1 except the following. Materials shown in Table 3 were used in the hole injecting layer, the hole transporting layer, and the electron transporting layer in Example 1. Compound H1 as a host material and Compound D2 as a fluorescent green light emitting material were co-deposited from the vapor by resistance heating so as to serve as the light emitting layer. The concentration of Compound D2 was 7.5%. In addition, the thicknesses of the hole injecting layer, the hole transporting layer, the light emitting layer, and the electron transporting layer were set to 20 nm, 20 nm, 30 nm, and 30 nm, respectively.

Example 16

An organic EL device was produced in the same manner as in Example 1 except the following. Materials shown in Table 3 below were used in the hole injecting layer, the hole transporting layer, and the electron transporting layer in Example 1. Compound H2 as a host material and Compound D3 as a fluorescent red light emitting material were co-deposited from the vapor by resistance heating so as to serve as the light emitting layer. The concentration of Compound D3 was 1%.

In addition, the thicknesses of the hole injecting layer, the hole transporting layer, the light emitting layer, and the electron transporting layer were set to 20 nm, 20 nm, 50 nm, and 30 nm, respectively.

Comparative Example 4

Organic EL devices were each produced in the same manner as in Example 15 except that materials shown in Table 3 below were used in the hole injecting layer, the hole transporting layer, and the electron transporting layer in Example 15.

[Evaluation of Organic EL Device for Characteristics and Lifetime]

Table 4 below shows the voltage at which each of the organic EL devices produced as described above is driven at 10 mA/cm$^2$, the current efficiency of the device at 10 mA/cm$^2$, and the half lifetime of the device at 10 mA/cm$^2$.

[Chem 51]

H2

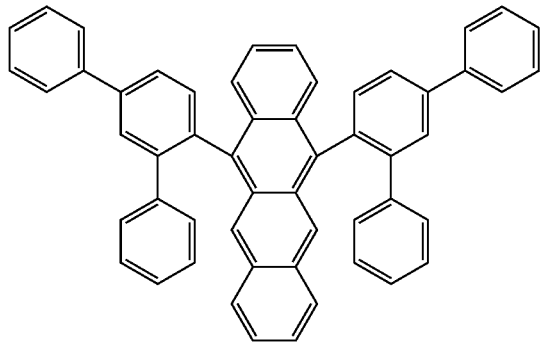

D2

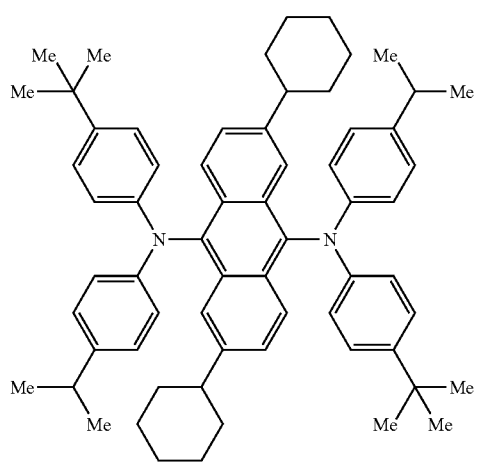

D3

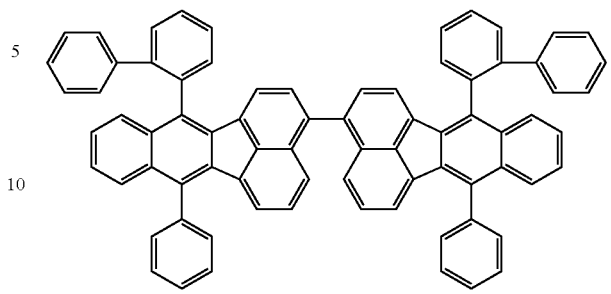

TABLE 3

| | Hole injecting layer | Hole transporting layer | Light emitting layer | Electron transporting layer |
|---|---|---|---|---|
| Example 15 | X1 | Y1-1 | H1:D2 | ET1 |
| Example 16 | X1 | Y1-1 | H2:D3 | ET1 |
| Comparative Example 4 | X1 | TBDB | H1:D2 | ET1 |

TABLE 4

| | Performance at current density of 10 mA/cm$^2$ | | |
|---|---|---|---|
| | Voltage at which device is driven (V) | Current efficiency (cd/A) | Luminescent color |
| Example 15 | 4.2 | 27.6 | Green |
| Example 16 | 3.3 | 11.1 | Red |
| Comparative Example 4 | 4.4 | 22.9 | Green |

Example 17 and Comparative Example 5

An organic EL device was produced in the same manner as in Example 1 except the following. Materials shown in Table 5 below were used in the hole injecting layer, the hole transporting layer, and the electron transporting layer in Example 1. Compound H3 as a host material and Compound D4 as a phosphorescent green light emitting material were co-deposited from the vapor by resistance heating (the concentration of Compound D4 was 10%) so as to serve as the light emitting layer. In addition, the thicknesses of the hole injecting layer, the hole transporting layer, the light emitting layer, and the electron transporting layer were set to 20 nm, 20 nm, 30 nm, and 30 nm, respectively.

[Evaluation of Organic EL Device for Characteristics and Lifetime]

Table 6 below shows the voltage at which each of the organic EL devices produced as described above is driven at 10 mA/cm$^2$, the current efficiency of the device at 10 mA/cm$^2$, and the half lifetime of the device at 10 mA/cm$^2$.

[Chem 52]

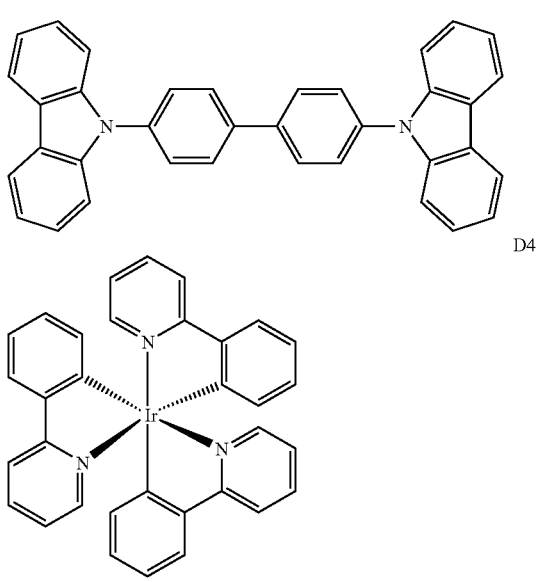

TABLE 5

| | Hole injecting layer | Hole transporting layer | Light emitting layer | Electron transporting layer |
|---|---|---|---|---|
| Example 17 | X1 | Y1-1 | H3:D4 | ET1 |
| Comparative Example 5 | X1 | TBDB | H3:D4 | ET1 |

TABLE 6

Performance at current density of 10 mA/cm$^2$

| | Voltage at which device is driven (V) | Current efficiency (cd/A) | Luminescent color |
|---|---|---|---|
| Example 17 | 4.5 | 65 | Green |
| Comparative Example 5 | 4.7 | 57 | Green |

As shown in Tables 2, 4, and 6, the following effect was obtained: the organic EL devices of Examples 1 to 17 each having a hole injecting layer and a hole transporting layer formed of the predetermined compounds of the present invention each had improved current efficiency as compared to that of each of the devices of Comparative Examples 1 to 5 as conventional organic EL devices.

The invention claimed is:

1. An organic electroluminescence device, comprising:
(a) an anode;
(b) a cathode; and
(c) organic thin film layers provided between the anode and the cathode,
wherein the organic thin film layers (c) comprise
(c1) a light emitting layer, and
(c2) a hole injecting layer and (c3) a hole transporting layer, or (c4) a hole injecting/transporting layer on a side which is closer to the anode (a) than the light emitting layer (c1) is,
wherein the hole injecting layer (c2) or the hole injecting/transporting layer (c4) comprises an aromatic amine derivative (i) comprising a substituent of formula (1):

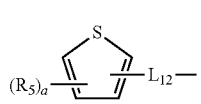
(1)

wherein $L_{12}$ is a substituted or unsubstituted arylene group comprising 6 to 60 atoms forming a ring, a substituted or unsubstituted fluorenylene group, or a substituted or unsubstituted heteroarylene group comprising 5 to 60 atoms forming a ring, and $R_5$ is a hydrogen atom, a substituted or unsubstituted aryl group comprising 5 to 14 atoms forming a ring, a substituted or unsubstituted aryloxy group comprising 5 to 14 atoms forming a ring, a substituted or unsubstituted arylthio group comprising 5 to 14 atoms forming a ring, a branched or linear, substituted or unsubstituted alkyl group comprising 1 to 6 carbon atoms, or a branched or linear, substituted or unsubstituted alkoxycarbonyl group comprising 1 to 6 carbon atoms, a is 1, 2, or 3, and, when a is 2 or 3, multiple $R_5$'s are identical or different, and wherein the hole transporting layer (c3) or the hole injecting/transporting layer (c4) comprises an aromatic amine derivative (ii) comprising a substituent of formula (2):

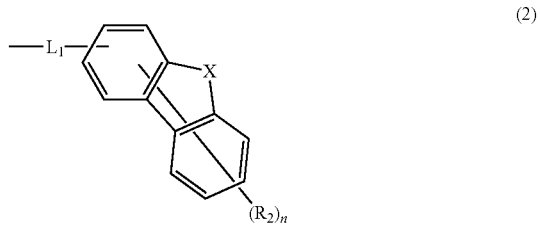
(2)

wherein

X is $NR_1$, $L_1$ is a substituted or unsubstituted arylene group comprising 6 to 60 atoms forming a ring, a substituted or unsubstituted fluorenylene group, or a substituted or unsubstituted heteroarylene group comprising 5 to 60 atoms forming a ring, $R_1$ is a substituted or unsubstituted aryl group comprising 5 to 14 atoms forming a ring, or a branched or linear, substituted or unsubstituted alkyl group comprising 1 to 6 carbon atoms, $R_2$ is a hydrogen atom, a substituted or unsubstituted aryl group comprising 5 to 14 atoms forming a ring, a substituted or unsubstituted aryloxy group comprising 5 to 14 atoms forming a ring, a substituted or unsubstituted arylthio group comprising 5 to 14 atoms forming a ring, a branched or linear, substituted or unsubstituted alkyl group comprising 1 to 6 carbon atoms, or a branched or linear, substituted or unsubstituted alkoxycarbonyl group comprising 1 to 6 carbon atoms, and n is an integer of 1 to 7, wherein the aromatic amine derivative (i) does not comprise the substituent of formula (2) in its structure, and wherein the aromatic amine derivative (ii) does not comprise the substituent of formula (1) in its structure.

2. The device of claim 1, wherein the aromatic amine derivative (i) comprises:

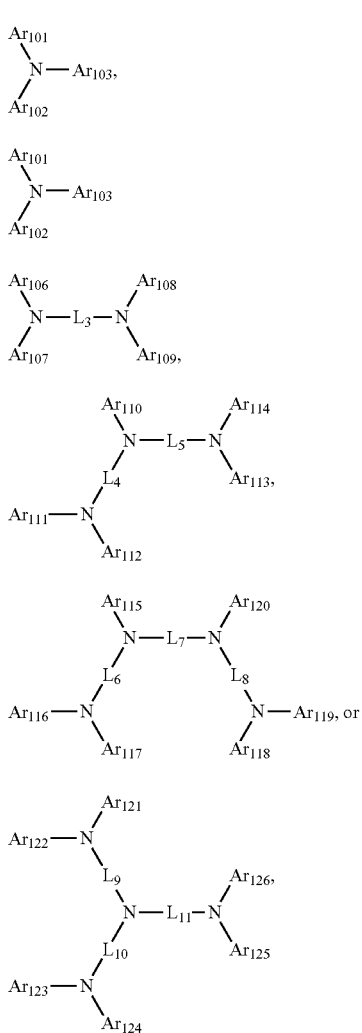

wherein
at least one of $Ar_{101}$ to $Ar_{103}$, at least one of $Ar_{106}$ to $Ar_{109}$, at least one of $Ar_{110}$ to $Ar_{114}$, at least one of $Ar_{115}$ to $Ar_{120}$, and at least one of $Ar_{121}$ to $Ar_{126}$, is the substituent of formula (1), $Ar_{106}$ to $Ar_{124}$, except the substituent of formula (1), are each independently a substituted or unsubstituted aryl group comprising 6 to 50 atoms forming a ring, or a substituted or unsubstituted heteroaryl group comprising 5 to 60 atoms forming a ring, and, when any of $Ar_{106}$ to $Ar_{124}$ has a substituent, the substituent comprises an aryl group comprising 6 to 50 atoms forming a ring, or a branched or linear alkyl group comprising 1 to 50 carbon atoms, and $L_3$ to $L_{11}$ are independently a substituted or unsubstituted arylene group comprising 6 to 60 atoms forming a ring, or a substituted or unsubstituted heteroarylene group comprising 5 to 60 atoms forming a ring.

3. The device of claim 2, wherein the aromatic amine derivative (i) has formula (15).

4. The device of claim 1, wherein the aromatic amine derivative (ii) comprises:

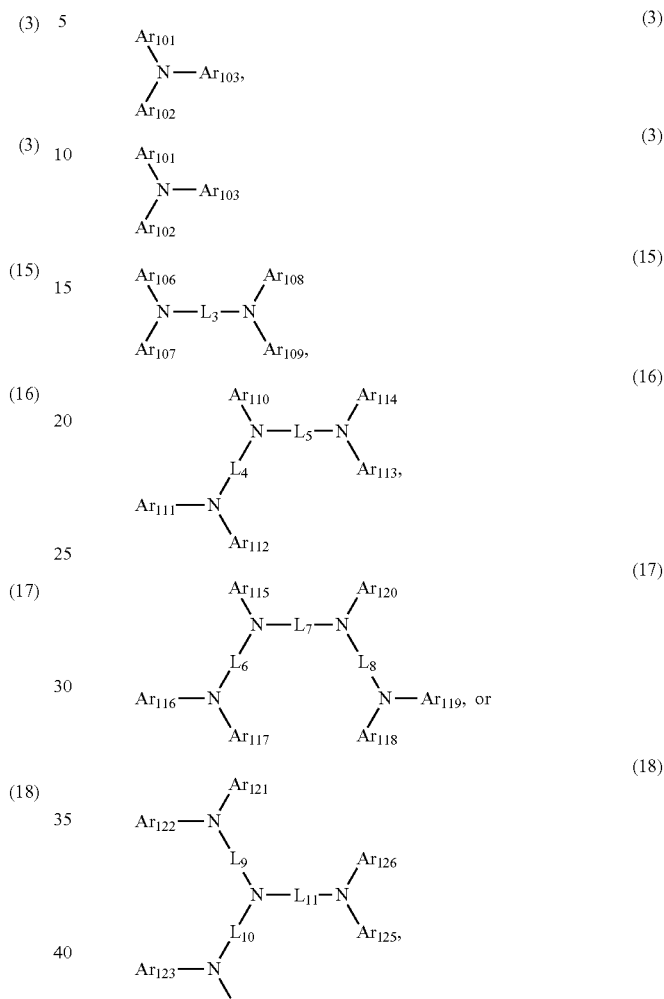

wherein
at least one of $Ar_{101}$ to $Ar_{103}$, at least one of $Ar_{106}$ to $Ar_{109}$, at least one of $Ar_{110}$ to $Ar_{114}$, at least one of $Ar_{115}$ to $Ar_{120}$, and at least one of $Ar_{121}$ to $Ar_{126}$, is the substituent of formula (2), $Ar_{106}$ to $Ar_{124}$, except the substituent of formula (2), are each independently a substituted or unsubstituted aryl group comprising 6 to 50 atoms forming a ring, and, when any of $Ar_{106}$ to $Ar_{124}$ has a substituent, the substituent comprises an aryl group comprising 6 to 50 atoms forming a ring, or a branched or linear alkyl group comprising 1 to 50 carbon atoms, and $L_3$ to $L_{11}$ are independently a substituted or unsubstituted arylene group comprising 6 to 60 atoms forming a ring, or a substituted or unsubstituted heteroarylene group comprising 5 to 60 atoms forming a ring.

5. The device of claim 4, wherein the aromatic amine derivative (ii) has formula (3).

6. The device of claim 1, wherein the organic thin film layers (c) further comprise (c5) an electron transporting layer on a side which is closer to the cathode (b) than the light emitting layer (c1) is, and
wherein the electron transporting layer (c5) comprises a nitrogen-comprising heterocyclic derivative.

7. The device of claim 6, wherein the nitrogen-comprising heterocyclic derivative comprises a benzimidazole derivative of formula:

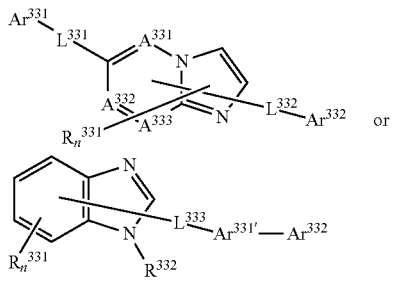

wherein
$A^{331}$ to $A^{333}$ are each independently a nitrogen atom or a carbon atom,
$R^{331}$ and $R^{332}$ are each independently a substituted or unsubstituted aryl group comprising 6 to 60 atoms forming a ring, a substituted or unsubstituted heteroaryl group comprising 3 to 60 atoms forming a ring, an alkyl group comprising 1 to 20 carbon atoms, a haloalkyl group comprising 1 to 20 carbon atoms, or an alkoxy group comprising 1 to 20 carbon atoms,
n is an integer of 0 to 5, and, when n is 2 or more, multiple $R^{331}$'s are identical or different, and multiple $R^{331}$'s adjacent to each other may be bonded to each other to form a substituted or unsubstituted, carbocyclic aliphatic ring, or a substituted or unsubstituted, carbocyclic aromatic ring;
$Ar^{331}$ is a substituted or unsubstituted aryl group comprising 6 to 60 atoms forming a ring, or a substituted or unsubstituted heteroaryl group comprising 3 to 60 atoms forming a ring;
$Ar^{331'}$ is a substituted or unsubstituted arylene group comprising 6 to 60 atoms forming a ring, or a substituted or unsubstituted heteroarylene group comprising 3 to 60 atoms forming a ring;
$Ar^{332}$ is a hydrogen atom, an alkyl group comprising 1 to 20 carbon atoms, a haloalkyl group comprising 1 to 20 carbon atoms, an alkoxy group comprising 1 to 20 carbon atoms, a substituted or unsubstituted aryl group comprising 6 to 60 atoms forming a ring, or a substituted or unsubstituted heteroaryl group comprising 3 to 60 atoms forming a ring,
provided that one of $Ar^{331}$ and $Ar^{332}$ is a substituted or unsubstituted fused ring group comprising 10 to 60 atoms forming a ring, or a substituted or unsubstituted heterocyclic fused ring group comprising 3 to 60 atoms forming a ring; and
$L^{331}$, $L^{332}$, and $L^{333}$ are each independently a single bond, a substituted or unsubstituted arylene group comprising 6 to 60 atoms forming a ring, a substituted or unsubstituted, divalent heterocyclic fused ring comprising 3 to 60 atoms forming a ring, or a substituted or unsubstituted fluorenylene group.

8. The device of claim 1, $L_{12}$ in formula (1) is independently a phenylene group.

9. The device of claim 1, $L_{12}$ in formula (1) is independently a biphenylylene group.

10. The device of claim 1, $L_{12}$ in formula (1) is independently a fluorenylene group.

11. The device of claim 1, $R_5$ in the formula (1) is independently a phenyl group, a naphthyl group, or a phenanthrene group.

12. The device of claim 3, wherein $L_3$ in the aromatic amine derivative (i) of formula (15) is a biphenylylene group.

13. The device of claim 3, wherein $L_3$ in the aromatic amine derivative (i) of formula (15) is a terphenylylene group.

14. The device of claim 3, wherein $L_3$ in the aromatic amine derivative (i) of formula (15) is a fluorenylene group.

15. The device of claim 3, wherein $Ar_{106}$ in the aromatic amine derivative (i) of formula (15) is the substituent of formula (1).

16. The device of claim 3, wherein $Ar_{106}$ and $Ar_{107}$ in the aromatic amine derivative (i) of formula (15) are each the substituent of formula (1).

17. The device of claim 3, wherein $Ar_{106}$ and $Ar_{108}$ in the aromatic amine derivative (i) of formula (15) are each the substituent of formula (1).

18. The device of claim 3, wherein three or more of $Ar_{106}$ to $Ar_{109}$ in the aromatic amine derivative (i) of formula (15) are different from one another, and the aromatic amine derivative (i) is asymmetric.

19. The device of claim 3, wherein three of $Ar_{106}$ to $Ar_{109}$ in the aromatic amine derivative (i) of formula (15) are identical to one another, and the aromatic amine derivative (i) is asymmetric.

* * * * *